United States Patent
Lin et al.

(10) Patent No.: US 12,389,645 B2
(45) Date of Patent: Aug. 12, 2025

(54) SEMICONDUCTOR STRUCTURE WITH EXTENDED CONTACT STRUCTURE

(71) Applicant: TAIWAN SEMICONDUCTOR MANUFACTURING COMPANY, LTD., Hsinchu (TW)

(72) Inventors: Ta-Chun Lin, Hsinchu (TW); Kuo-Hua Pan, Hsinchu (TW); Jhon-Jhy Liaw, Zhudong Township, Hsinchu County (TW); Chao-Ching Cheng, Hsinchu (TW); Hung-Li Chiang, Taipei (TW); Shih-Syuan Huang, Taichung (TW); Tzu-Chiang Chen, Hsinchu (TW); I-Sheng Chen, Taipei (TW); Sai-Hooi Yeong, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/429,755

(22) Filed: Feb. 1, 2024

(65) Prior Publication Data
US 2024/0170537 A1 May 23, 2024

Related U.S. Application Data

(60) Division of application No. 17/666,051, filed on Feb. 7, 2022, now Pat. No. 11,923,413, which is a division
(Continued)

(51) Int. Cl.
*H01L 29/76* (2006.01)
*H01L 21/02* (2006.01)
(Continued)

(52) U.S. Cl.
CPC ..... *H10D 62/121* (2025.01); *H01L 21/02603* (2013.01); *H10D 30/024* (2025.01);
(Continued)

(58) Field of Classification Search
CPC ....... H01L 21/02603; H01L 21/823431; H01L 21/823821; H01L 27/0886; H01L 27/0924;
(Continued)

(56) References Cited

U.S. PATENT DOCUMENTS 9,209,247 B2   12/2015   Colinge et al.
9,236,267 B2    1/2016   De et al.
(Continued)

FOREIGN PATENT DOCUMENTS

TW    201736249 A    10/2017

OTHER PUBLICATIONS

U.S. Notice of Allowance for U.S. Appl. No. 16/681,097, dated Jul. 19, 2021.

*Primary Examiner* — Theresa T Doan
(74) *Attorney, Agent, or Firm* — Birch, Stewart, Kolasch & Birch, LLP

(57) ABSTRACT

Semiconductor structures are provided. The semiconductor structure includes a substrate and nanostructures formed over the substrate. In addition, the nanostructures includes channel regions and source/drain regions. The semiconductor structure further includes a gate structure vertically sandwiched the channel regions of the nanostructures and a contact wrapping around and vertically sandwiched between the source/drain regions of the nanostructures.

20 Claims, 42 Drawing Sheets

Related U.S. Application Data of application No. 16/868,625, filed on May 7, 2020, now Pat. No. 11,245,005, which is a continuation-in-part of application No. 16/681,097, filed on Nov. 12, 2019, now Pat. No. 11,183,560, which is a continuation of application No. 15/979,123, filed on May 14, 2018, now Pat. No. 10,522,622.

(51) Int. Cl.
| | | |
|---|---|---|
| *H01L 29/94* | (2006.01) | |
| *H10D 30/01* | (2025.01) | |
| *H10D 30/62* | (2025.01) | |
| *H10D 30/67* | (2025.01) | |
| *H10D 62/10* | (2025.01) | |
| *H10D 64/01* | (2025.01) | |
| *H10D 84/01* | (2025.01) | |
| *H10D 84/03* | (2025.01) | |
| *H10D 84/83* | (2025.01) | |
| *H10D 84/85* | (2025.01) | |

(52) U.S. Cl.
CPC ......... *H10D 30/62* (2025.01); *H10D 30/6735* (2025.01); *H10D 64/017* (2025.01); *H10D 84/0158* (2025.01); *H10D 84/0193* (2025.01); *H10D 84/038* (2025.01); *H10D 84/834* (2025.01); *H10D 84/853* (2025.01)

(58) Field of Classification Search
CPC ......... H01L 29/42392; H01L 29/66545; H01L 29/66795; H01L 29/785; H01L 21/823814; H01L 29/0653; H01L 29/0847; H01L 29/1079; H01L 29/78696; H01L 21/823412; H01L 21/823418; H01L 29/0669; H01L 29/41791; B82Y 10/00
USPC ........................................................ 257/288
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,882,023 B2 | 1/2018 | Lin et al. |
| 11,183,560 B2 | 11/2021 | Cheng et al. |
| 2012/0305886 A1* | 12/2012 | Sleight ............... H01L 29/775 257/E29.024 |
| 2014/0203334 A1 | 7/2014 | Colinge et al. |
| 2015/0295089 A1 | 10/2015 | Huang et al. |
| 2015/0357432 A1 | 12/2015 | Lin et al. |
| 2017/0069481 A1 | 3/2017 | Doris et al. |

* cited by examiner

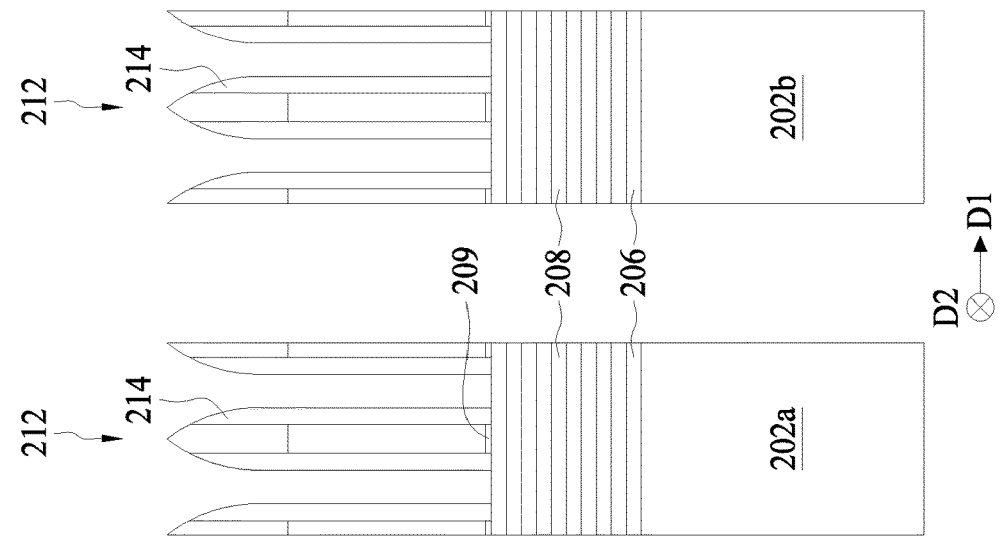
FIG. 4C   FIG. 4D
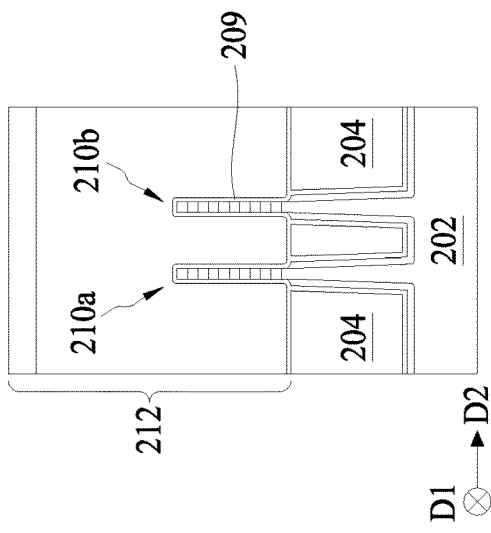
FIG. 4B
FIG. 4E
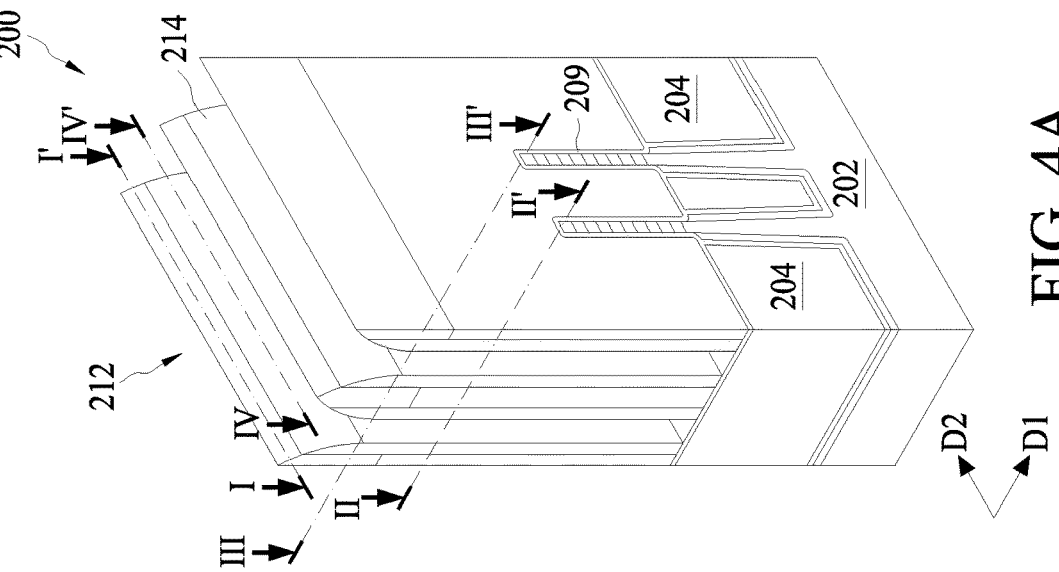
FIG. 4A

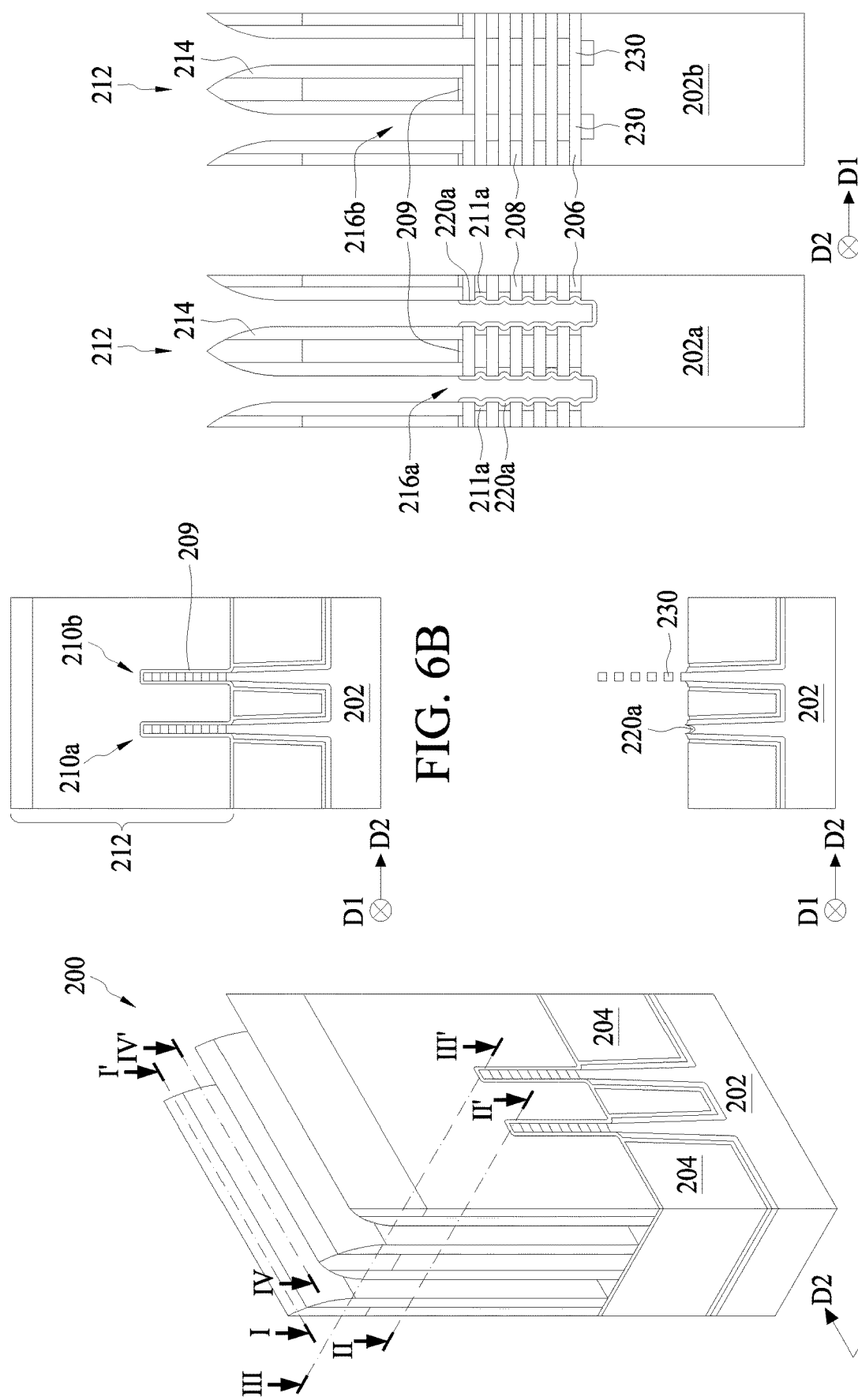

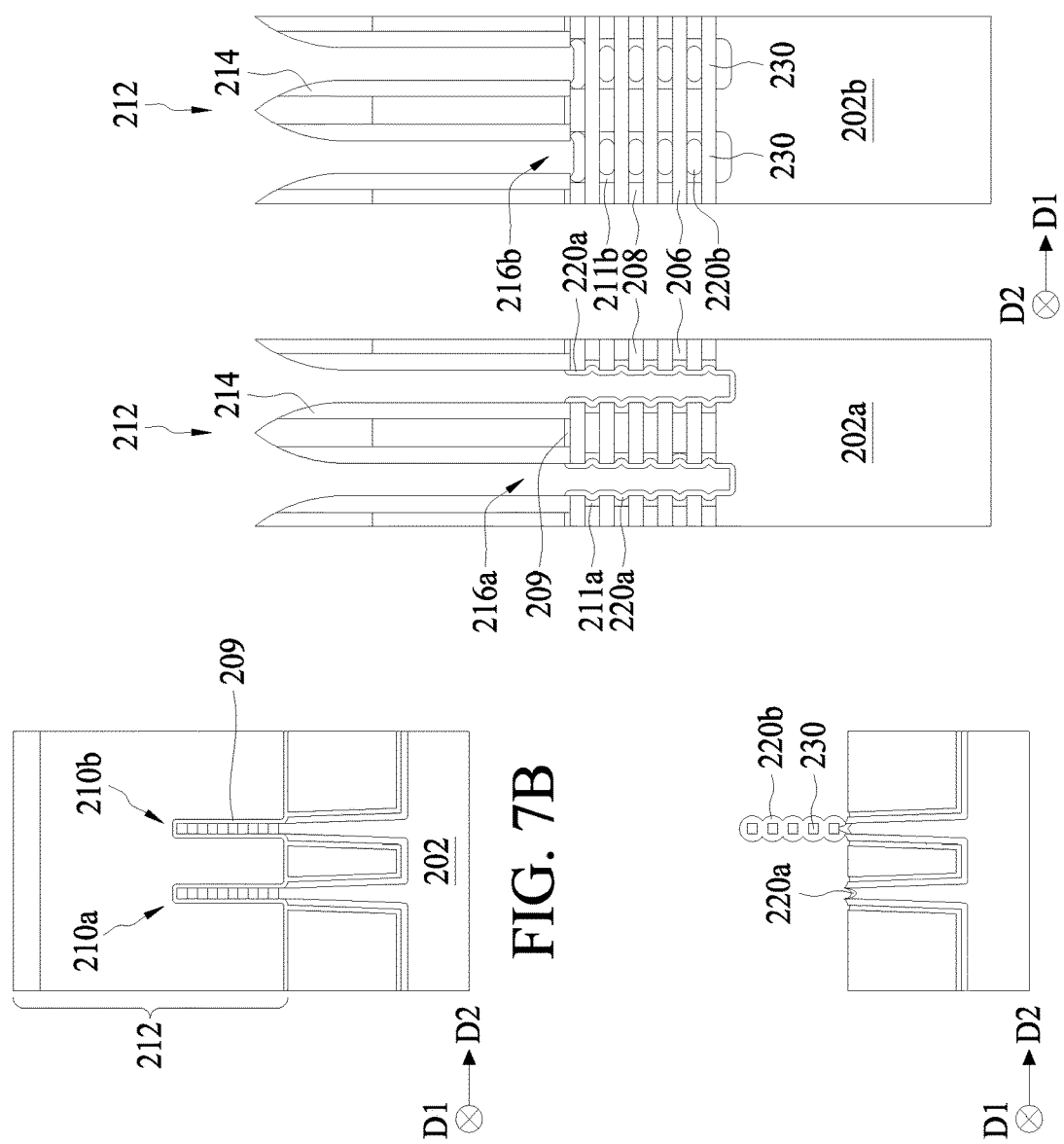
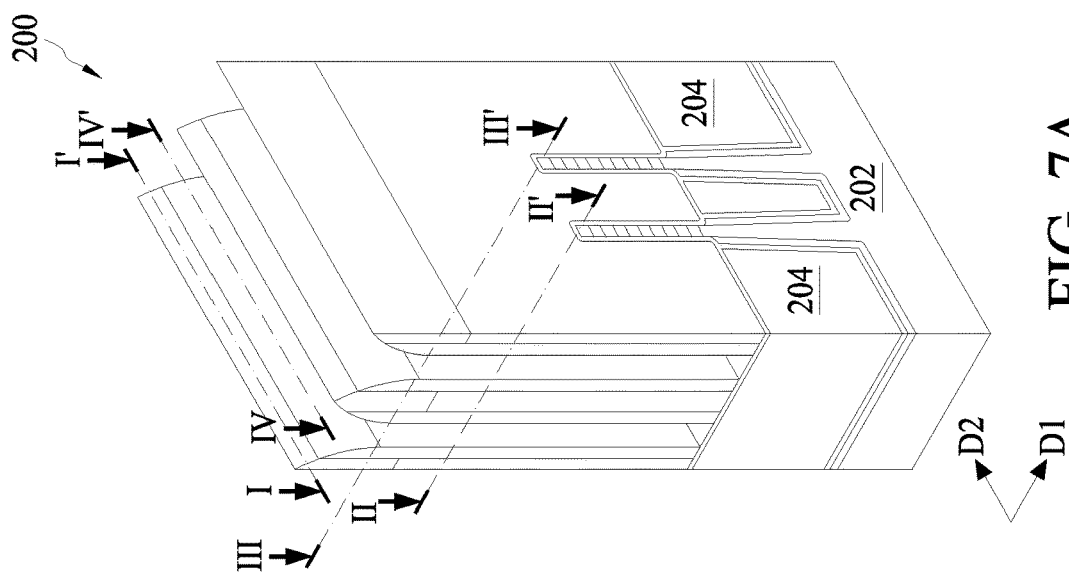
FIG. 7A  FIG. 7B  FIG. 7C  FIG. 7D  FIG. 7E

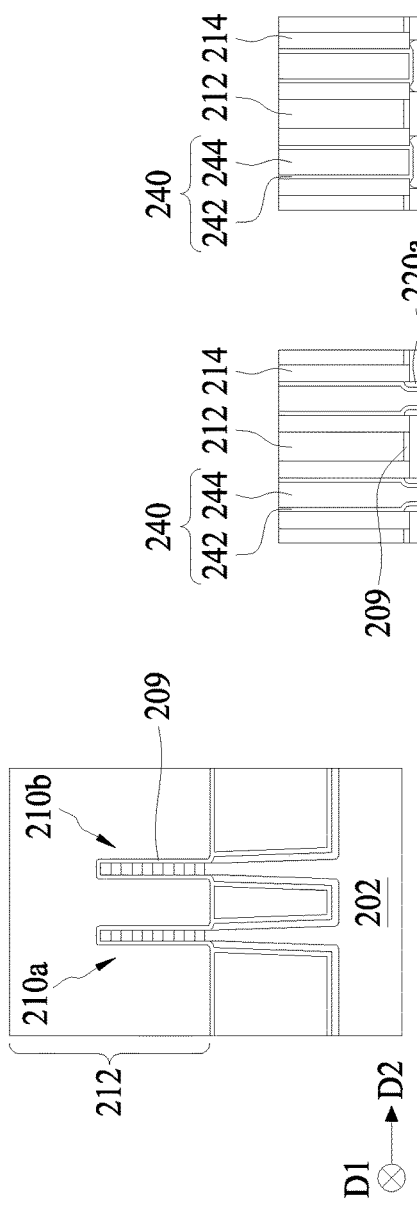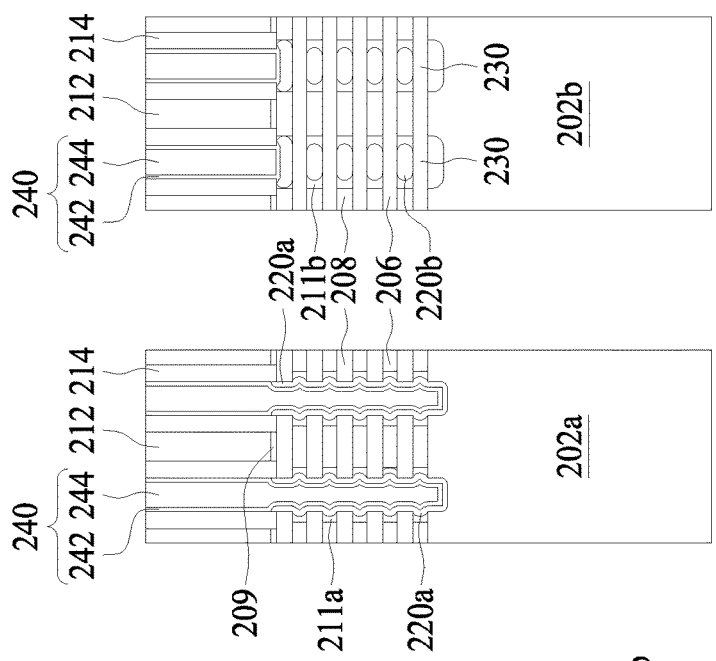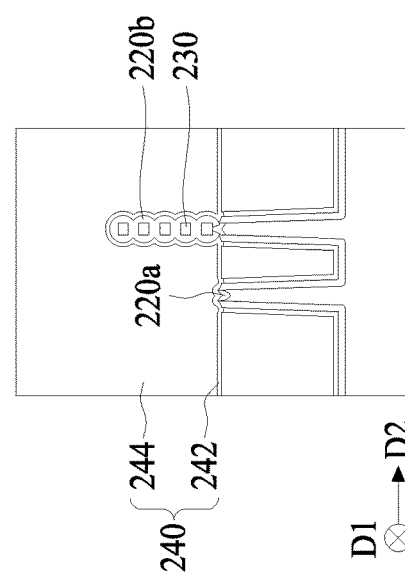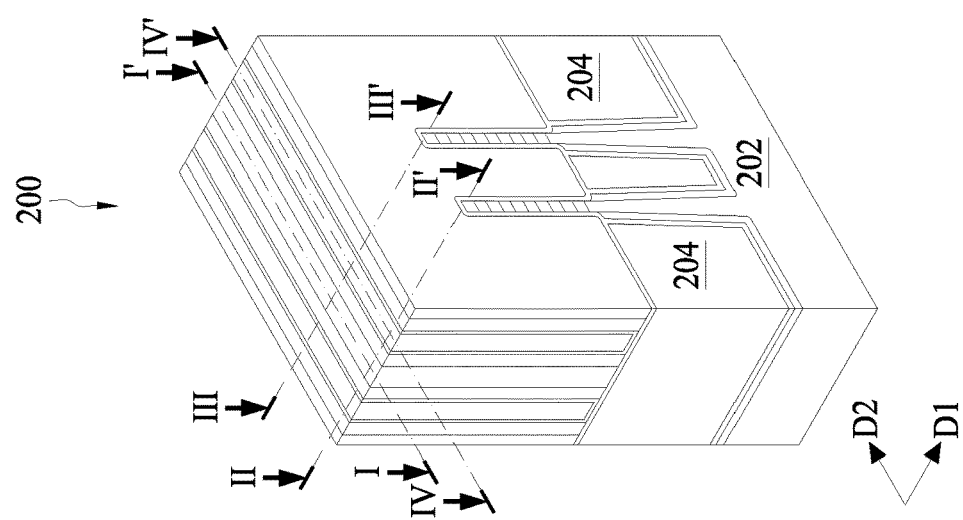

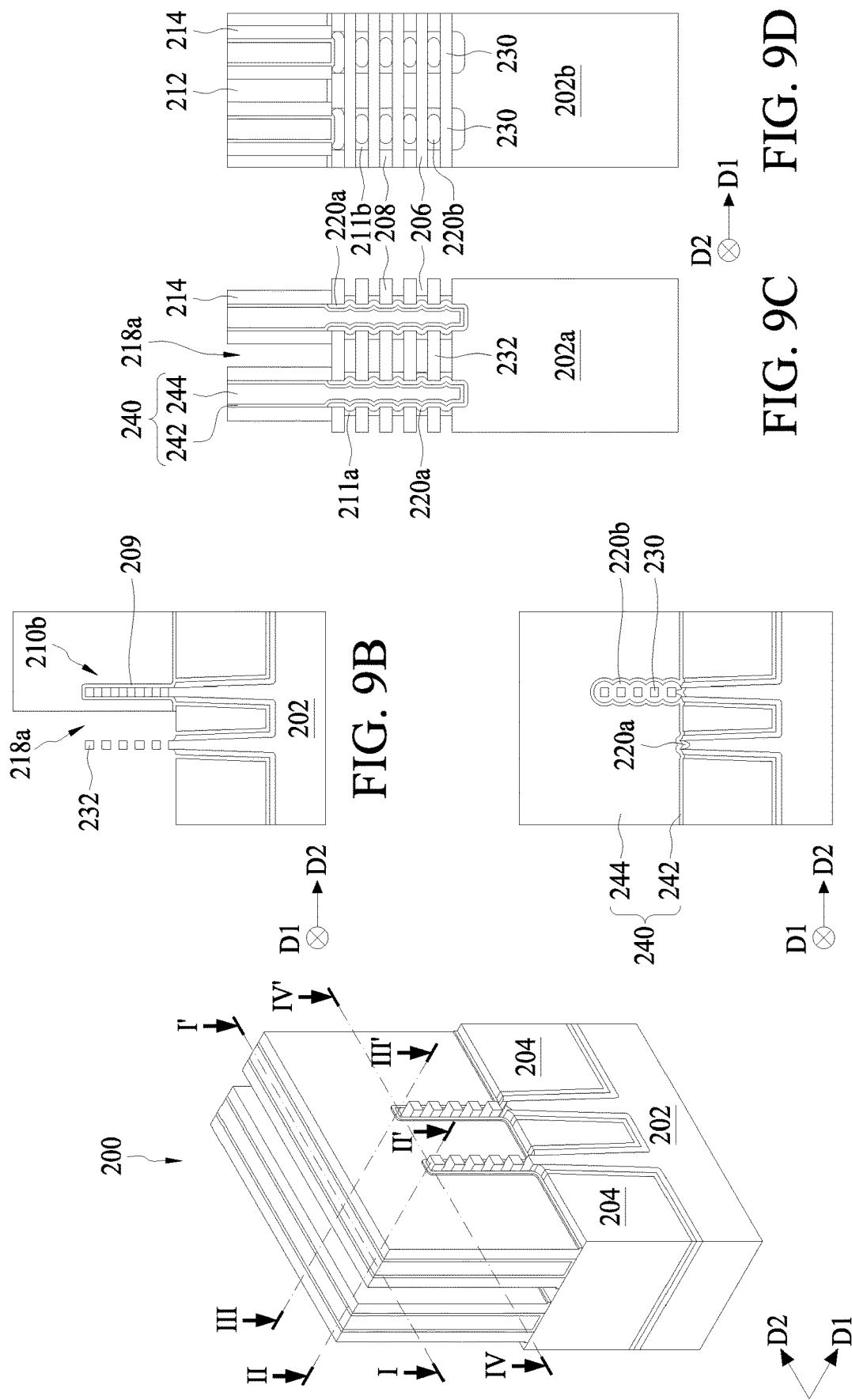

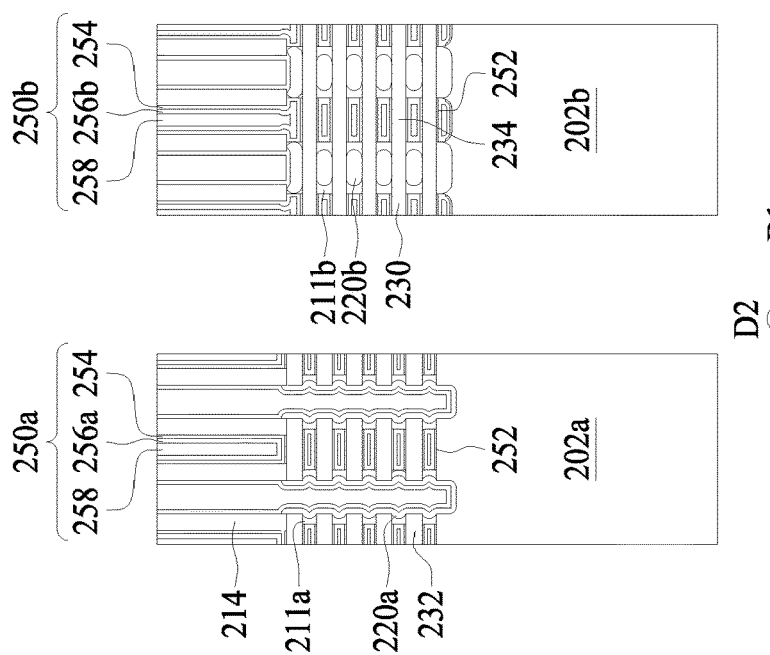
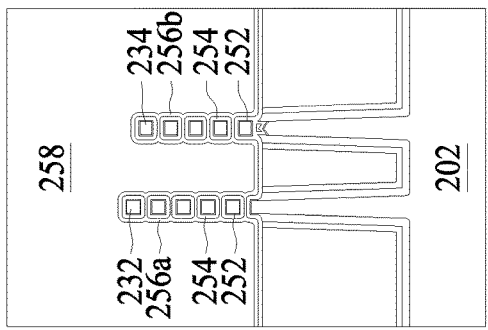
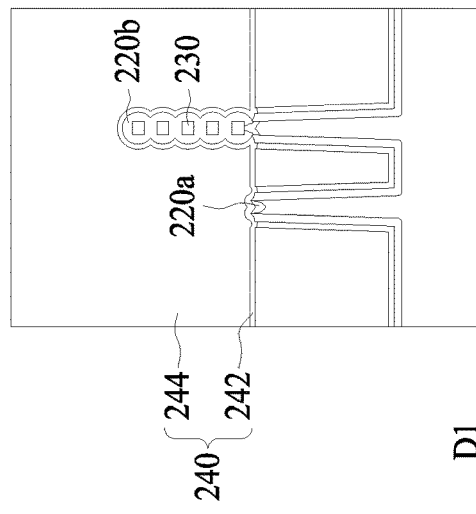
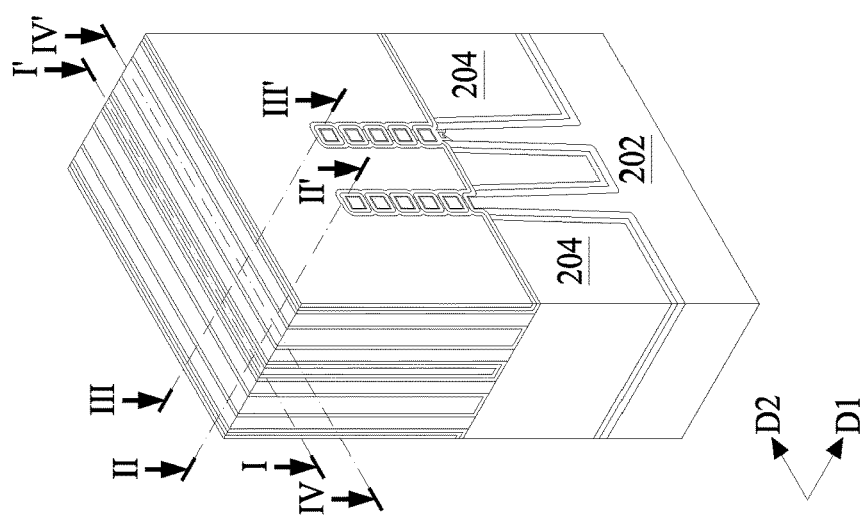
FIG. 11D
FIG. 11C
FIG. 11B
FIG. 11E
FIG. 11A

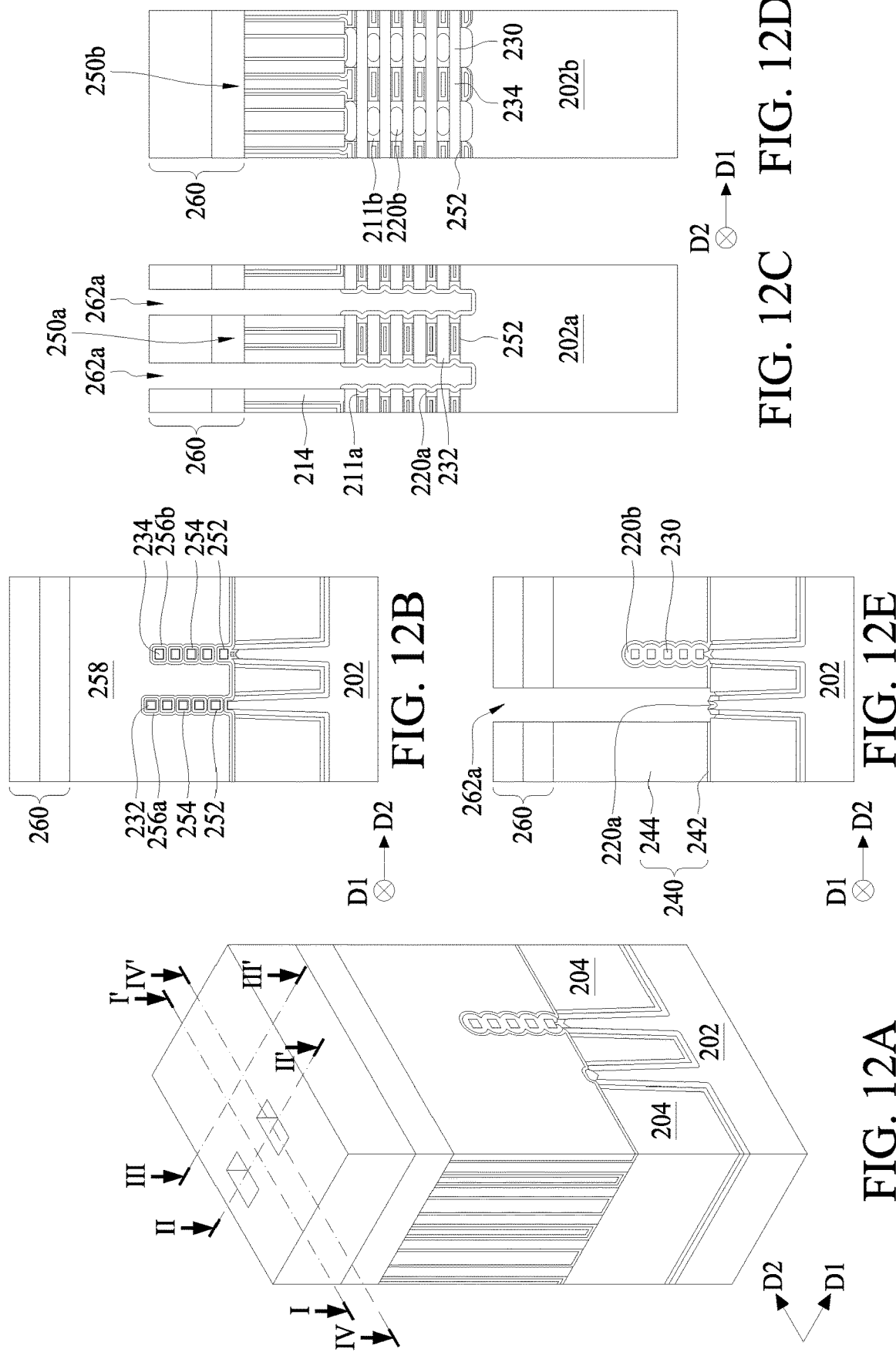

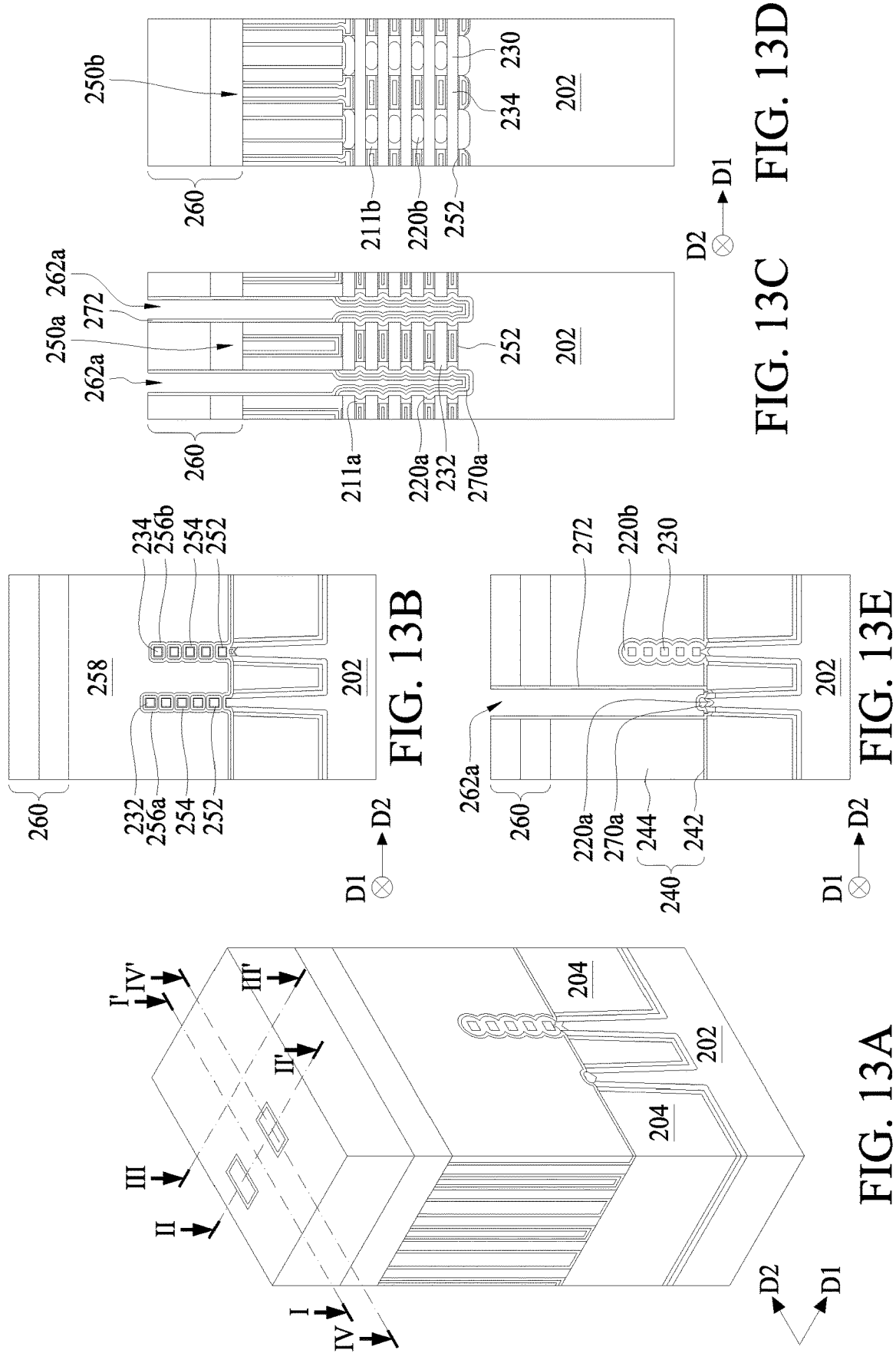

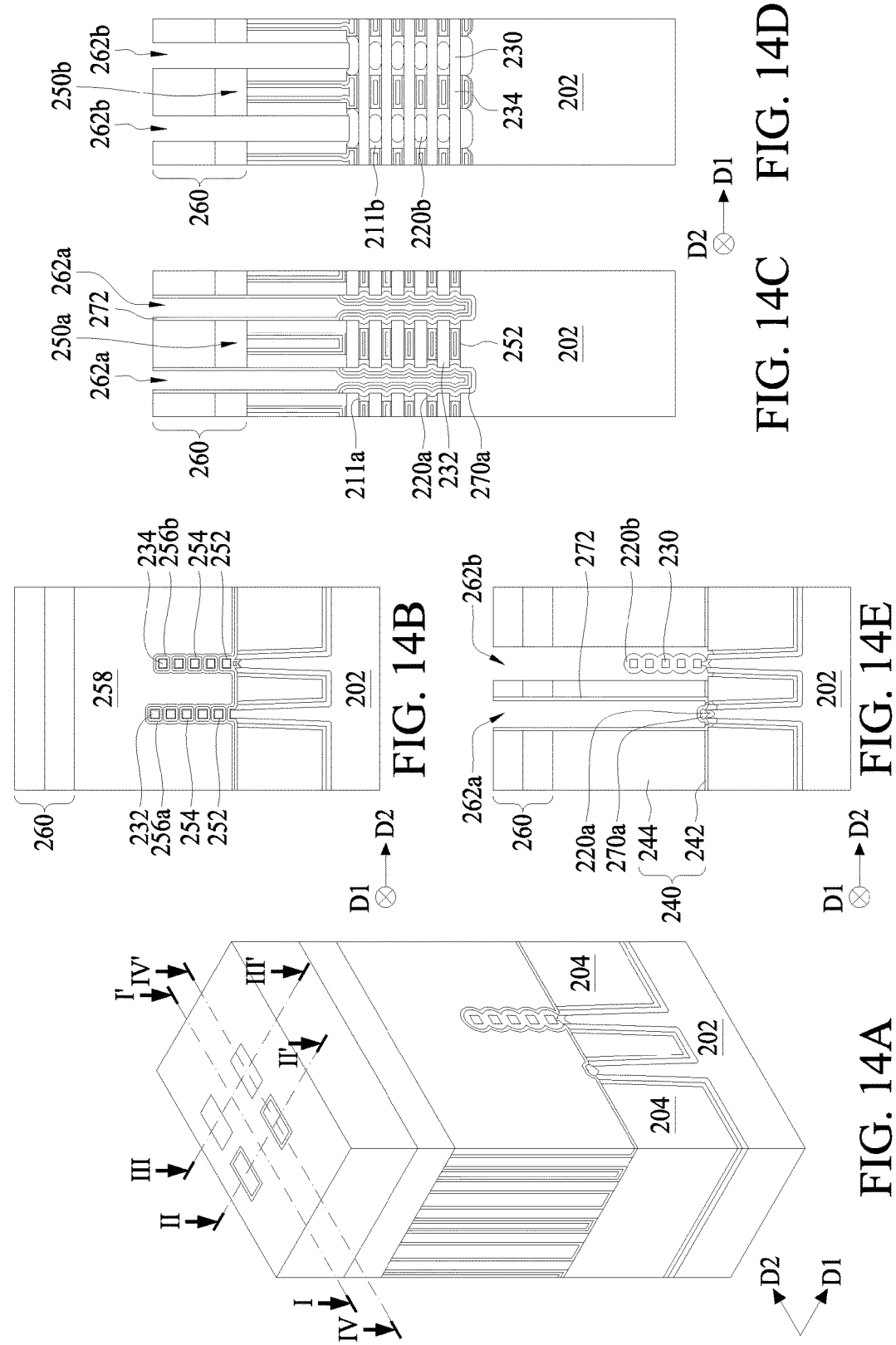

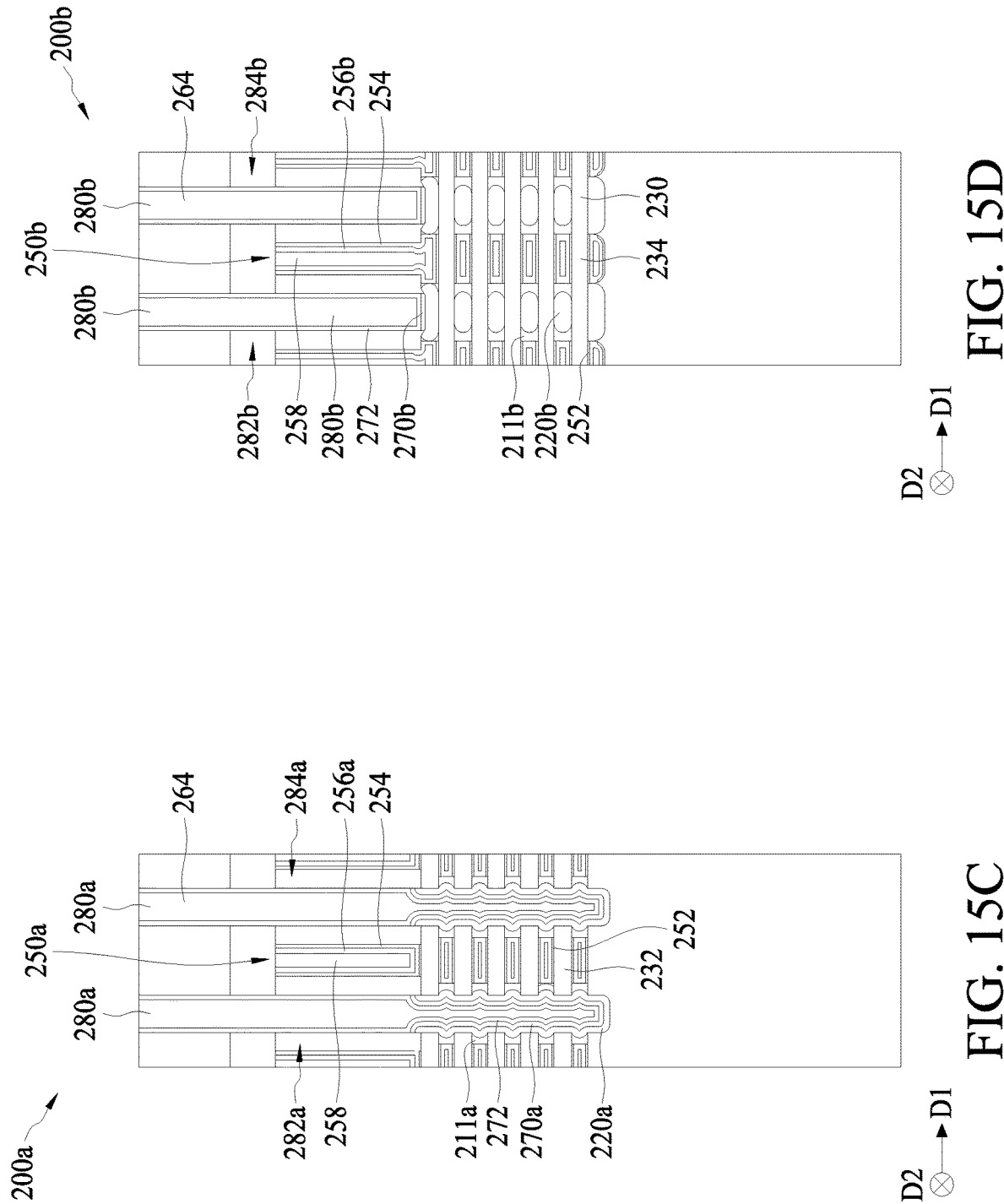

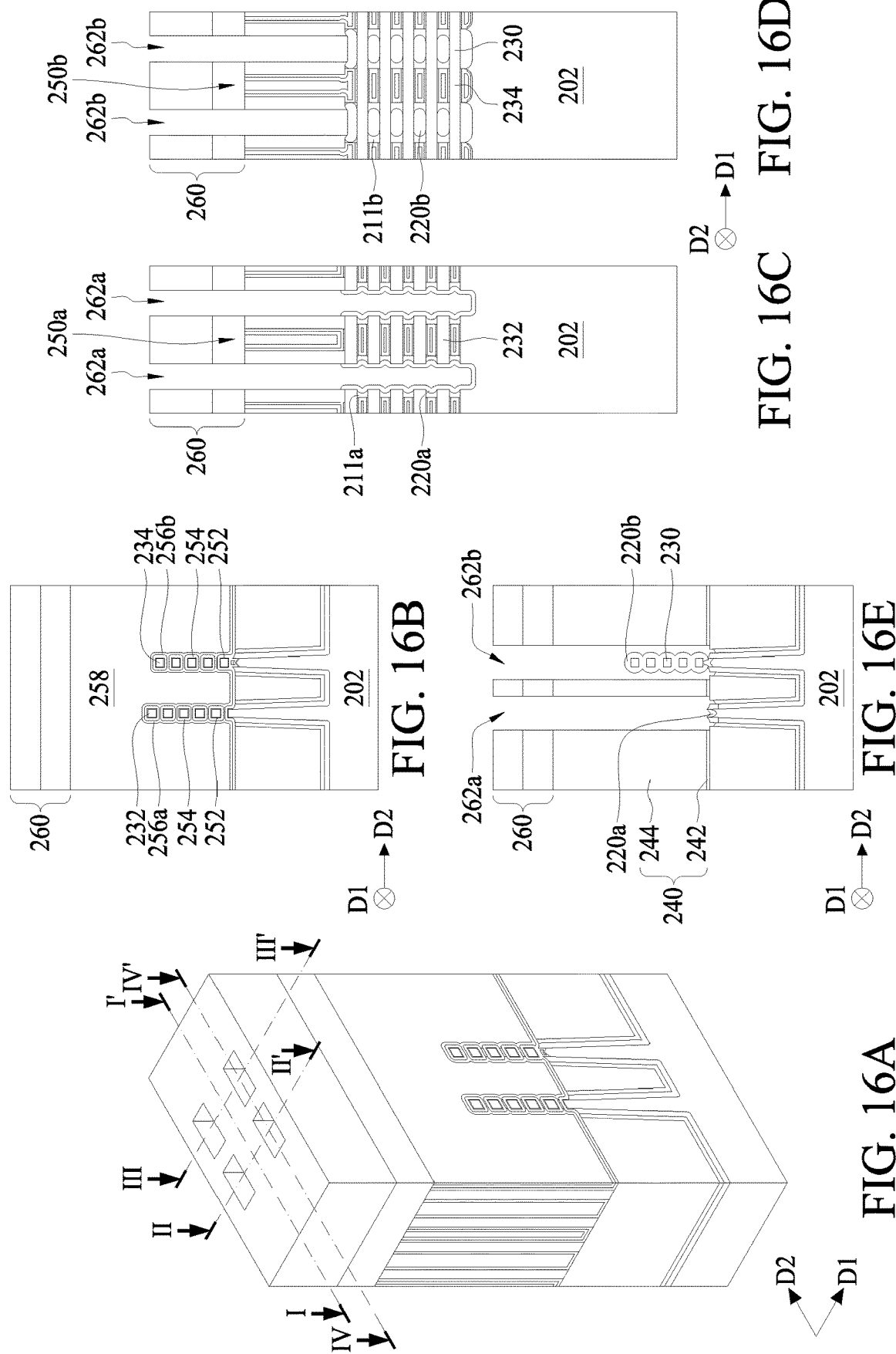

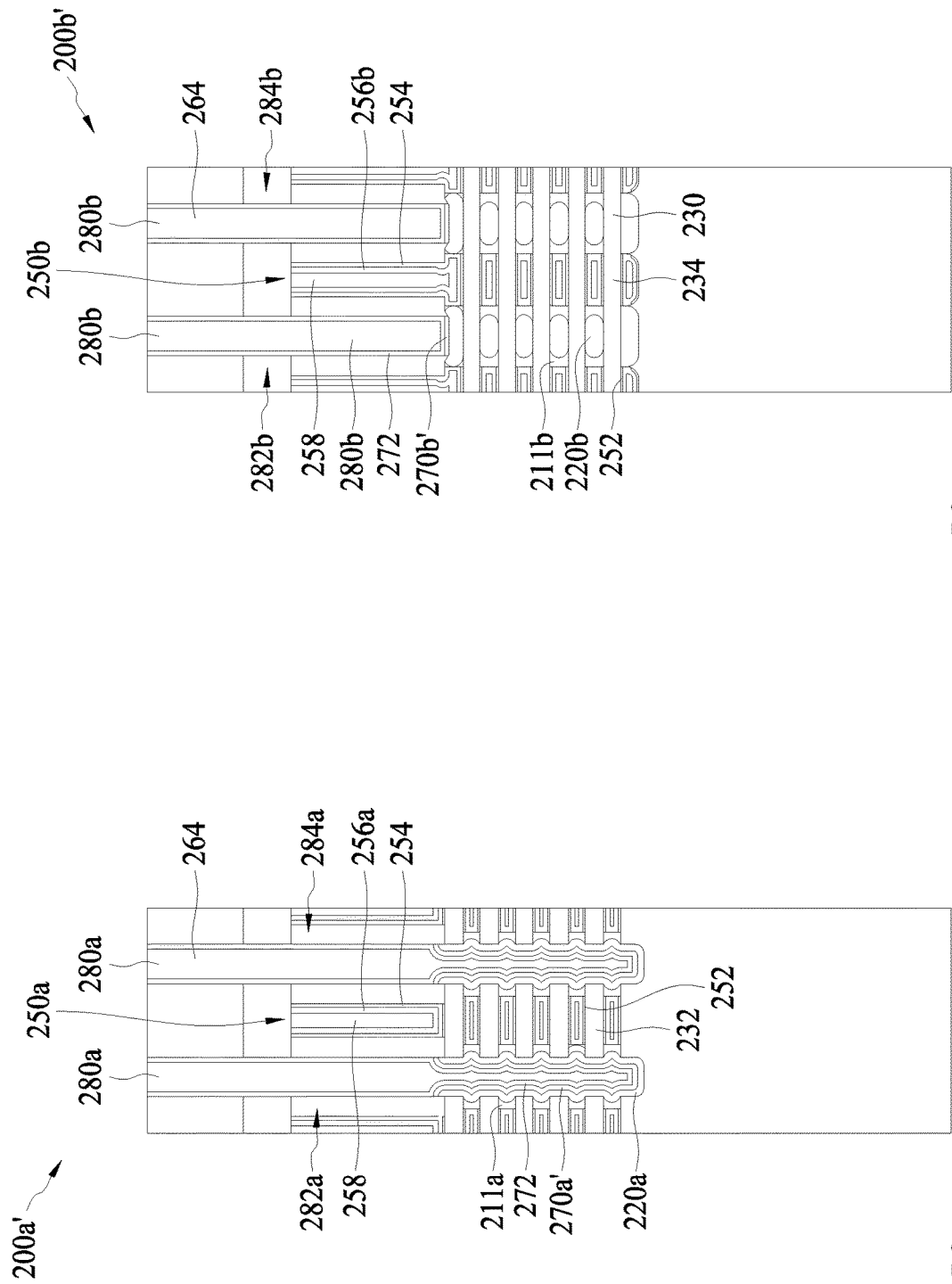

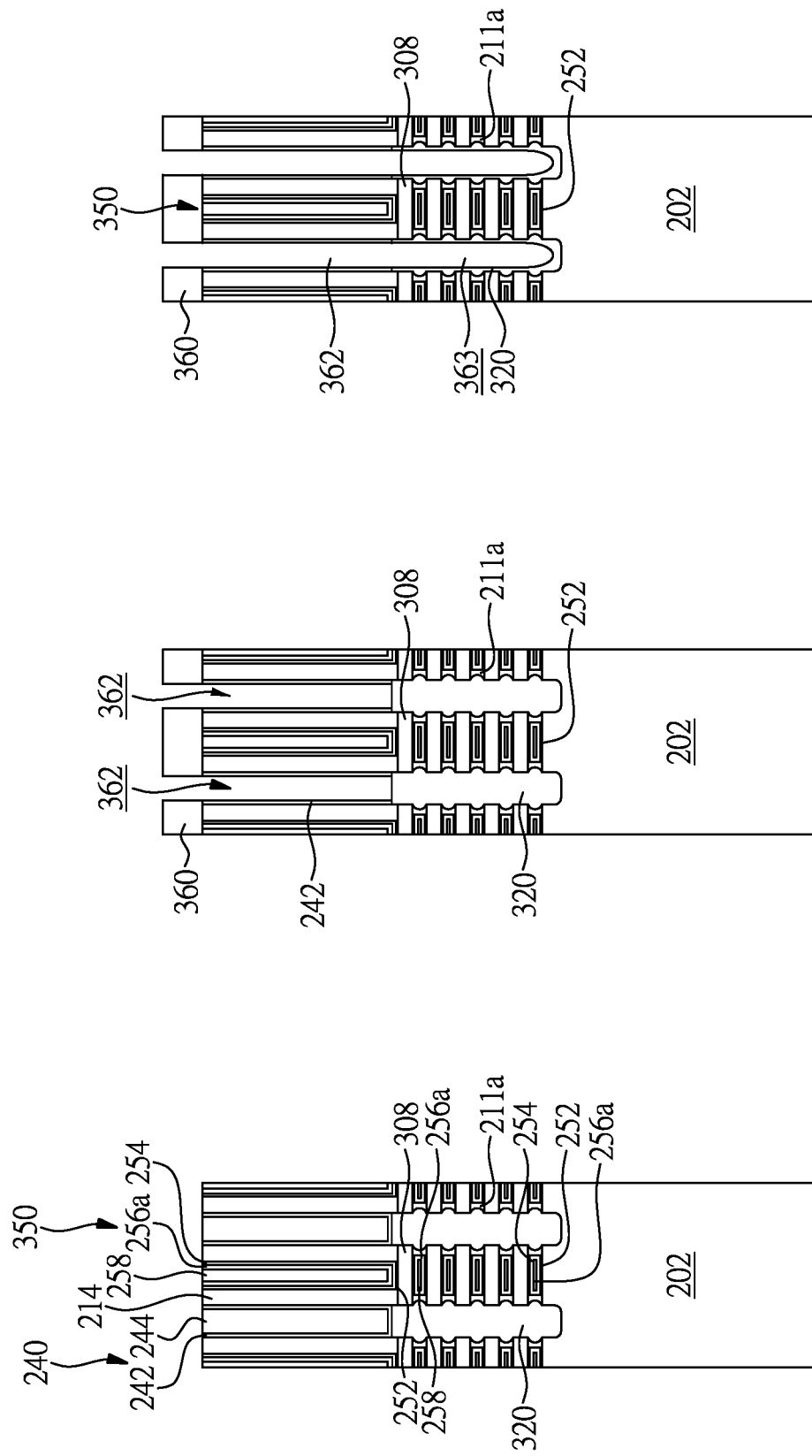

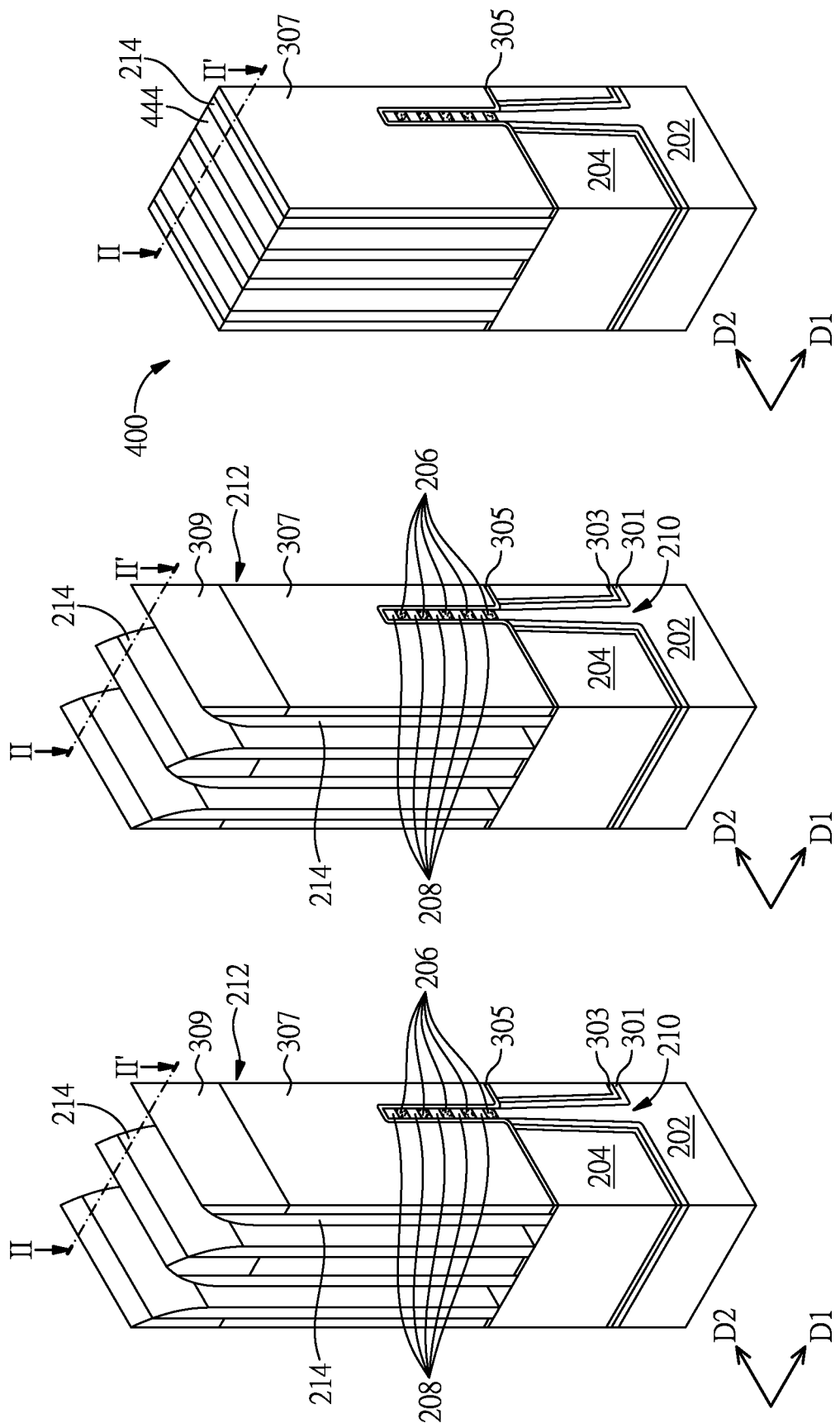

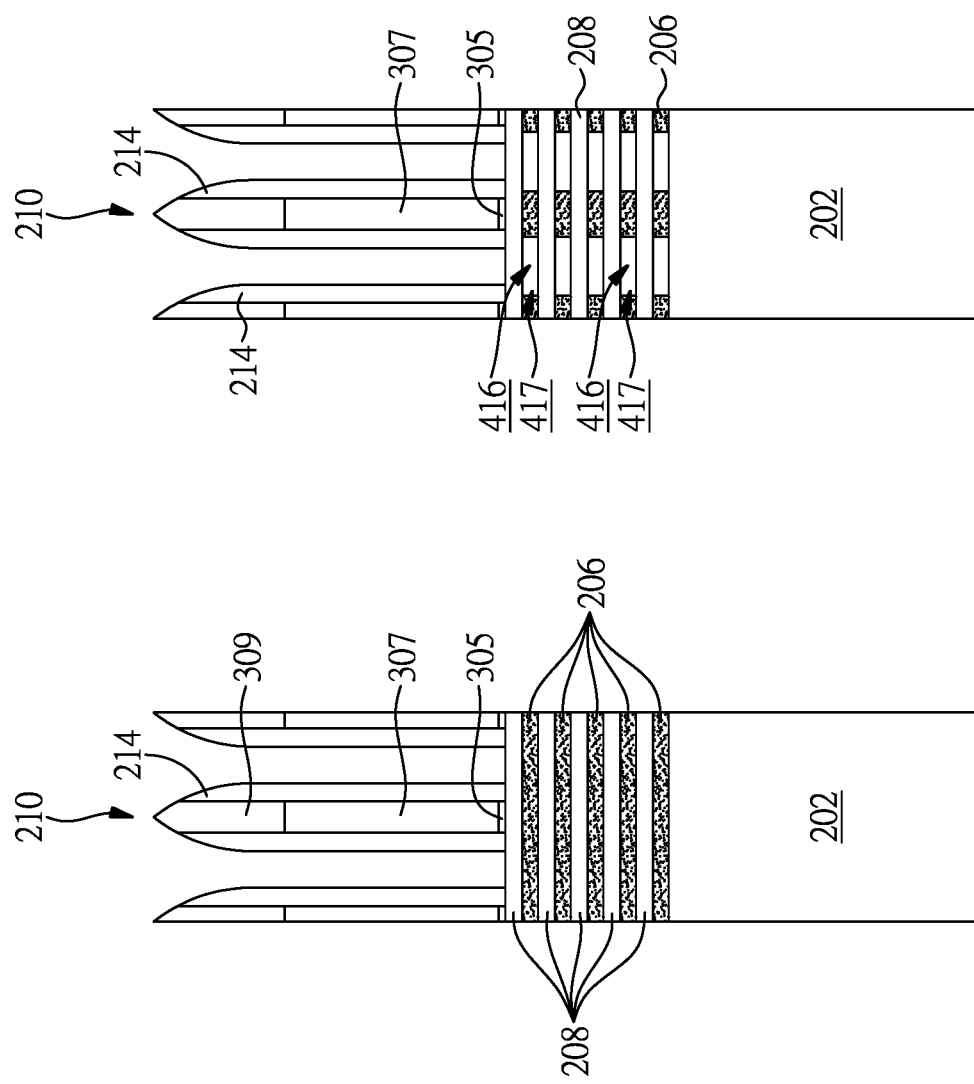
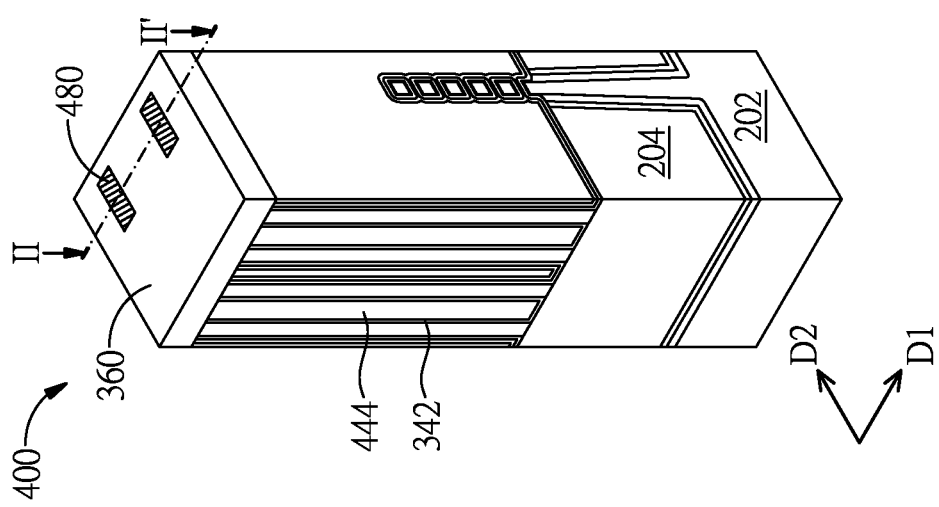
FIG. 22I     FIG. 23A     FIG. 23B

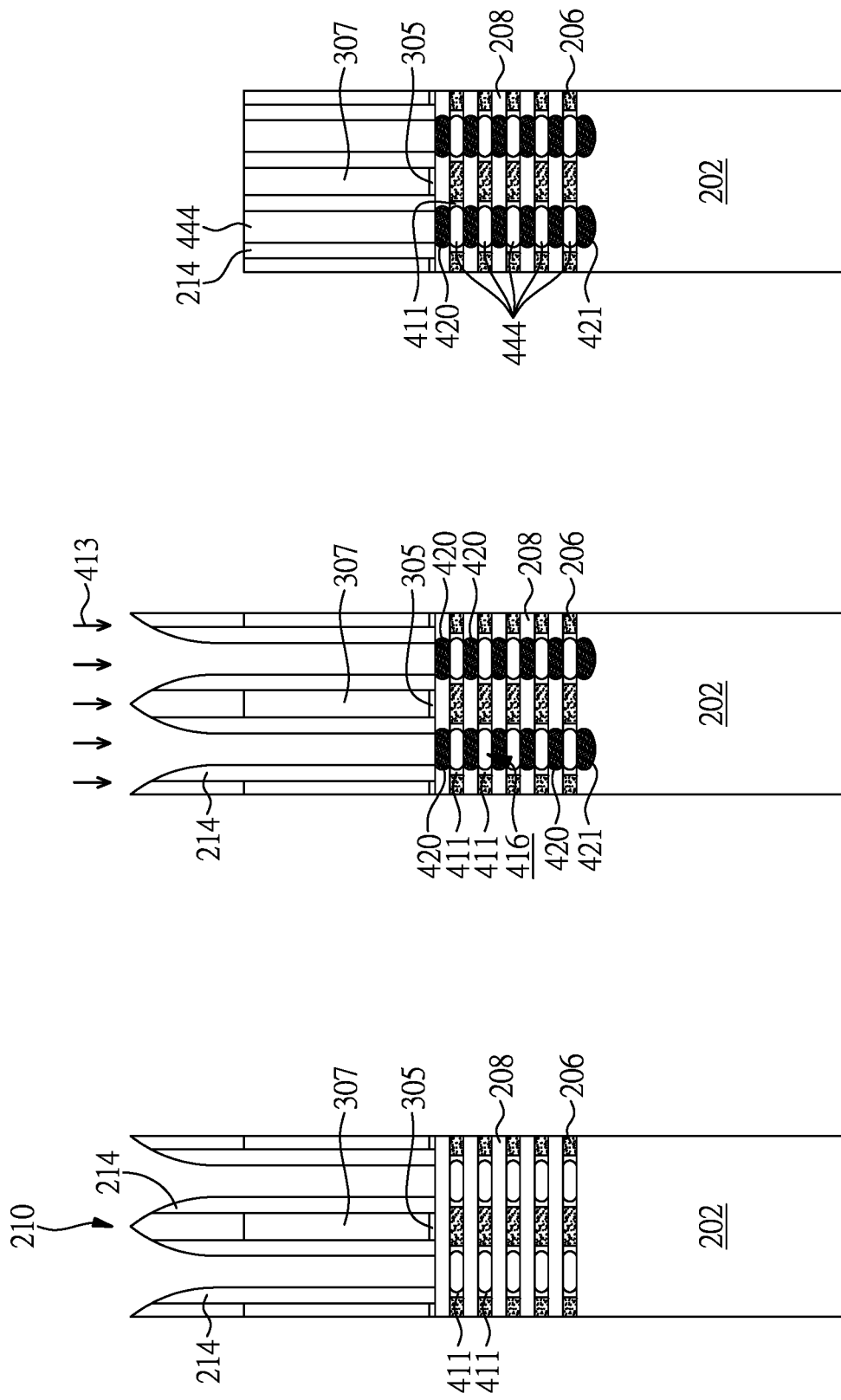

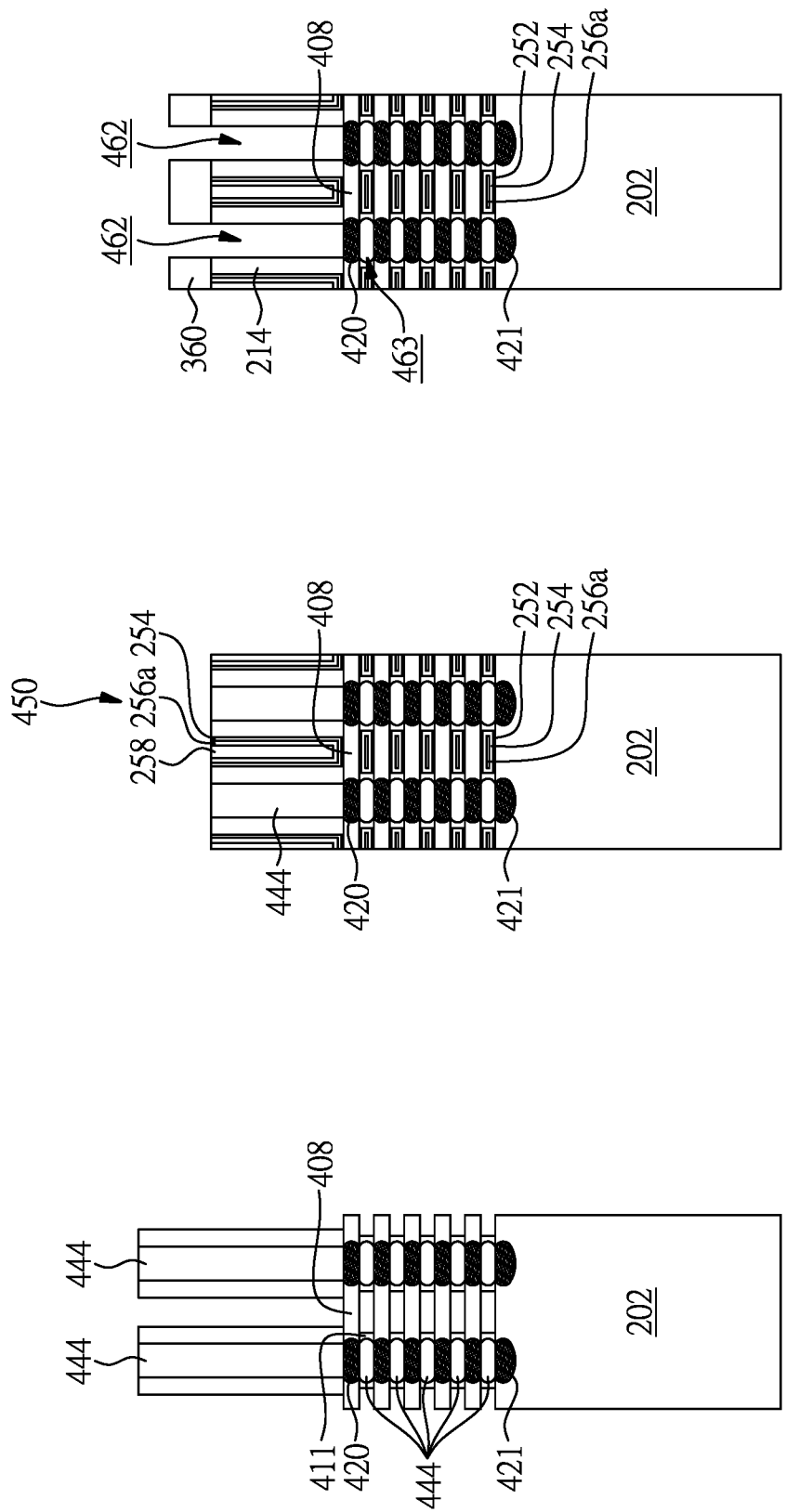

SEMICONDUCTOR STRUCTURE WITH EXTENDED CONTACT STRUCTURE

PRIORITY CLAIM AND CROSS-REFERENCE

This application is a Divisional application of U.S. patent application Ser. No. 17/666,051, filed on Feb. 7, 2022, which is a Divisional application of U.S. patent application Ser. No. 16/868,625, filed on May 7, 2020, which is a Continuation-in-part application of U.S. patent application Ser. No. 16/681,097, filed on Nov. 12, 2019, which is a Continuation application of U.S. patent application Ser. No. 15/979,123, filed on May 14, 2018, the entirety of which are incorporated by reference herein.

BACKGROUND

As the semiconductor industry develops smaller and smaller nanoscale products and processes in pursuit of higher device density, higher performance, and lower costs, the challenges of downscaling both fabrication and design have led to the development of three-dimensional designs, such as multi-gate field effect transistor (FET) including a fin FET (FinFET) and a gate-all-around (GAA) FET. In a FinFET, a gate electrode is positioned adjacent to three side surfaces of a channel region with a gate dielectric layer interposed therebetween. Because the gate structure surrounds the fin on three sides, the transistor essentially has three gates controlling the current through the fin or channel region. However, the fourth side, the bottom part of the channel region, is positioned far away from the gate electrode and thus is not under close gate control. In contrast to a FinFET, a GAA FET includes an arrangement wherein all side surfaces of the channel region are surrounded by the gate electrode, allowing fuller depletion in the channel region and resulting in fewer short-channel effects due to a steeper sub-threshold current swing (SS) and smaller drain induced barrier lower (DIBL).

Although existing GAA FET devices and methods of fabricating GAA FET devices have been generally adequate for their intended purpose, such devices and methods have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A and 15A illustrate a multi-gate semiconductor device at various fabrication stages constructed according to aspects of one or more embodiments of the present disclosure.

FIGS. 3B, 4B, 5B, 6B, 7B, 8B, 9B, 10B, 11B, 12B, 13B, 14B and 15B are cross-sectional views taken along line I-I' of FIGS. 3A, 4A, 5A, 6A, 7A, 8A, 9A, 10A, 11A, 12A, 13A, 14A and 15A, respectively, according to aspects of one or more embodiments of the present disclosure.

FIGS. 3C, 4C, 5C, 6C, 7C, 8C, 9C, 10C, 11C, 12C, 13C, 14C and 15C are cross-sectional views taken along line II-II' of FIGS. 3A, 4A, 5A, 6A, 7A, 8A, 9A, 10A, 11A, 12A, 13A, 14A and 15A, respectively, according to aspects of one or more embodiments of the present disclosure.

FIGS. 3D, 4D, 5D, 6D, 7D, 8D, 9D, 10D, 11D, 12D, 13D, 14D, and 15D are cross-sectional views taken along line III-III' of FIGS. 3A, 4A, 5A, 6A, 7A, 8A, 9A, 10A, 11A, 12A, 13A, 14A and 15A, respectively, according to aspects of one or more embodiments of the present disclosure.

FIGS. 4E, 5E, 6E, 7E, 8E, 9E, 10E, 11E, 12E, 13E, 14E, and 15E are cross-sectional views taken along line IV-IV' of FIGS. 4A, 5A, 6A, 7A, 8A, 9A, 10A, 11A, 12A, 13A, 14A and 15A, respectively, according to aspects of one or more embodiments of the present disclosure.

FIGS. 16A and 17A illustrate a multi-gate semiconductor device at various fabrication stages constructed according to aspects of one or more embodiments of the present disclosure.

FIGS. 16B and 17B are cross-sectional views taken along line I-I' of FIGS. 16A and 17A, respectively, according to aspects of one or more embodiments of the present disclosure.

FIGS. 16C and 17C are cross-sectional views taken along line II-II' of FIGS. 16A and 17A, respectively, according to aspects of one or more embodiments of the present disclosure.

FIGS. 16D and 17D are cross-sectional views taken along line III-III' of FIGS. 16A and 17A, respectively, according to aspects of one or more embodiments of the present disclosure.

FIGS. 16E and 17E are cross-sectional view taken along line IV-IV' of FIGS. 16A and 17A, respectively, according to aspects of one or more embodiments of the present disclosure.

FIGS. 19A to 19K are cross-sectional views taken along line II-II' of FIGS. 18A to 18K respectively in accordance with some embodiments.

FIGS. 22A to 22I illustrate perspective views of intermediate stages of manufacturing a semiconductor structure in accordance with some embodiments.

FIGS. 23A to 23I are cross-sectional views taken along line II-II' of FIGS. 22A to 22I respectively in accordance with some embodiments.

DETAILED DESCRIPTION

Figure 1:
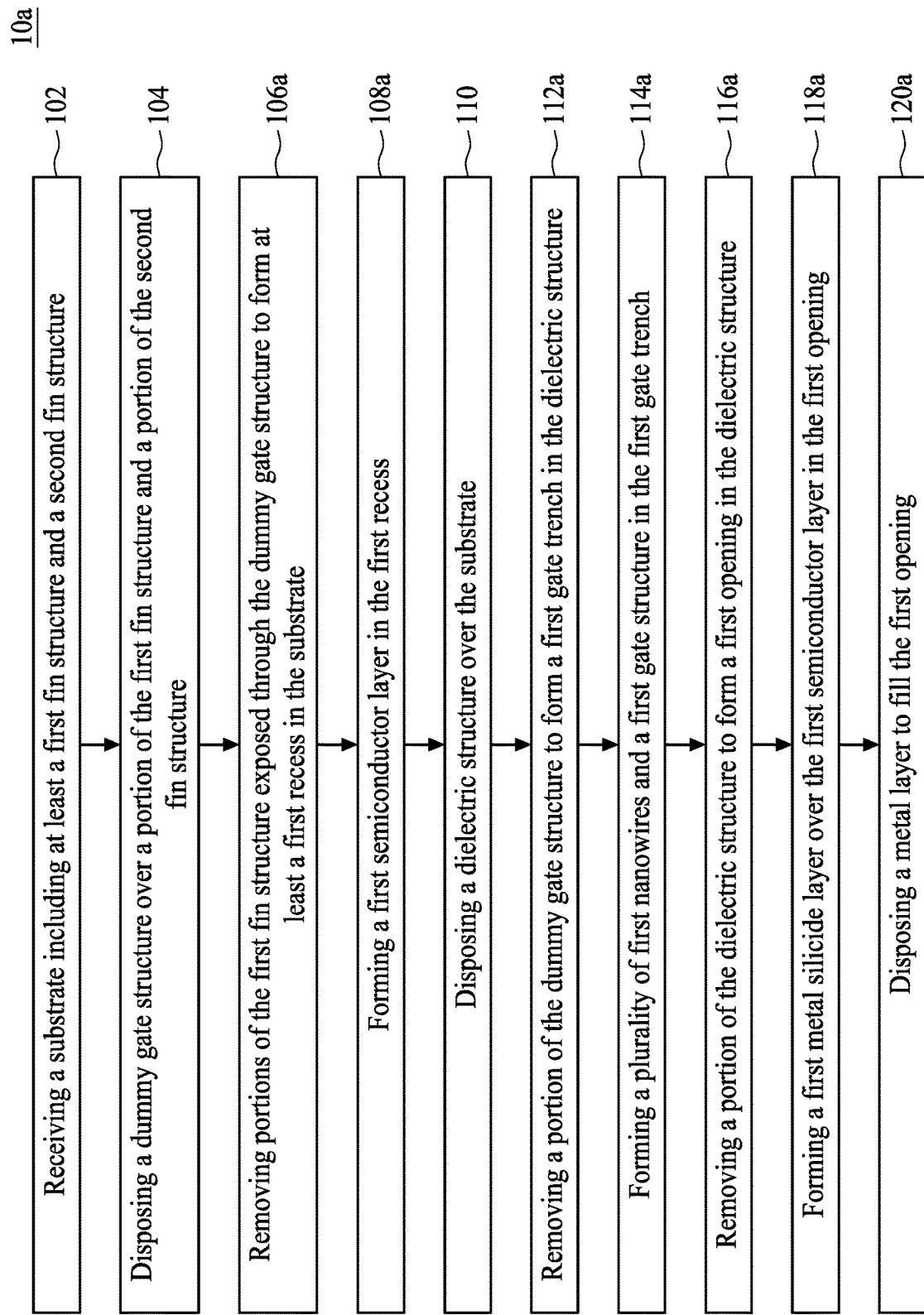
FIG. 1 shows a flow chart representing a method for forming a multi-gate semiconductor structure according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

GAA transistor structures may include nanowire structures, which are a promising candidate for logic device applications in future technologies. While downscaling device pitch, external resistance of source/drain and metal contact becomes a dominant factor in determining the device performance, more of a factor than channel resistance. As circuit density and device density increase, metal contact dimensions have to be decreased accordingly in order to minimize the ratio of contact area to the total chip area. Contact resistance is normally inverse to contact area. That is, a smaller contact area will correspond to a greater contact resistance. Further, within a limited contact area, resistance of a metal contact will be increased not only due to a smaller metal volume in the limited contact area, but also due to the inferior current spreading in metal. This makes contact resistance a significant and sometimes dominant factor in very large scale integration (VLSI) metal system performance.

It is therefore concluded that electrical contacts and associated contact resistance, which are required to conduct both power and signals throughout the integrated circuitry, are important in the manufacturing and subsequent operation of integrated circuit devices.

It should be noted that the present disclosure presents embodiments in the form of multi-gate transistors or fin-type multi-gate transistors referred to herein as FinFET devices. The FinFET devices may be GAA devices, Omega-gate (a-gate) devices, Pi-gate (H-gate) devices, dual-gate devices, tri-gate devices, bulk devices, silicon-on-insulator (SOI) devices, and/or other configurations. One of ordinary skill may recognize other examples of semiconductor devices that may benefit from aspects of the present disclosure.

FIG. 1 is a flow chart representing a method for forming a multi-gate semiconductor structure 10a according to aspects of the present disclosure. The method 10a includes an operation 102, receiving a substrate including at least a first fin structure and a second fin structure. The method 10a further includes an operation 104, disposing a dummy gate structure over a portion of the first fin structure and a portion of the second fin structure. The method 10a further includes an operation 106a, removing portions of the first fin structure exposed through the dummy gate structure to form at least a first recess in the substrate. The method 10a further includes an operation 108a, forming a first semiconductor layer in the first recess. The method 10a further includes an operation 110, disposing a dielectric structure over the substrate. The method 10a further includes an operation 112a, removing a portion of the dummy gate structure to form a first gate trench in the dielectric structure. The method 10a further includes an operation 114a, forming a plurality of first nanowires and a first gate structure in the first gate trench. The method 10a further includes an operation 116a, removing a portion of the dielectric structure to form a first opening in the dielectric structure. The method 10a further includes an operation 118a, forming a first metal silicide layer over the first semiconductor layer in the first opening. The method 10a further includes an operation 120a, disposing a metal layer to fill the first opening. The method 10a will be further described according to one or more embodiments. It should be noted that the operations of the method for forming the multi-gate semiconductor device 10a may be rearranged or otherwise modified within the scope of the various aspects. It should be further noted that additional processes may be provided before, during, and after the method 10a, and that some other processes may be only briefly described herein. Thus other implementations are possible within the scope of the various aspects described herein.

Figure 2:
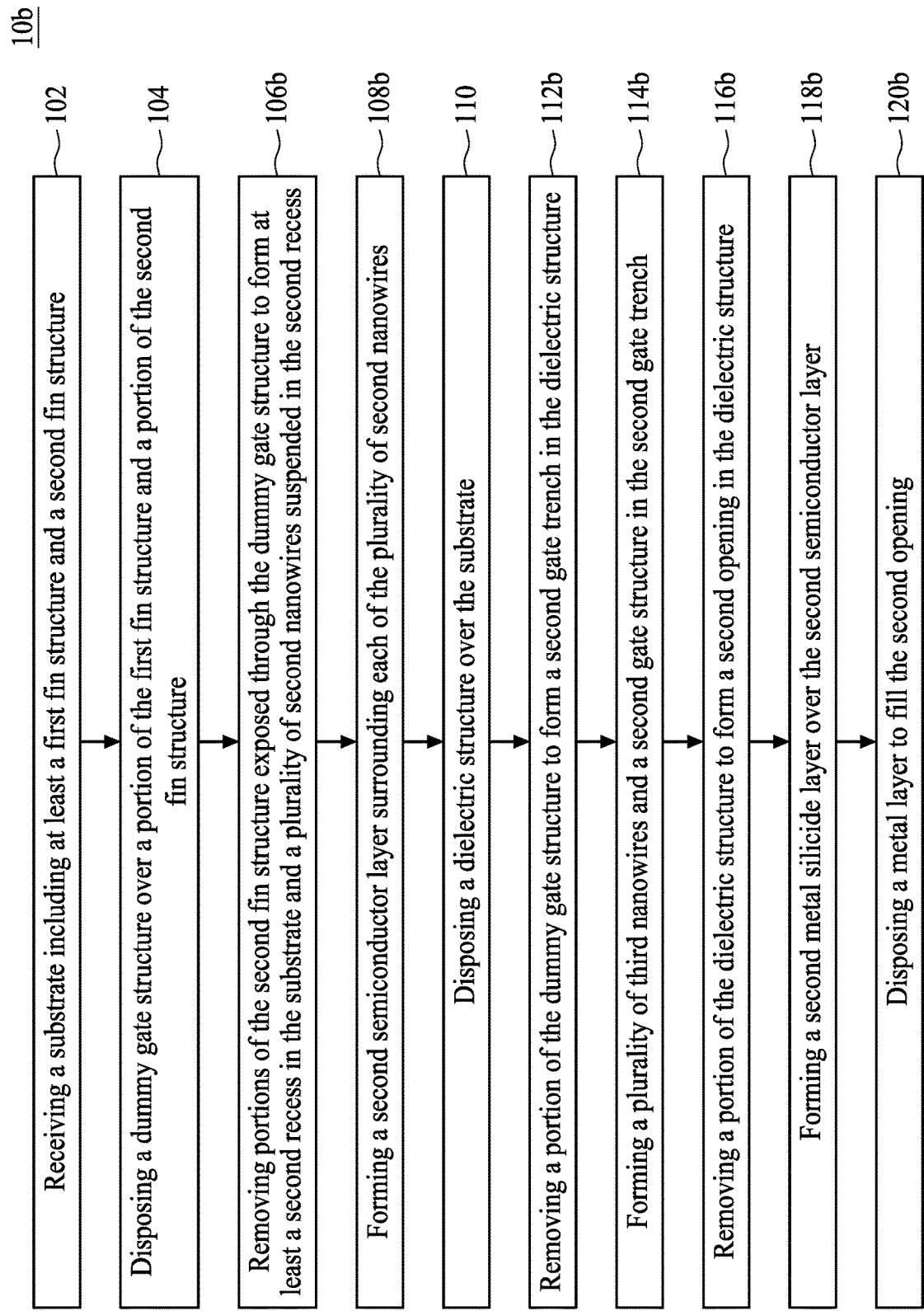
FIG. 2 shows a flow chart representing a method for forming a multi-gate semiconductor structure according to aspects of the present disclosure.

FIG. 2 is a flow chart representing a method for forming a multi-gate semiconductor structure 10b according to aspects of the present disclosure. In some embodiments, the method 10b and the method 10a share similar operations, but the disclosure is not limited thereto. The method 10b includes the operation 102, receiving a substrate including at least a first fin structure and a second fin structure. The method 10b further includes the operation 104, disposing a dummy gate structure over a portion of the first fin structure and a portion of the second fin structure. The method 10b further includes an operation 106b, removing portions of the second fin structure exposed through the dummy gate structure to form at least a second recess in the substrate and a plurality of nanowires suspended in the second recess. The method 10b further includes an operation 108b, forming a second semiconductor layer surrounding each of the plurality of second nanowires. The method 10b further includes the operation 110, disposing a dielectric structure over the substrate. The method 10b further includes an operation 112b, removing a portion of the dummy gate structure to form a second gate trench in the dielectric structure. The method 10b further includes an operation 114b, forming a plurality of third nanowires and a second gate structure in the second gate trench. The method 10b further includes an operation 116b, removing a portion of the dielectric structure to form a second opening in the dielectric structure. The method 10b further includes an operation 118b, forming a second metal silicide layer over the second semiconductor layer. The method 10b further includes an operation 120b, disposing a metal layer to fill the second opening. The method 10b will be further described according to one or more embodiments. It should be noted that the operations of the method for forming the multi-gate semiconductor device 10b may be rearranged or otherwise modified within the scope of the various aspects. Further, the method 10a and the method 10b can be integrated, and thus similar operations can be performed simultaneously. In some embodiments, operations 116b and 118b of the method 10b are performed after operations 116a and 118a of the method 10a. In other embodiments, operations 116a and 118a of the method 10a and operations 116b and 118b of the method 10b are simultaneously performed. It should be further noted that additional processes may be provided before, during, and after the method 10b, and that some other processes may be only briefly described herein. Thus other implementations are possible within the scope of the various aspects described herein.

Figure 3D:
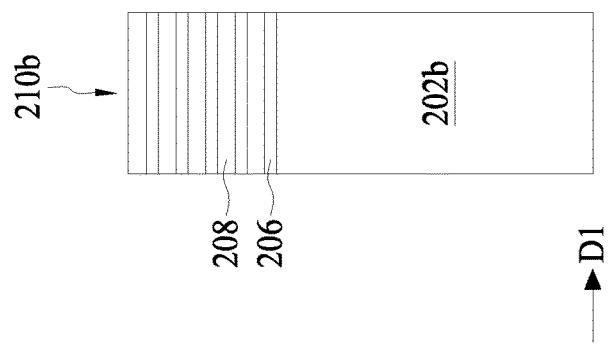
Figure 3C:
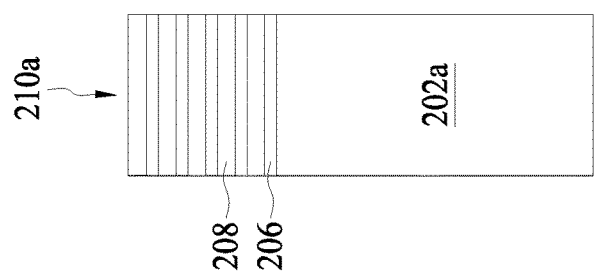
Figure 3B:
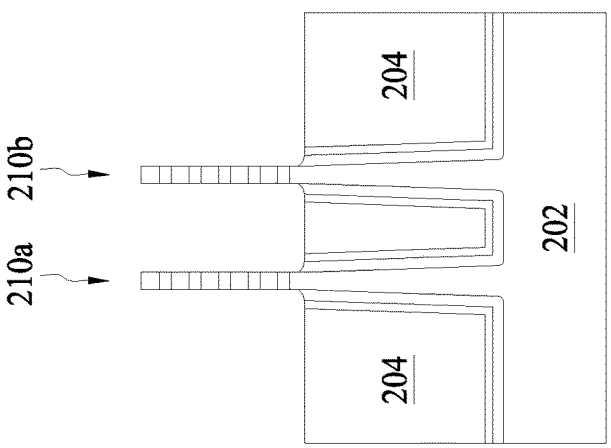
Figure 3A:
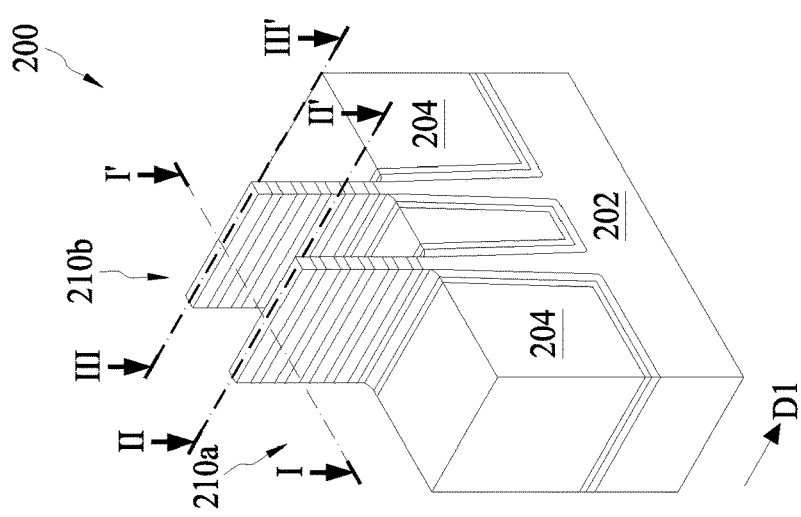

FIGS. 3A, 4A, 5A, 6A, 7A, 8A, 9A, 10A, 11A, 12A, 13A, 14A, and 15A are drawings illustrating a multi-gate semiconductor device 200 at various fabrication stages constructed according to aspects of one or more embodiments the present disclosure. FIGS. 3B, 4B, 5B, 6B, 7B, 8B, 9B, 10B, 11B, 12B, 13B, 14B, and 15B are cross-sectional views taken along line I-I' of FIGS. 3A, 4A, 5A, 6A, 7A, 8A, 9A, 10A, 11A, 12A, 13A, 14A, and 15A, respectively, according to aspects of one or more embodiments of the present disclosure, FIGS. 3C, 4C, 5C, 6C, 7C, 8C, 9C, 10C, 11C, 12C, 13C, 14C, and 15C are cross-sectional views taken along line II-II' of FIGS. 3A, 4A, 5A, 6A, 7A, 8A, 9A, 10A, 11A, 12A, 13A, 14A, and 15A, respectively, according to aspects of one or more embodiments of the present disclosure, FIGS. 3D, 4D, 5D, 6D, 7D, 8D, 9D, 10D, 11D, 12D, 13D, 14D, and 15D are cross-sectional views taken along line III-III' of FIGS. 3A, 4A, 5A, 6A, 7A, 8A, 9A, 10A, 11A, 12A, 13A, 14A, and 15A, respectively, according to aspects of one or more embodiments of the present disclosure, and FIGS. 4E, 5E, 6E, 7E, 8E, 9E, 10E, 11E, 12E, 13E, 14E, and 15E are cross-sectional views taken along line IV-IV' of FIGS. 4A, 5A, 6A, 7A, 8A, 9A, 10A, 11A, 12A, 13A, 14A, and 15A, respectively, according to aspects of one or more embodiments of the present disclosure. As shown in FIGS. 3A to 3D, a substrate 202 is provided. In some embodiments, the substrate 202 may be a semiconductor substrate such as a silicon substrate. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. The substrate 202 may include various layers, including conductive or insulating layers formed on a semiconductor substrate. The substrate 202 may include various doping configurations depending on design requirements as is known in the art. For example, different doping profiles (e.g., n wells, p wells) may be formed on the substrate 202 in regions 202a and 202b designed for different device types (e.g., n-type field effect transistors (NFET), or p-type field effect transistors (PFET)), as shown in FIGS. 3C and 3D. The suitable doping may include ion implantation of dopants and/or diffusion processes. The substrate 202 typically has isolation features (e.g., shallow trench isolation (STI) features) 204 interposing the regions 202a and 202b providing different device types. Further, the substrate 202 may optionally include an epitaxial layer (epi-layer), may be strained for performance enhancement, may include an SOI structure, and/or may have other suitable enhancement features. A stack including semiconductor layers is formed over the substrate 202. In some embodiments, a strain relaxed buffer (SRB) layer (not shown) can be formed over the substrate 202. The SRB layer may be different in composition from the substrate 202 in order to create lattice strain at the interface with the substrate 202. For example, in some embodiments, the substrate 202 includes silicon and is substantially free of germanium while the SRB layer includes SiGe.

Still referring to FIGS. 3A to 3D, a stack including semiconductor layers is formed over the substrate 202. In embodiments that include an SRB layer disposed on the substrate 202, the stack of semiconductor layers may be disposed on the SRB layer. The stack of semiconductor layers may include alternating layers of different compositions. For example, in some embodiments, the stack includes semiconductor layers 206 of a first composition alternating with semiconductor layers 208 of a second composition. By way of example, growth of the layers of the stack may be performed by a molecular beam epitaxy (MBE) process, a metalorganic chemical vapor deposition (MOCVD) process, and/or other suitable epitaxial growth processes. Although five semiconductor layers 206 and five semiconductor layers 208 are shown, it should be understood that the stack may include any number of layers of any suitable composition with various examples including between 2 and 10 semiconductor layers 206 and between 2 and 10 semiconductor layers 208. As explained below, the different compositions of the layers in the stack (e.g., semiconductor layers 206 and semiconductor layers 208) may be used to selectively process some of the layers. Accordingly, the compositions may have different oxidation rates, etchant sensitivity, and/or other differing properties. The semiconductor layers 206 and 208 may have thicknesses chosen based on device performance considerations. In some embodiments, the semiconductor layers 206 are substantially uniform in thickness, and the semiconductor layers 208 are substantially uniform in thickness. In some embodiments, the thickness of the semiconductor layers 206 can be less than the thickness of the semiconductor layers 208, but the disclosure is not limited thereto. For example but not limited thereto, the thickness of the semiconductor layers 206 can be approximately 6 nanometers (nm), and the thickness of the semiconductor layers 208 can be approximately 8 nm.

In some embodiments, the semiconductor layers 208 may include a first semiconductor material such as Si while the semiconductor layers 206 may include the first semiconductor material and a second semiconductor material with a lattice constant greater than a lattice constant of the first semiconductor material. For example, the semiconductor layers 206 may include SiGe, but the disclosure is not limited thereto. Additionally, Ge concentration in the semiconductor layers 206 can be less than or equal to approximately 50%, but the disclosure is not limited thereto. In other embodiments, the semiconductor layers 206 may include other materials such as a compound semiconductor such as SiC, gallium arsenide (GaAs), gallium phosphide (GaP), indium phosphide (InP), indium arsenide (InAs), and/or indium antimonide (InSb), an alloy semiconductor such as SiGe, GaAsP, AlInAs, AlGaAs, InGaAs, GaInP, and/or GaInAsP, or combinations thereof. In some embodiments, the semiconductor layers 206 and 208 may be undoped or substantially dopant-free, where, for example, no doping is performed during the epitaxial growth process. Alternatively, the semiconductor layers 206 and 208 may be doped. For example, the semiconductor layers 206 or 208 may be doped with a p-type dopant such as boron (B), aluminum (Al), In, and Ga for forming a p-type channel, or an n-type dopant such as P, As, Sb, for forming an n-type channel.

Still referring to FIGS. 3A to 3D, at least a first fin structure 210a and at least a second fin structure 210b are formed over the substrate 202 from the stack of semiconductor layers 206/208. The first fin structure 210a and the second fin structure 210b may be fabricated using suitable operations including photolithography and etch operations. In some embodiments, forming the first and second fin structures 210a and 210b may further include a trim process to decrease the width and/or the height of the first and second fin structures 210a and 210b. The trim process may include wet or dry etching processes. The height and width of the first and second fin structures 210a and 210b may be chosen based on device performance considerations. Further, the first and second fin structures 210a and 210b can extend along a first direction D1 as shown in FIGS. 3A to 3D. Accordingly, the substrate 202 including the at least one first fin structure 210a and at least one second fin structure 210b is received according to operation 102 of the method 10a and the method 10b.

Referring to FIGS. 4A to 4E, in some embodiments, a liner 209 can be formed over the first fin structure 210a, the second fin structure 210b and the substrate 202. Next, a dummy gate structure 212 is disposed over a portion of the first fin structure 210a and a portion of the second fin structure 210b according to operation 104 of the method 10a and the method 10b. The dummy gate structure 212 may be replaced at a later processing stage by a high-K dielectric layer (HK) and metal gate electrode (MG) as discussed below. In some embodiments, the dummy gate structure 212 is formed over the substrate 202 and extends along a second direction D2, which is not parallel with the first direction D1. Additionally, the first direction D1 and the second direction D2 are in the same plane. As shown in FIGS. 4A to 4D, the portion of the first fin structure 210a underlying the dummy gate structure 212 may be referred to as the channel region, and the portion of the second fin structure 210b underlying the dummy gate structure 212 may be referred to as the channel region. The dummy gate structure 212 may also define a source/drain region of the first fin structure 210a, for example, portions of the first fin structure 210a adjacent to and on opposing sides of the channel region. Similarly, the dummy gate structure 212 may also define a source/drain region of the second fin structure 210b, for example, portions of the second fin structure 210b adjacent to and on opposing sides of the channel region. In some embodiments, the dummy gate structure 212 can include at least a polysilicon layer and a patterned hard mask for defining the dummy gate structure.

Still referring to FIGS. 4A to 4E, a spacer 214 can be disposed over sidewalls of the dummy gate structure 212, and portions of the first and second fin structures 210a and 210b are exposed through the dummy gate structure 212 and the spacer 214. In some embodiments, the spacer 214 includes insulating materials. As shown in FIGS. 4A, 4C and 4D, the sidewalls of the dummy gate structure 212 are covered by the spacer 214. In some embodiments, portions of the liner 209 can be removed during or after the forming of the spacer 214, and thus portions of the first and second fin structures 210a and 210b are exposed as shown in FIGS. 4C to 4E.

Figures 5C, 5D:
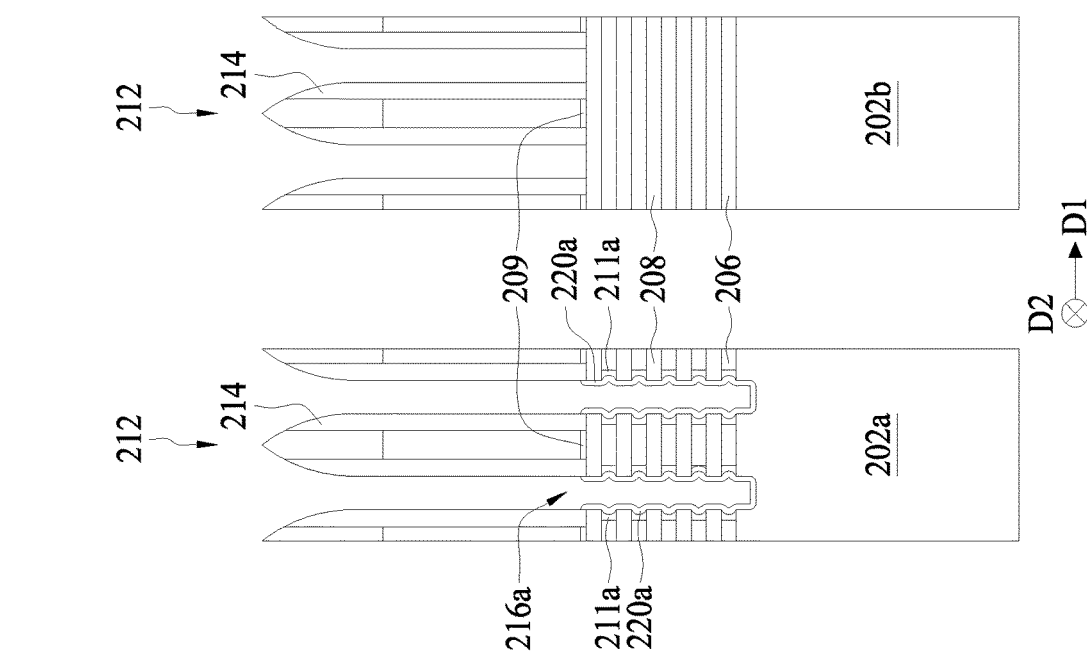
Figures 5B, 5E:
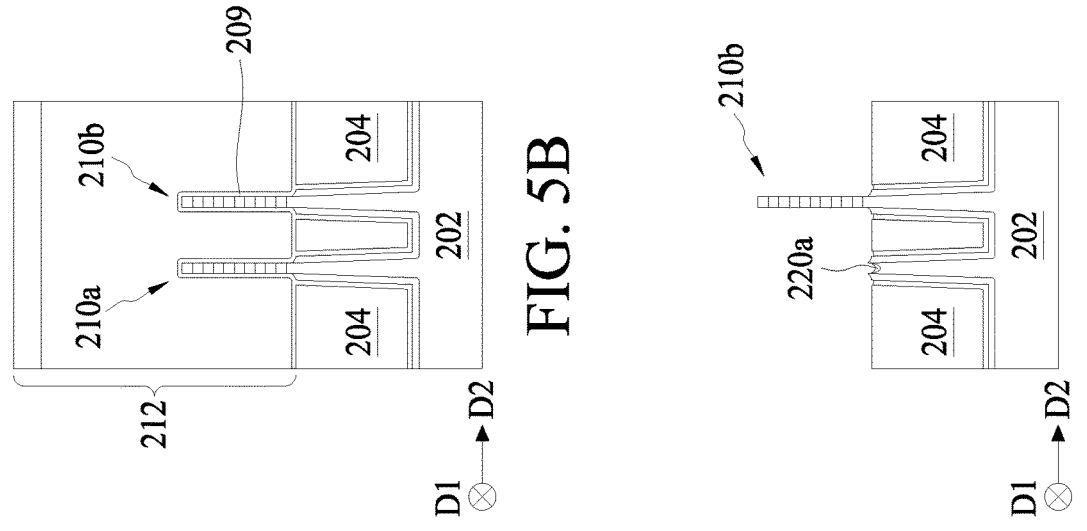
Figure 5A:
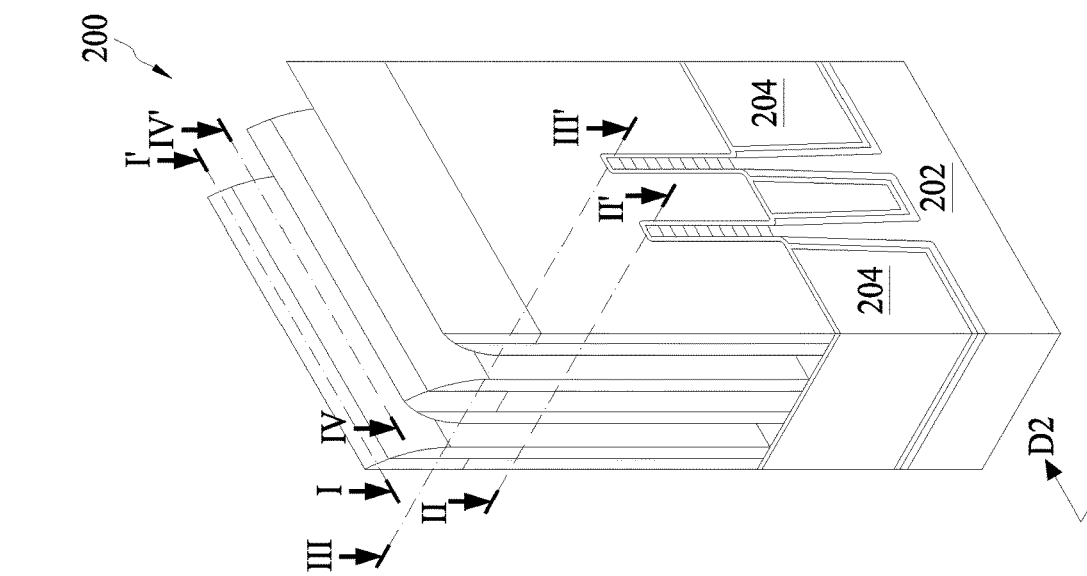

Referring to FIGS. 5A to 5E, next, the portions of the first fin structure 210a exposed through the dummy gate structure 212 and the spacer 214 are removed according to operation 106a. In some embodiments, portions of the semiconductor layers 206 and portions of the semiconductor layers 208 exposed through the dummy gate structure 212 and the spacer 214 are removed, thereby forming at least a first recess 216a in the substrate 202 as shown in FIG. 5C. In some embodiments, a patterned protecting layer (not shown) is formed over the second fin structure 210b or deposited over the region 202b. Thus the second fin structure 210b is protected and impervious to the formation of the first recess 216a. The semiconductor layers 206, and the semiconductor layers 208 are exposed through sidewalls of the first recess 216a and the substrate 202 is exposed through a bottom of the first recess 216a. In some embodiments, a portion of each of the exposed semiconductor layers 206 is removed and thus a plurality of notches (not shown) are formed. In some embodiments, an insulating layer (not shown) is formed over the substrate 202 and a suitable etching operation is then performed. Thus, a plurality of inner spacers 211a are formed in the notches as shown in FIG. 5C. Consequently, the semiconductor layers 208 and the inner spacers 211a are exposed. In other words, the semiconductor layers 206 are enclosed by the semiconductor layers 208 and the inner spacers 211a. In some embodiments, the inner spacers 211a include one or more insulating materials such as SiN, SiO, SiC, SiOC, SiOCN, other materials, or a combination thereof, but the disclosure is not limited thereto.

Still referring to FIGS. 5A to 5E, a first semiconductor layer 220a is formed in the first recess 216a according to operation 108a of the method 10a. In some embodiments, the first semiconductor layer 220a is a doped epitaxial semiconductor layer. In some embodiments, the first semiconductor layer 220a is a phosphorus-doped silicon (SiP) epitaxial layer, but the disclosure is not limited thereto. Additionally, the first semiconductor layer 220a covers the semiconductor layers 208, the inner spacers 211a and the bottom of the first recess 216a. Subsequently, the patterned protecting layer is removed from the substrate 202 after the forming of the first semiconductor layer 220a as shown in FIGS. 5A to 5E. In some embodiments, a thickness of the first semiconductor layer 220a is between approximately 10 nm and approximately 20 nm, but the disclosure is not limited thereto.

Referring to FIGS. 6A to 6E, next, portions of the second fin structure 210b exposed through the dummy gate structure 212 and the spacer 214 are removed according to operation 106b of the method 10b. In some embodiments, portions of the semiconductor layers 208 are removed, thereby forming at least a second recess 216b in the substrate 202 according to operation 106b. Significantly, a plurality of nanowires 230, which previously comprised the semiconductor layers 206, are formed in the second recess 216b according to operation 106b, as shown in FIGS. 6D and 6E. In some embodiments, a patterned protecting layer (not shown) is formed to fill the first recess 216a or deposited over the region 202a, and thus the first semiconductor layer 220a is protected and impervious to the formation of the second recess 216b and the plurality of nanowires 230. As shown in FIGS. 6D and 6E, the plurality of nanowires 230 are suspended in and exposed through the second recess 216b, the semiconductor layers 208 are exposed through sidewalls of the second recess 216b, and the substrate 202 is exposed through a bottom of the second recess 216b.

Referring to FIGS. 7A to 7E, a portion of the exposed semiconductor layers 208 is then removed and thus a plurality of notches (not shown) are formed. In some embodiments, an insulating layer (not shown) is formed over the substrate 202 and a suitable etching operation is subsequently performed. Thus, a plurality of inner spacers 211b are formed in the notches and over the substrate 202, as shown in FIG. 7D. In other words, the semiconductor layers 208 are enclosed by the semiconductor layers 206 and the inner spacers 211b. In some embodiments, the inner spacers 211b include one or more insulating materials such as SiN, SiO, SiC, SiOC, SiOCN, other materials, or a combination thereof, but the disclosure is not limited thereto.

Still referring to FIGS. 7A to 7E, a second semiconductor layer 220b is formed in the second recess 216b according to operation 108b of the method 10b. The second semiconductor layer 220b is formed to surround each of the nanowires 230, as shown in FIG. 7E. In some embodiments, the second semiconductor layer 220b includes the first semiconductor material and the second semiconductor material. For example but not limited thereto, the second semiconductor layer 220b can include SiGe, and a Ge concentration of the second semiconductor layer 220b is greater than the Ge concentration of the plurality of nanowires 230, which previously comprised the semiconductor layers 206. In some embodiments, the Ge concentration of the second semiconductor layer 220b is greater than 50%, but the disclosure is not limited thereto. In some embodiments, the Ge concentration of the second semiconductor layer 220b is between approximately 50% and approximately 70%, but the disclosure is not limited thereto. In some embodiments, the second semiconductor layer 220b is a doped epitaxial semiconductor layer. For example but not limited thereto, the second semiconductor layer 220b can be a boron-doped silicon germanium (SiGeB) epitaxial layer. Further, the patterned protecting layer is removed from the substrate 202 after the forming of the second semiconductor layer 220b. In some embodiments, the method 10a and the method 10b are integrated such that operations 106b and 108b of the method 10b are performed after operations 106a and 108a of the method 10a. However, operations 106b and 108b of the method 10b can performed before operations 106a and 108a of the method 10a in other embodiments.

Referring to FIGS. 8A to 8E, a dielectric structure 240 is disposed over the substrate 202 according to operation 110 of the method 10a and the method 10b. The dielectric structure 240 fills the first recess 216a and the second recess 216b. In some embodiments, the dielectric structure 240 can include an etch-stop layer (e.g., a contact etch stop layer (CESL)) 242 and various dielectric layers (e.g., an interlayer dielectric (ILD) layer) 244 formed on the substrate 202 after the forming of the second semiconductor layer 220b. In some embodiments, the CESL 242 includes a SiN layer, a SiCN layer, a SiON layer, and/or other materials known in the art. In some embodiments, the ILD layer 244 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after the CESL 242 and the ILD layer 244 are deposited, a planarization process, such as a chemical mechanical planarization (CMP) operation, may be performed to form the dielectric structure 240 and to expose a top surface of the dummy gate structure 212 as shown in FIGS. 8A to 8D. In some embodiments, the planarization is performed to expose at least a top surface of the polysilicon layer of the dummy gate structure 212.

Referring to FIGS. 9A to 9E, a portion of the dummy gate structure 212 is subsequently removed to form a first gate trench 218a in the dielectric structure 240 according to operation 112a. In some embodiments, a patterned protecting layer (not shown) is formed over the region 202b, and thus elements in the region 202b are protected and impervious to the formation of the first gate trench 218a. As shown in FIG. 9C, the spacer 214 is exposed through sidewalls of the first gate trench 218a, and the first fin structure 210a is exposed through the first gate trench 218a. Subsequently, the liner layer 209 disposed over the first fin structure 209 is removed, and the semiconductor layers 206 are then removed. Accordingly, a plurality of nanowires 232, which previously comprised the semiconductor layers 208, are formed in the first gate trench 218a according to operation 114a of the method 10a, as shown in FIGS. 9B and 9C. Further, the plurality of nanowires 232 serving as channel regions are suspended in the first gate trench 218a. In some embodiments, the nanowires 232 can be slightly etched to obtain various desirable dimensions and shapes, and the various desired dimensions and shapes may be chosen based on device performance considerations. As shown in FIG. 9C, the plurality of nanowires 232 and the inner spacers 211a are therefore exposed through the first gate trench 218a. The patterned protecting layer is then removed.

Figures 10A, 10B, 10C, 10D, 10E:
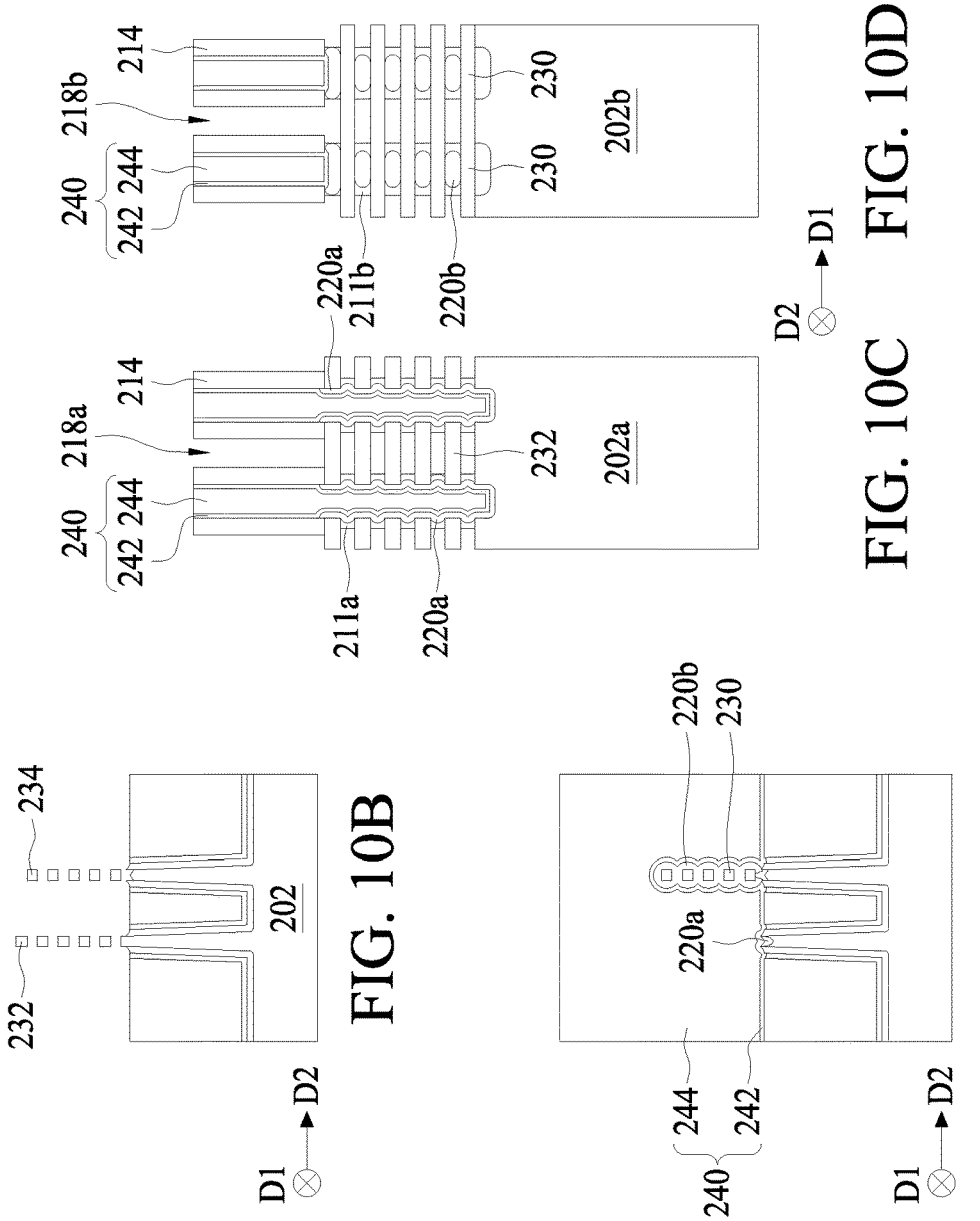

Referring to FIGS. 10A to 10E, another portion of the dummy gate structure 212 is then removed to form a second gate trench 218b in the dielectric structure 240 according to operation 112b of the method 10b. In some embodiments, another patterned protecting layer (not shown) is formed over the region 202a, and thus elements in the region 202a are protected and impervious to the formation of the second gate trench 218b. As shown in FIG. 10C, the spacer 214 is exposed through sidewalls of the second gate trench 218b, and the second fin structure 210b is exposed through the second gate trench 218b. Subsequently, the liner layer 209 disposed over the second fin structure 210b is removed, and the semiconductor layers 208 are removed. Accordingly, a plurality of nanowires 234, which previously comprised the semiconductor layers 206, are formed in the second gate trench 218b according to operation 114b of the method 10b, as shown in FIGS. 10B and 10D. Further, the plurality of nanowires 234 serving as channel regions are suspended in the second gate trench 218b. In some embodiments, the nanowires 234 can be slightly etched to obtain various desirable dimensions and shapes, and the various desired dimensions and shapes may be chosen based on device performance considerations. As shown in FIG. 10D, the plurality of nanowires 234 and the inner spacers 211b are therefore exposed through the second gate trench 218b. The patterned protecting layer is then removed. Additionally, the plurality of nanowires 230 and the plurality of nanowires 234, both of which previously comprised the semiconductor layers 206, include the same materials. Further, each of the nanowires 234 is coupled to each of the nanowires 230, as shown in FIG. 10D. In other words, each of the nanowires 234 is coupled to a corresponding nanowire 230. In some embodiments, it is referred that the nanowires 230 and nanowires 234 are the same nanowires, as shown in FIG. 10.

Referring to FIGS. 11A to 11E, an interfacial layer (IL) 252 is formed to surround each of the nanowires 232 exposed in the first gate trench 218a and each of the nanowires 234 exposed in the second gate trench 218b, as shown in FIG. 11B. In some embodiments, the IL 252 may include an oxide-containing material such as SiO or SiON. After the forming of the IL 252, a gate dielectric layer 254 is formed over the IL 252. As shown in FIG. 11B, the gate dielectric layer 254 surrounds each of the nanowires 232 and each of the nanowires 234. In some embodiments, the gate dielectric layer 254 includes a high-k dielectric material having a high dielectric constant, for example, a dielectric constant greater than that of thermal silicon oxide (~3.9). The high-k dielectric material may include hafnium oxide (HfO2), zirconium oxide (ZrO2), lanthanum oxide (La2O3), aluminum oxide (Al2Oa3), titanium oxide (TiO2), yttrium oxide (Ya2O3), strontium titanate (SrTiO3), hafnium oxynitride (HfOxNy), other suitable metal-oxides, or combinations thereof.

Still referring to FIGS. 11A to 11E, after the forming of the gate dielectric layer 254, a first gate conductive layer 256a is disposed in the first gate trench 218a according to operation 114a of the method 10a, and a second gate conductive layer 256b is disposed in the second gate trench 218b according to operation 114b of the method 10b. The first and second gate conductive layers 256a and 256b are formed on the gate dielectric layer 254. In some embodiments, the first gate conductive layer 256a is formed for an n-channel FET, and the second gate conductive layer 256b is formed for a p-channel FET. In some embodiments, the first gate conductive layer 256a can include at least a barrier metal layer (not shown) and a first work function layer, and the second gate conductive layer 256b can include at least a barrier metal layer (not shown) and a second work function metal layer. The barrier metal layer can include, for example but not limited to, TiN. The first work function metal layer, which provides proper work function to the n-channel FET, includes one or more of TaN, TaAlC, TIN, TIC, Co, TiAl, HfTi, TiSi and TaSi, but the disclosure is not limited thereto. The second work function metal layer, which provides proper work function to the p-channel FET, includes one or more of TiAlC, Al, TiAl, TaN, TaAlC, TIN, TiC and Co, but the disclosure is not limited thereto. Next, a gap-filling metal layer 258 is formed to fill the first gate trench 218a and the second gate trench 218b. The gap-filling metal layer 258 can include conductive material, such as Al, Cu, AlCu, or W, but is not limited to the above-mentioned materials. Accordingly, a first gate structure 250a is formed in the first gate trench 218a, and a second gate structure 250b is formed in the second gate trench 218b, as shown in FIGS. 11A to 11E.

Referring to FIGS. 12A to 12E, a patterned protecting layer 260 is then formed over the dielectric structure 240 and the first and second gate structures 250a and 250b. The patterned protecting layer 260 serves as an etching mask for the subsequent operations. Next, a portion of the dielectric layer 240 is removed through the patterned protecting layer 260, and thus at least a first opening 262a is formed in the dielectric structure 240 according to operation 116a of the method 10a. Further, the first semiconductor layer 220a is exposed in a lower portion of the first opening 262a while the dielectric structure 240 and the spacers 214 are exposed in an upper portion of the first opening 262a, as shown in FIGS. 12C and 12E.

Referring to FIGS. 13A to 13E, a first metal silicide layer 270a is then formed over the first semiconductor layer 220a according to operation 118a of the method 10a. The first metal silicide layer 270a includes the first semiconductor material and a first metal material. In some embodiments, the first metal silicide layer 270a can be formed by depositing a metallic layer such as a TiN layer over the first semiconductor layer 220a. Next, a thermal operation is performed. Consequently, a portion of the first semiconductor layer 220a reacts with the metallic layer, and the first metal silicide layer 270a is formed. Therefore, the first metal silicide layer 270a can include $TiSi_x$, but the disclosure is not limited thereto. A thickness of the first semiconductor layer 220a is reduced to between approximately 5 nm and approximately 15 nm, but the disclosure is not limited thereto. Additionally, since the first metal silicide layer 270a is formed only over the first semiconductor layer 220a, the first metal silicide layer 270a is exposed in the lower portion of the first opening 262a, as shown in FIG. 13C. In some embodiments, a glue layer 272 including TiN can be formed over the first metal silicide layer 270a and sidewalls of the upper portion of the first opening 262a. However, in other embodiments, the glue layer 272 can be omitted.

Referring to FIGS. 14A to 14E, a portion of the dielectric layer 240 is further removed to form at least a second opening 262b in the dielectric structure 240 according to operation 116b of the method 10b. Further, the second semiconductor layer 220b is exposed in a lower portion of the second opening 262b while the dielectric structure 240 and the spacers 214 are exposed in an upper portion of the second opening 262b, as shown in FIGS. 14D and 14E.

Figure 15E:
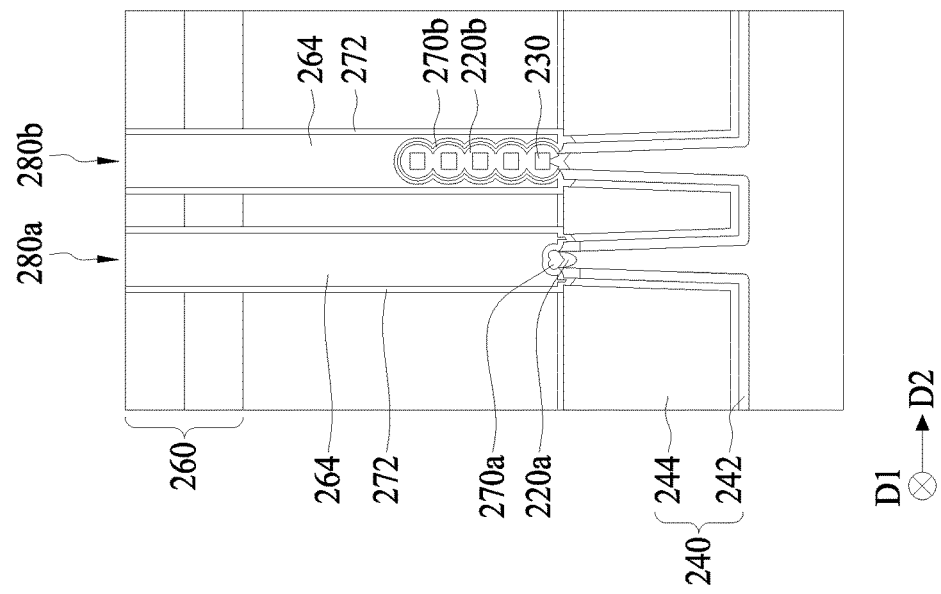
Figure 15B:
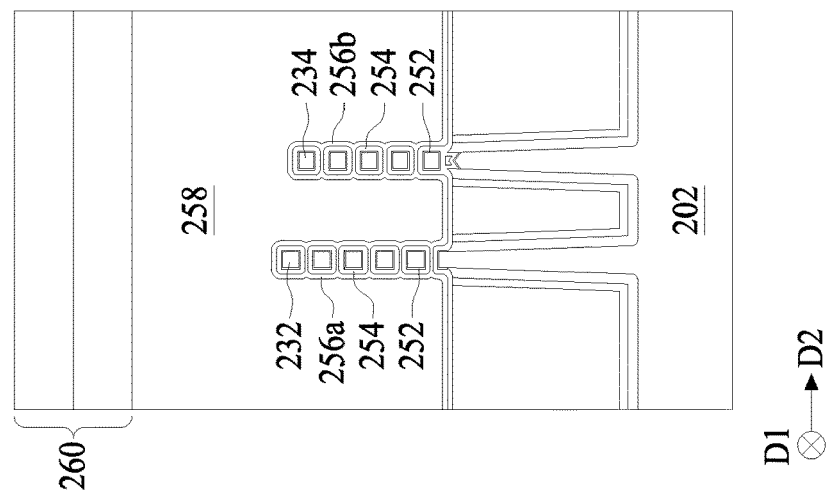
Figure 15A:
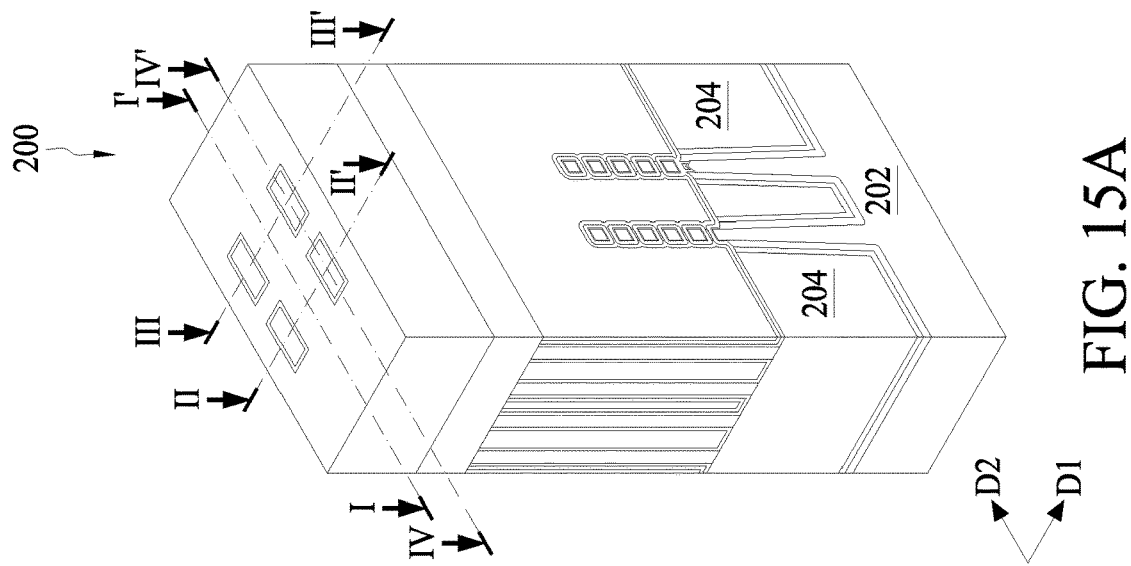

Referring to FIGS. 15A to 15E, a second metal silicide layer 270b is then formed over the second semiconductor layer 220b according to operation 118b of the method 10b. The second metal silicide layer 270b includes the first semiconductor material, the second semiconductor material, and a second metal material. In some embodiments, the second metal material of the second metal silicide layer 270b is different from the first metal material of the first metal silicide layer 270a. In some embodiments, the first metal silicide layer 270a includes TiSix, and the second metal silicide layer 270b includes NiSiGex, but the disclosure is not limited thereto. In some embodiment, a Ni layer is formed over the second semiconductor layer 220b, which is exposed in the lower portion of the second opening 262b, by suitable operation, such as chemical vapor deposition (CVD). Subsequently, anneal is performed such that Ni and SiGe are reacted and thus NiSiGeX silicide layer 270b is formed. The superfluous Ni layer is then removed. Additionally, since the second metal silicide layer 270b is formed only over the second semiconductor layer 220b, the second metal silicide layer 270b is exposed in the lower portion of the second opening 262b, as shown in FIG. 15E. In some embodiments, a glue layer 272 including TiN can be formed over the second metal silicide layer 270b and sidewalls of the upper portion of the second opening 262b. However, in other embodiments, the glue layer 272 can be omitted. Additionally, because thermal budget of Ni is lower than that of Ti, the first metal silicide layer 270a is formed before forming the second opening 262b and the second metal silicide layer 270b, but the disclosure is not limited thereto.

Still referring to FIGS. 15A to 15E, a metal layer 264 is next disposed to fill the first opening 262a and the second opening 262b according to operation 120a of the method 10a and operation 120b of the method 10b. In some embodiments, the metal layer 264 includes low-resistivity metal material, such as tungsten (W), but the disclosure is not limited thereto. Accordingly, at least a first conductor, such as a first metal portion 280a, is formed in the first opening 262a and a second conductor, such as a second metal portion 280b, is formed in the second opening 262b. As shown in FIGS. 15C and 15D, a bottom and sidewalls of a lower portion of the first metal portion 280a in the first opening 262a are surrounded by the first silicide layer 270a while sidewalls of an upper portion of the first metal portion 280a in the first openings 262a are surrounded by the spacer 214 and patterned protecting layer 260. Further, the bottom of the second metal portion 280b in the first opening 262a is lower than the plurality of nanowires 232, as shown in FIG. 15C. In contrast to the first metal portion 280a, a lower portion of the second metal portion 280b in the second openings 262b surrounds the second metal silicide layer 270b, as shown in FIGS. 15D and 15E.

Accordingly, a multi-gate semiconductor device 200a is obtained. As shown in FIG. 15C, the multi-gate semiconductor device 200a includes the plurality of nanowires 232, the first gate structure 250a over the plurality of nanowires 232, and source/drain structures 282a and 284a at two ends of each nanowire 232. The source/drain structures 282a and 284a include the first semiconductor layer 220a, the first metal portion 280a, and the first metal silicide layer 270a sandwiched between the first semiconductor layer 220a and the lower portion of the first metal portion 280a. Notably, a bottom surface of the first metal portion 280a is lower than the plurality of nanowires 232, as shown in FIG. 15C. Further, each of the first semiconductor layer 220a and the first metal silicide layer 270a substantially includes a U shape. Additionally, the first gate structure 250a can include a metal gate structure, but the disclosure is not limited thereto.

According to the multi-gate semiconductor device 200a, after the forming of the first semiconductor layer 220a and the first metal silicide layer 270a, there is still a space for forming the metal layer 264 in the first opening 262a, and thus the first metal portion 280a is obtained. Accordingly, the lower region of the first metal portion 280a can serve as a portion of the source/drain structures 282a and 284a while an upper region of the first metal portion 280a can serve as a contact plug for providing electrical connection between the source/drain structures 282a and 284a and other devices or circuits. More importantly, the first metal portion 280a can include low-resistivity metal material such as the aforementioned W, thereby reducing contact resistance.

In another embodiment, a multi-gate semiconductor device 200 is provided. The multi-gate semiconductor device 200 includes the multi-gate semiconductor structure 200a and a multi-gate semiconductor structure 200b. In some embodiments, the multi-gate semiconductor device 200 is a CMOS device, and the multi-gate semiconductor structure 200a is an n-channel FET and the multi-gate semiconductor structure 200b is a p-channel FET. As shown in FIGS. 15A to 15E, the multi-gate semiconductor device 200 includes the plurality of nanowires 232 serving as channel regions for the n-channel multi-gate semiconductor structure 200a and the plurality of nanowires 234 serving as channel regions for the p-channel multi-gate semiconductor structure 200b. The multi-gate semiconductor device 200 further includes the first gate structure 250a disposed over the plurality of nanowires 232, the second gate structure 250b disposed over the plurality of nanowires 234, the first source/drain structures 282a and 284a disposed at two ends of each nanowire 232, and second source/drain structures 282b and 284b disposed at two ends of each nanowire 234. It should be noted that the first source/drain structures 282a and 284a include a conductor such as the first metal portion 280a, the first semiconductor layer 220a disposed around sidewalls and a bottom of the lower portion of the first metal portion 280a, and the first metal silicide layer 270a disposed between the lower portion of the first metal portion 280a and the first semiconductor layer 220a. The second source/drain structures 282b and 284b include the plurality of nanowires 230, the second metal silicide layer 270b disposed over the plurality of nanowires 230, and the second semiconductor layer 220b disposed between the second metal silicide layer 270b and the plurality of nanowires 230. Further, the nanowires 230 and the nanowires 234 are the same nanowires. It is referred that a portion of each nanowire surrounded by the second gate structure 250b serve as channel regions and are referred to as a first portion 234, while another portion of each nanowire adjacent to and on opposite sides of the channel region form a part of the second sour/drain structures 282b and 284b and are referred to as a second portion 230.

As mentioned above, the first metal silicide layer 270a and the second metal silicide layer 270b can include different semiconductor materials and different metal materials. In some embodiments, the first metal silicide layer 270a includes TiSi while the second metal silicide layer 270b includes NiSiGe. It should be noted that for the n-channel multi-gate semiconductor structure 200a, the contact resistance is reduced by forming the low-resistivity first metal portion 280a having the bottom surface lower than the plurality of nanowires 232. For the p-channel multi-gate semiconductor structure 200b, the contact resistance is reduced by forming the Ni-silicide layer, because Ni resistance is lower than Ti resistance. Accordingly, the contact resistance of the multi-gate semiconductor device 200 is reduced by the dual contact formation.

Figure 17E:
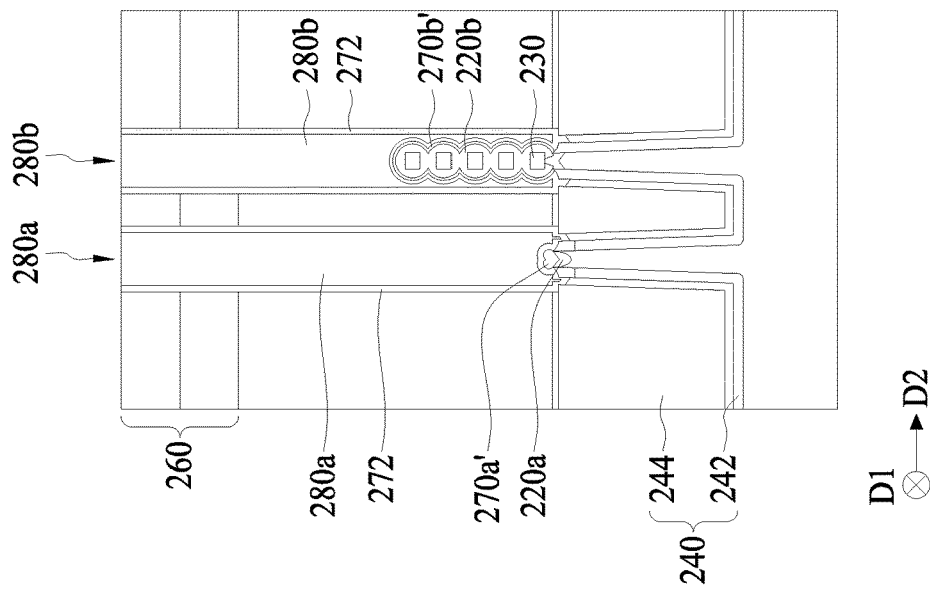
Figure 17B:
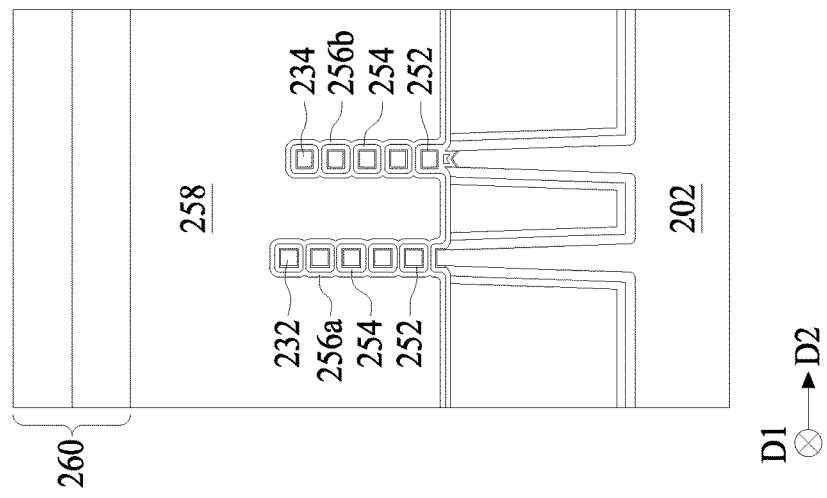
Figure 17A:
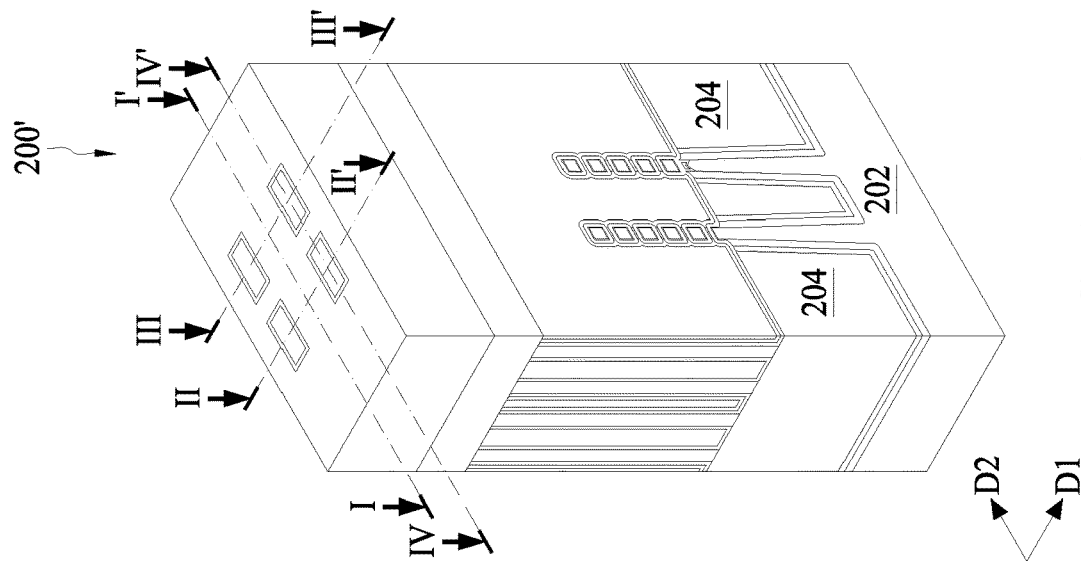

FIGS. 16A and 17A illustrate a multi-gate semiconductor device 200' at various fabrication stages constructed according to aspects of one or more embodiments of the present disclosure. FIG. 16B and FIG. 17B are cross-sectional views taken along line I-I' of FIGS. 16A and 17A, respectively, according to aspects of one or more embodiments of the present disclosure, FIGS. 16C and 17C are cross-sectional views taken along line II-II' of FIGS. 16A and 17A, respectively, according to aspects of one or more embodiments of the present disclosure, FIGS. 16D and 17D are cross-sectional views taken along line III-III' of FIGS. 16A and 17A, respectively, according to aspects of one or more embodiments of the present disclosure, and FIGS. 16E and 17E are cross-sectional views taken along line IV-IV' of FIGS. 16A and 17A, respectively, according to aspects of one or more embodiments of the present disclosure. It should be noted that similar elements in FIGS. 3A to 15E and FIGS. 16A to 17E are designated by the same numerals. Further, similar elements in FIGS. 3A to 15E and FIGS. 16A to 17E can include similar materials and can be formed by similar steps; therefore such redundant details are omitted in the interest of brevity.

Please refer to FIGS. 16A to 16E. In some embodiments, operations 102, 104, 106a and 108a, 106b and 108b, 110, 112a and 114a, and 112b and 114b are performed, and operations 116a and 116b are simultaneously performed after the forming of the first and second gate structures 250a and 250b. Consequently, a first opening 262a and a second opening 262b are simultaneously formed in the dielectric layer 240. As shown in FIGS. 16A to 16E, the first semiconductor layer 220a is exposed in the first opening 262a and the second semiconductor layer 220b is exposed in the second opening 262b. In some embodiments, the first semiconductor layer 220a forms a bottom and sidewalls of a lower portion of the first opening 262a while the second semiconductor layer 220b protrudes from a bottom of the second opening 262b, as shown in FIGS. 16C and 16E.

Referring to FIGS. 17A to 17E, a first metal silicide layer 270a' is formed over the first semiconductor layer 220a and a second metal silicide layer 270b' is formed over the second semiconductor layer 220b according to operations 118a and 118b. Notably, the operations 118a and 118b are performed at the same time, and thus the first metal silicide layer 270a' and the second metal silicide layer 270b' are simultaneously formed. The first metal silicide layer 270a' includes the first semiconductor material and a first metal material, and the second metal silicide layer 270b' includes the first semiconductor material, the second semiconductor material and a second metal material. Notably, the first metal material and the second metal material are the same. In some embodiments, the first metal silicide layer 270a' includes TiSi, and the second metal silicide layer 270b' includes TiSiGe, but the disclosure is not limited thereto.

Still referring to FIGS. 17A to 17E, a glue layer such as a TiN layer is then formed over the first metal silicide layer 270a', the second metal silicide layer 270b', sidewalls of an upper portion of the first opening 262a, and sidewalls of an upper portion of the second opening 262b. However, in some embodiments, formation of the glue layer can be omitted. Subsequently, a metal layer 264 is formed to fill the first opening 262a and the second opening 262b according to operation 120.

Accordingly, a multi-gate semiconductor device 200' is provided. The multi-gate semiconductor device 200' includes the multi-gate semiconductor structure 200a' and a multi-gate semiconductor structure 200b'. In some embodiments, the multi-gate semiconductor device 200' is a CMOS device, the multi-gate semiconductor structure 200a' is an n-channel FET, and the multi-gate semiconductor structure 200b' is a p-channel FET. As shown in FIGS. 17A to 17E, the multi-gate semiconductor device 200' includes the plurality of nanowires 232 serving as channel regions for the n-channel multi-gate semiconductor structure 200a' and the plurality of nanowires 234 serving as channel regions for the p-channel multi-gate semiconductor structure 200b'. The multi-gate semiconductor device 200' further includes the first gate structure 250a disposed over the plurality of nanowires 232, the second gate structure 250b disposed over the plurality of nanowires 234, the first source/drain structures 282a and 284a disposed at two ends of each nanowire 232, and the second source/drain structures 282b and 284b disposed at two ends of each nanowire 234. It should be noted that the first source/drain structures 282a and 284a include the first conductor such as the first metal portion 280a, the first semiconductor layer 220a disposed around sidewalls and a bottom of the lower portion of the first metal portion 280a, and the first metal silicide layer 270a' disposed between the lower portion of the first metal portion 280a and the first semiconductor layer 220a. The second source/drain structures 282b and 284b include the plurality of nanowires 230, the second metal silicide layer 270b' disposed over the plurality of nanowires 230, and the second semiconductor layer 220b disposed between the second metal silicide layer 270b' and the plurality of nanowires 230. Further, the nanowires 230 and the nanowires 234 are the same nanowires. It is referred that a portion of each nanowire surrounded by the second gate structure 250b serve as channel regions and are referred to as a first portion 234, while another portion of each nanowire adjacent to and on opposite sides of the channel region form a part of the second sour/drain structures 282b and 284b and are referred to as a second portion 230.

As mentioned above, the first metal silicide layer 270a' and the second metal silicide layer 270b' can include different semiconductor materials but the same metal materials. In some embodiments, the first metal silicide layer 270a' includes TiSi while the second metal silicide layer 270b' includes TiSiGe. It should be noted that for the n-channel multi-gate semiconductor structure 200a', the contact resistance is reduced by forming the low-resistivity first metal portion 280a. However, by simultaneously forming the first opening 262a and the second opening 262b and simultaneously forming the first metal silicide layer 270a' and the second metal silicide layer 270b', the methods 10a and 10b are integrated and simplified while contact resistance of the multi-gate semiconductor device 200' is reduced.

According to one embodiment of the present disclosure, a multi-gate semiconductor structure is provided. The multi-gate semiconductor structure includes a plurality of nanowires, a gate structure disposed over the plurality of nanowires, and source/drain structures at two ends of each of the plurality of nanowires. The source/drain structures include a semiconductor layer, a metal portion, and a metal silicide layer. Further, a bottom surface of the metal portion is lower than the plurality of nanowires.

According to another embodiment, a multi-gate semiconductor device is provided. The multi-gate semiconductor device includes a plurality of first nanowires and a plurality of second nanowires, a first gate structure disposed over the plurality of first nanowires and a second gate structure disposed over a first portion of the plurality of second nanowires, first source/drain structures disposed at two ends of each of the plurality of first nanowires, and second source/drain structures disposed at two ends of each of the first portions of the second nanowires. The first source/drain structures further include a conductor, a first semiconductor disposed around a bottom and sidewalls of a portion of the conductor, and a first metal silicide layer disposed between the conductor and the first semiconductor layer. The second source/drain structures further include a second portion of the second nanowires, a second metal silicide layer disposed over the second portions of the second nanowires, and a second semiconductor layer disposed between the second metal silicide layer and the second portions of the second nanowires.

According to one embodiment of the present disclosure, a method for forming a multi-gate semiconductor device is provided. The method includes the following operations. A substrate including at least a first fin structure and a second fin structure is received. A dummy gate structure is disposed over a portion of the first fin structure and a portion of the second fin structure. Portions of the first fin structure exposed through the dummy gate structure are removed to form at least a first recess in the substrate. A first semiconductor layer is formed in the first recess. A dielectric structure is disposed over the substrate. A portion of the dummy gate structure is removed to form a first gate trench in the dielectric structure. A plurality of first nanowires and a first gate structure are formed in the first gate trench. A portion of the dielectric structure is removed to form a first opening exposing the first semiconductor layer. A first metal silicide layer is formed over the first semiconductor layer. A metal layer is formed to fill the first opening, where a bottom of the metal layer in the first opening is lower than the plurality of nanowires.

FIGS. 18A to 18K illustrate perspective views of intermediate stages of manufacturing a semiconductor structure 300 in accordance with some embodiments. FIGS. 19A to 19K are cross-sectional views taken along line II-II' of FIGS. 18A to 18K respectively in accordance with some embodiments. Some processes and materials for forming the semiconductor structure 300 may be similar to, or the same as, those for forming the multi-gate semiconductor devices 200 and 200' described above and are not repeated herein.

Figure 18C:
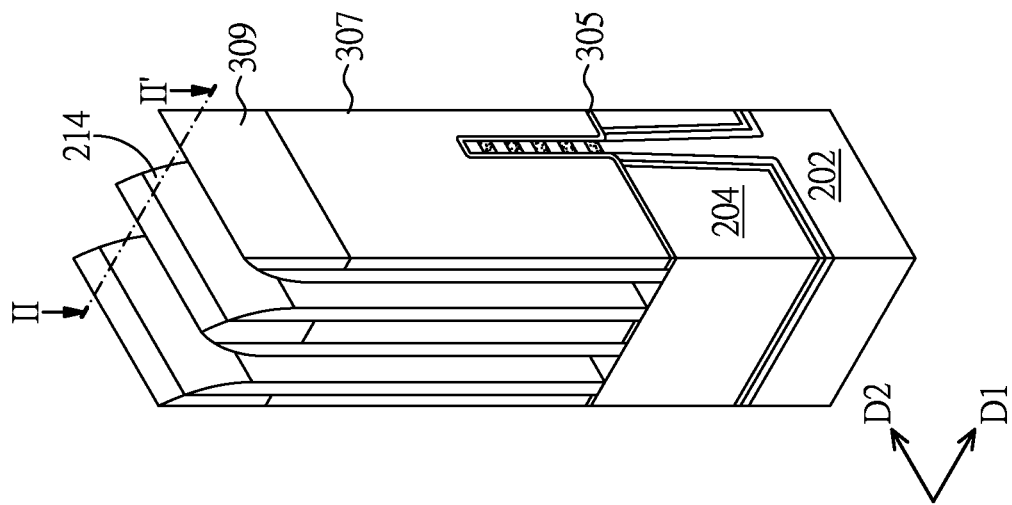
FIGS. 18A to 18K illustrate perspective views of intermediate stages of manufacturing a semiconductor structure in accordance with some embodiments.
Figure 18B:
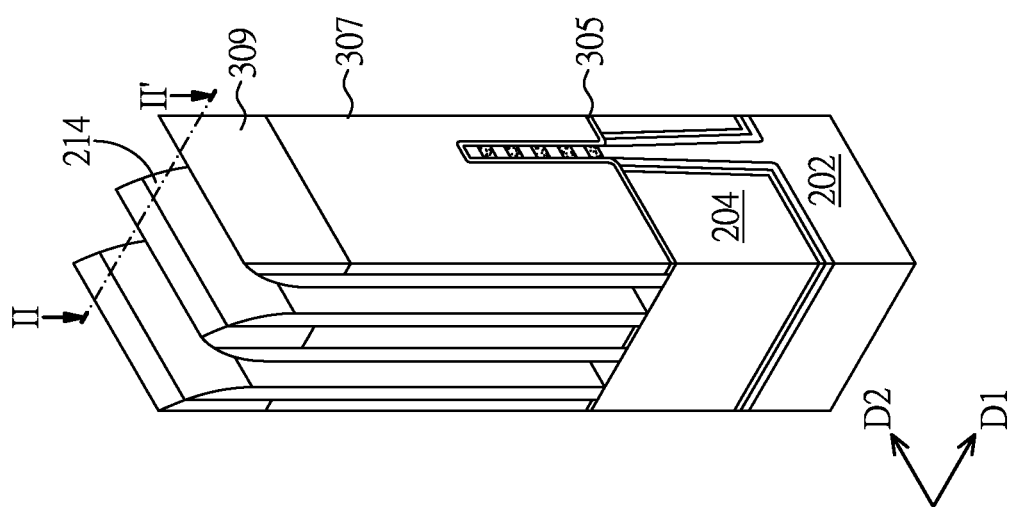
Figure 18A:
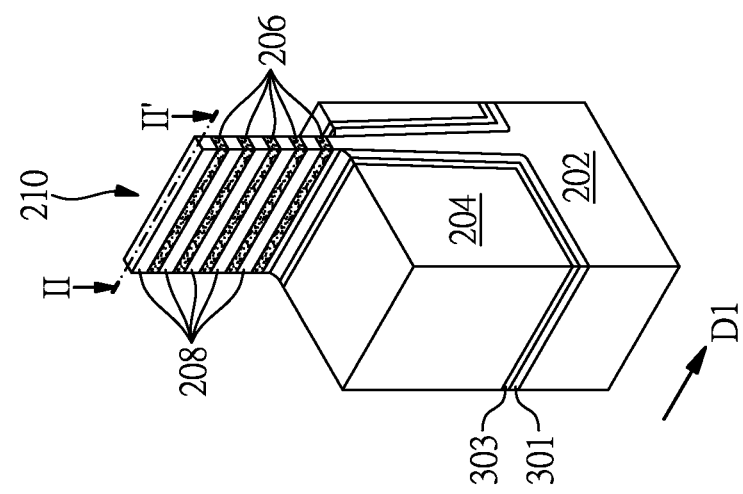
Figure 19A:
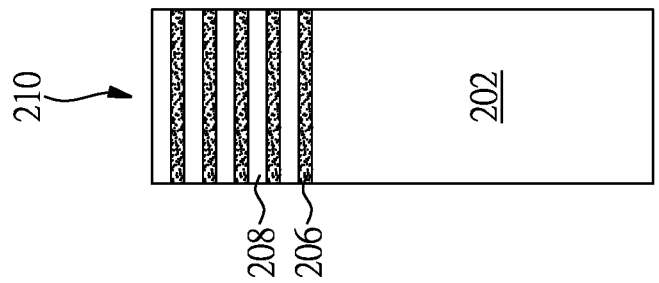

Similar to FIGS. 3A to 3D, a fin structure 210 similar to the first fin structure 210a described above is formed over the substrate 202 from the alternately stacked semiconductor layers 206/208, and the isolation feature 204 is formed around the fin structure 210, as shown in FIGS. 18A and 19A in accordance with some embodiments. In some embodiments, a first liner layer 301 and a second liner layer 303 are formed before the isolation feature 204 is formed.

In some embodiments, the first liner layer 301 and the second liner layer 303 are made of different materials. In some embodiments, the first liner layer 301 and the second liner layer 303 are made of materials such as silicon oxide, silicon nitride, silicon oxynitride (SiON), other applicable insulating materials, or a combination thereof. In some embodiments, the first liner layer 301 is made of an oxide and the second liner layer 303 is made of a nitride. The first liner layer 301, the second liner layer 303, and isolation features 204 may be formed by using LPCVD, PECVD, high-density plasma CVD (HDP-CVD), high aspect ratio process (HARP), flowable CVD (FCVD), ALD, another suitable method, or a combination thereof.

Figure 19D:
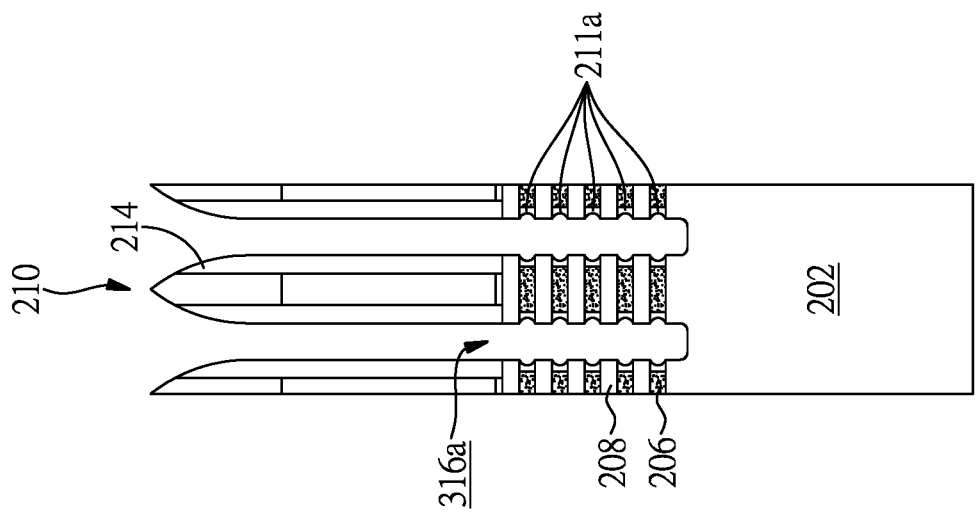
Figure 19C:
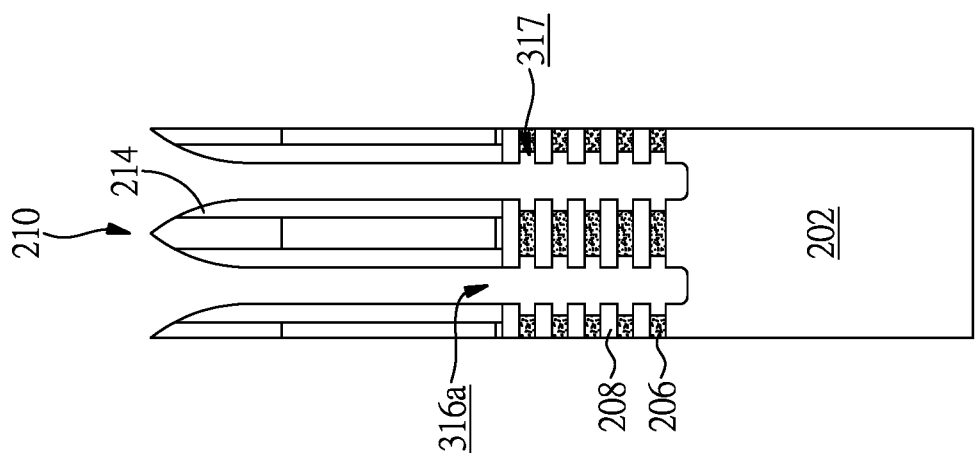
Figure 19B:
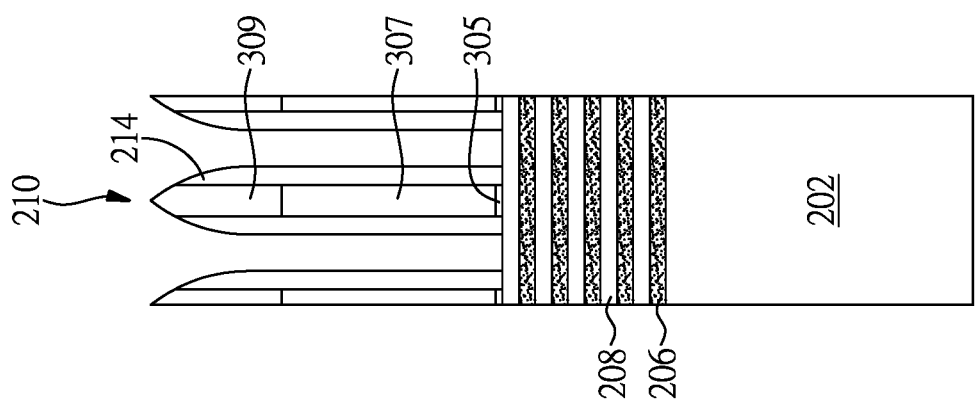

After the isolation feature 204 is formed, dummy gate structures 212 are formed across the fin structure 210, and the spacers 214 are formed on the sidewalls of the dummy gate structures 212, as shown in FIGS. 18B and 19B in accordance with some embodiments. The portion of the fin structure 210 underlying the dummy gate structure 212 may be referred to as the channel region, and the portions of the fin structure 210 adjacent to and on opposite sides of the channel region may be defined as the source/drain regions.

In some embodiments, the dummy gate structure 212 includes a gate dielectric layer 305, a gate electrode layer 307, and a mask layer 309. In some embodiments, the gate dielectric layer 305 is made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dielectric material is formed using thermal oxidation, CVD, ALD, physical vapor deposition (PVD), another suitable method, or a combination thereof.

In some embodiments, the gate electrode layer 307 is made of a conductive material. In some embodiments, the conductive material includes polycrystalline-silicon (poly-Si), poly-crystalline silicon-germanium (poly-SiGe), metallic nitrides, metallic silicides, metals, or a combination thereof. In some embodiments, the conductive material is formed using CVD, PVD, or a combination thereof.

In some embodiments, the mask layer 309 is a bi-layers structure including an oxide layer and a nitride layer. In some embodiments, the oxide layer is silicon oxide, and the nitride layer is silicon nitride.

The formation of the dummy gate structure 212 may include conformally forming a dielectric material as the gate dielectric layer 305 along the substrate 102, the fin structure 210, and the isolation feature 204. After the dielectric material is formed, a conductive material may be formed over the dielectric material as the gate electrode layer 307 and the mask layer 309 may be formed over the conductive material. After the mask layer 309 is formed, the dielectric material and the conductive material may be patterned through the mask layer 309 to form the dummy gate structure 212. Similar to FIGS. 4A to 4E, after the dummy gate structures 212 are formed, the spacers 214 are formed on the sidewalls of the dummy gate structures 212 in accordance with some embodiments.

Next, portions of the semiconductor layers 206 and 208 of the fin structure 210 not covered by the dummy gate structures 212 and the spacers 214 are recessed to form recesses 316a, as shown in FIGS. 18C and 19C in accordance with some embodiments. In some embodiments, the fin structure 210 is recessed by performing an etching process. After the recesses 316a are formed, the semiconductor layers 206 are laterally etched from the recesses 316a to form notches 317 between the semiconductor layers 208 in accordance with some embodiments.

Figure 18F:
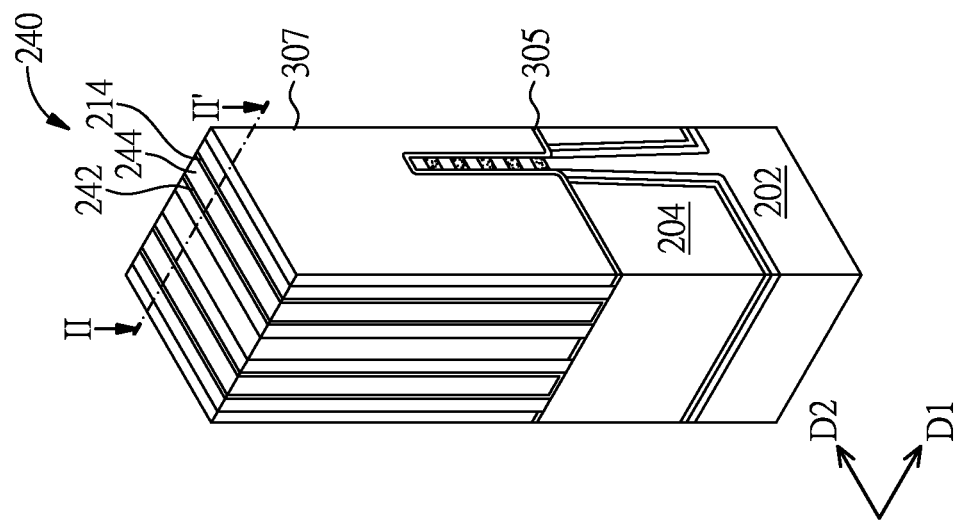
Figure 18E:
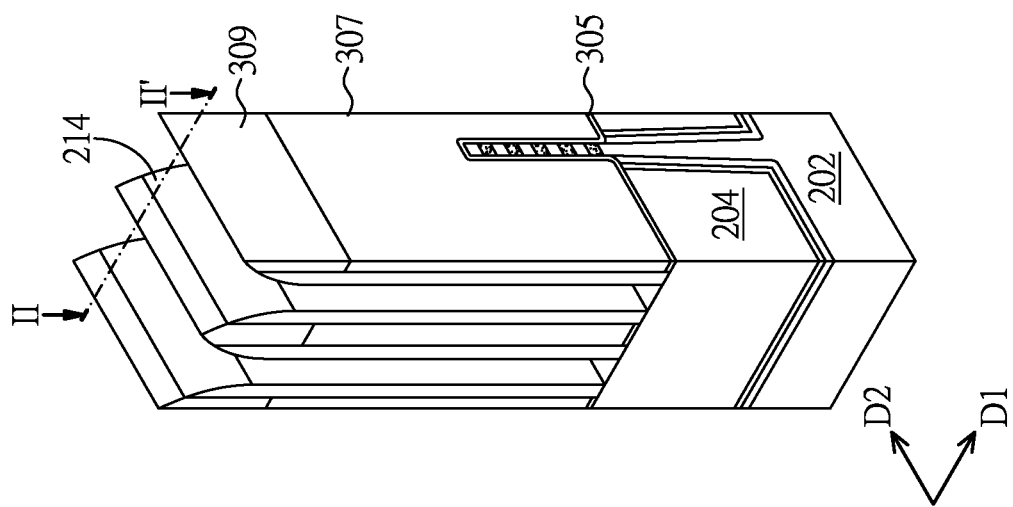
Figure 18D:
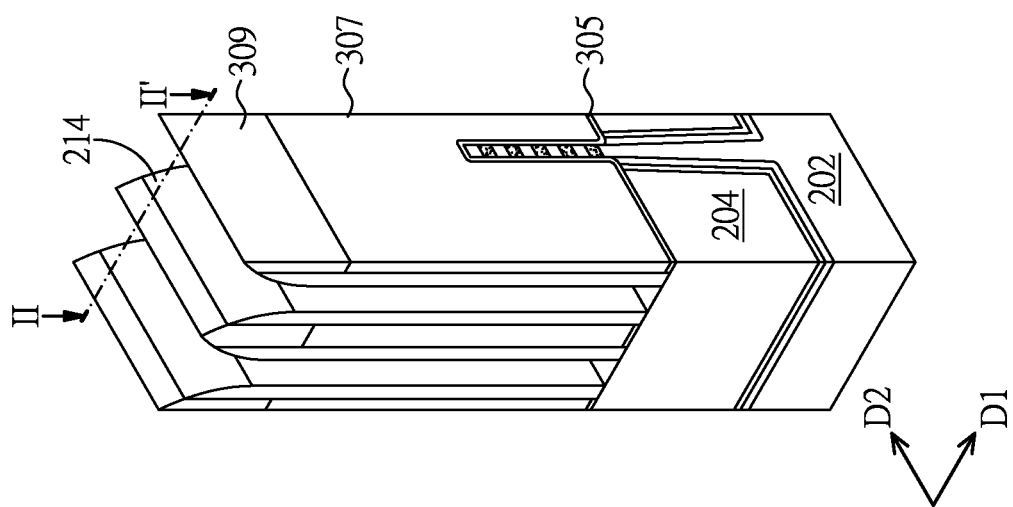
Figure 19G:
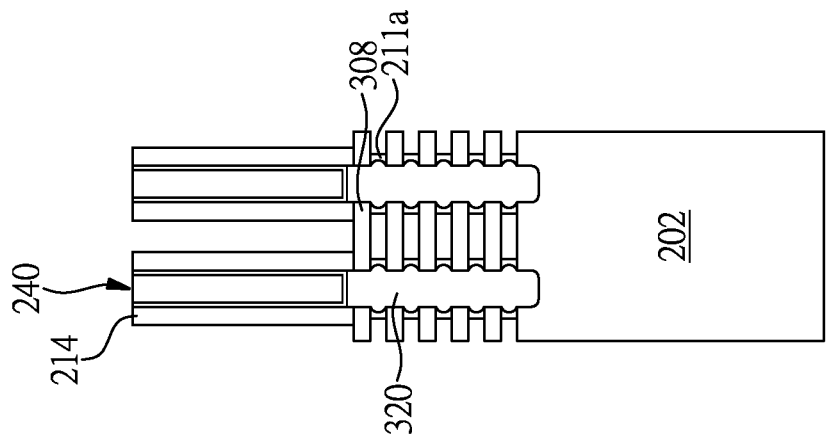

After the notches 317 are formed, the inner spacers 211a are formed in the notches 317, as shown in FIGS. 18D and 19D in accordance with some embodiments. Next, source/drain structures 320 are formed in the recesses 316a, as shown in FIGS. 18E and 19E in accordance with some embodiments. In some embodiments, the source/drain structures 320 are formed using a process similar to that used to form the first semiconductor layer 220a. In some embodiments, the source/drain structures 320 are formed using an epitaxial growth process, such as MBE, MOCVD, VPE, other applicable epitaxial growth processes, or a combination thereof. In some embodiments, the source/drain structures 320 are made of any applicable material for an n-type semiconductor device and a p-type semiconductor device, such as Ge, Si, GaAs, AlGaAs, SiGe, GaAsP, SiP, SiC, SiCP, or a combination thereof.

In some embodiments, the source/drain structures 320 are in-situ doped during the epitaxial growth process. For example, the source/drain structures 320 may be the epitaxially grown SiGe doped with boron (B). For example, the source/drain structures 320 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 320 are doped in one or more implantation processes after the epitaxial growth process.

Figure 19F:
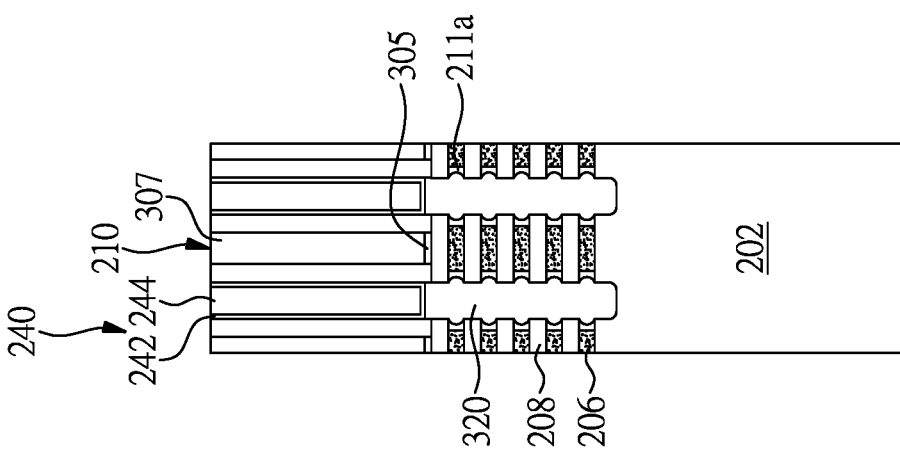
Figure 19E:
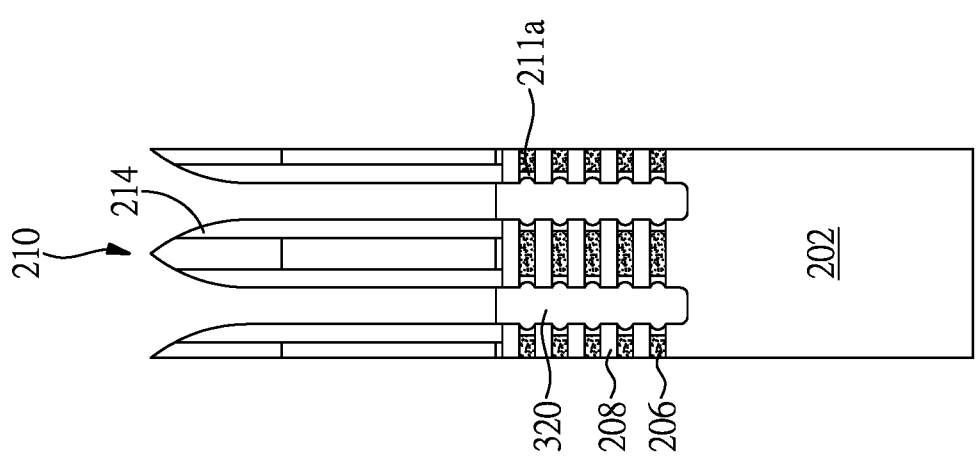

After the source/drain structures 320 are formed, the dielectric structure 240 including the contact etch stop layer (CESL) 242 and the inter-layer dielectric (ILD) layer 244 is formed, and a polishing process is performed until a top surface of the gate electrode layer 307 is exposed, as shown in FIGS. 18F and 19F in accordance with some embodiments.

Figure 18I:
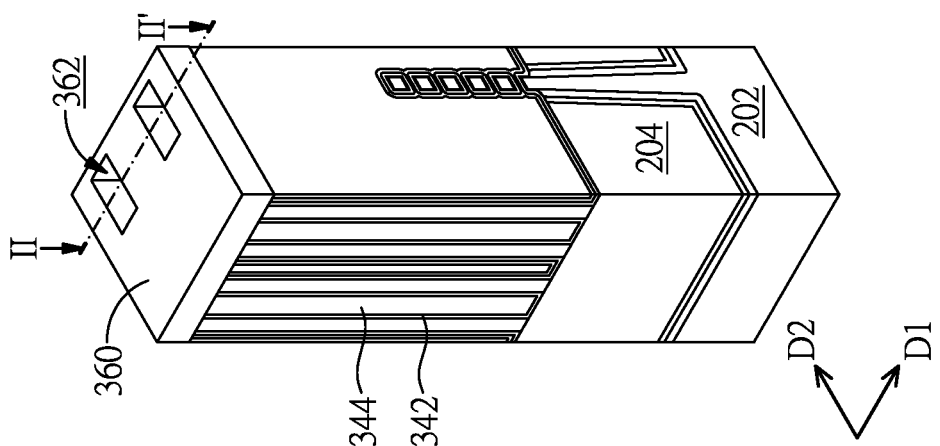
Figure 18H:
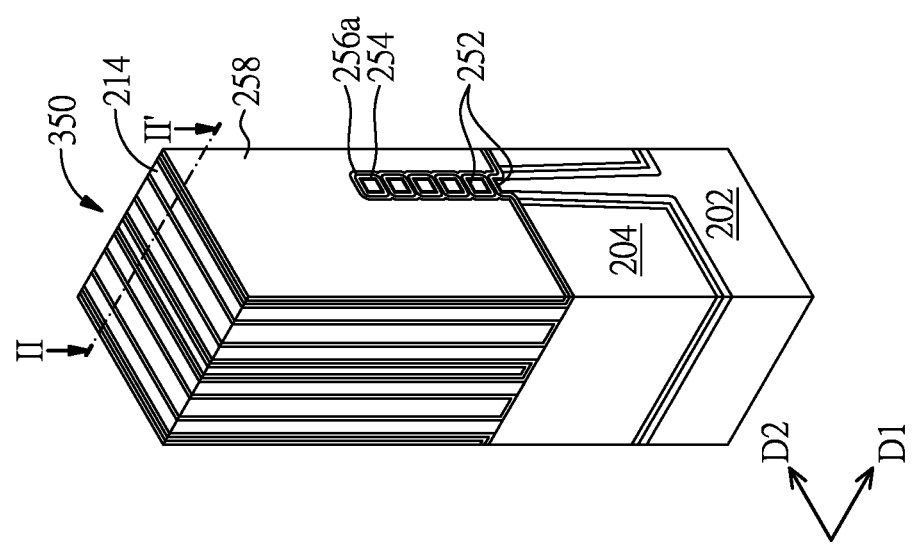
Figure 18G:
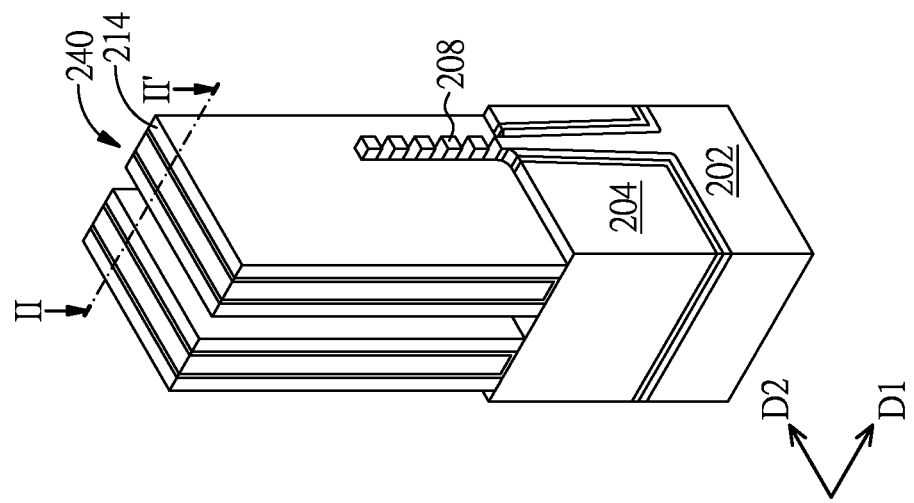

Next, the dummy gate structures 212 are removed to expose the semiconductor layers 206 and 208 of the fin structure 210, and the semiconductor layers 206 of the fin structure 210 in the channel region are then removed to form nanostructures 308 from the semiconductor layers 208, as shown in FIGS. 18G and 19G in accordance with some embodiments. As shown in FIG. 19G, gaps are formed between the nanostructures 308 in accordance with some embodiments.

Afterwards, gate structures 350 are formed over the nanostructures 308 and wrapped around the nanostructures 308, as shown in FIGS. 18H and 19H in accordance with some embodiments. Similar to the first gate structure 250a, the gate structure 350 includes an interfacial layer (IL) 252, a gate dielectric layer 254, a first gate conductive layer 256a, and a gap-filling metal layer 258 in accordance with some embodiments. In some embodiments, the nanostructures 308 are wrapped by the interfacial layer 252, the gate dielectric layer 254, and the first gate conductive layer 256a. In some embodiments, the nanostructures 308 are also wrapped by the gap-filling metal layer 258 (not shown).

After the gate structures 350 are formed, a dielectric layer 360 is formed over the inter-layer dielectric layer 244, and contact openings 362 are formed through the dielectric layer 360 and the inter-layer dielectric layer 244, as shown in FIGS. 18I and 19I in accordance with some embodiments. More specifically, the dielectric layer 360 and the inter-layer dielectric layer 244 may be etched through openings of a mask (not shown) to form the contact openings 362, and the source/drain structures 320 are exposed by the contact openings 362 in accordance with some embodiments.

In some embodiments, the dielectric layer 360 is made of silicon oxide, silicon nitride, silicon oxynitride, phosphosilicate glass (PSG), borophosphosilicate glass (BPSG), and/or other applicable low-k dielectric materials. The dielectric layer 360 may be formed by chemical vapor deposition (CVD), physical vapor deposition, (PVD), atomic layer deposition (ALD), or other applicable processes. In some embodiments, an etch stop layer (not shown) is formed before the dielectric layer 360 is formed.

Figure 18K:
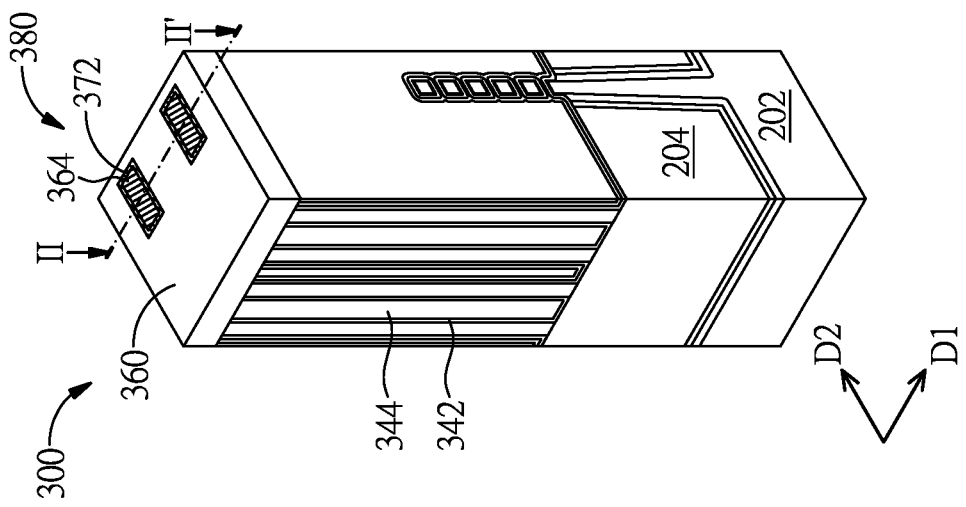
Figure 18J:
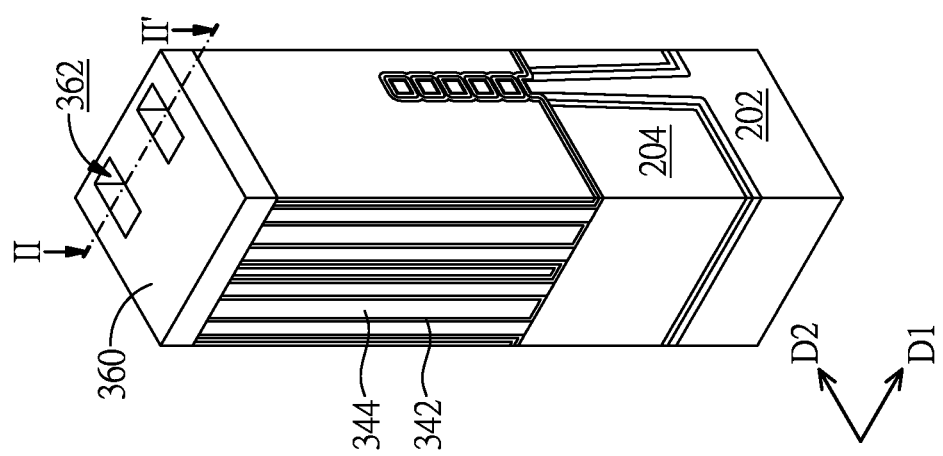

After the contact openings 362 are formed, trenches 363 are formed in the source/drain structures 320, as shown in FIGS. 18J and 19J in accordance with some embodiments. More specifically, the source/drain structures 320 are etched through the contact opening 362 to form the trenches 363 in accordance with some embodiments. In some embodiments, a bottom portion of the trenches 363 is lower than the bottommost nanostructure 308. In some embodiments, the bottom portion of the trenches 363 is lower than the bottom surface of the gate structures 350.

Figure 19K:
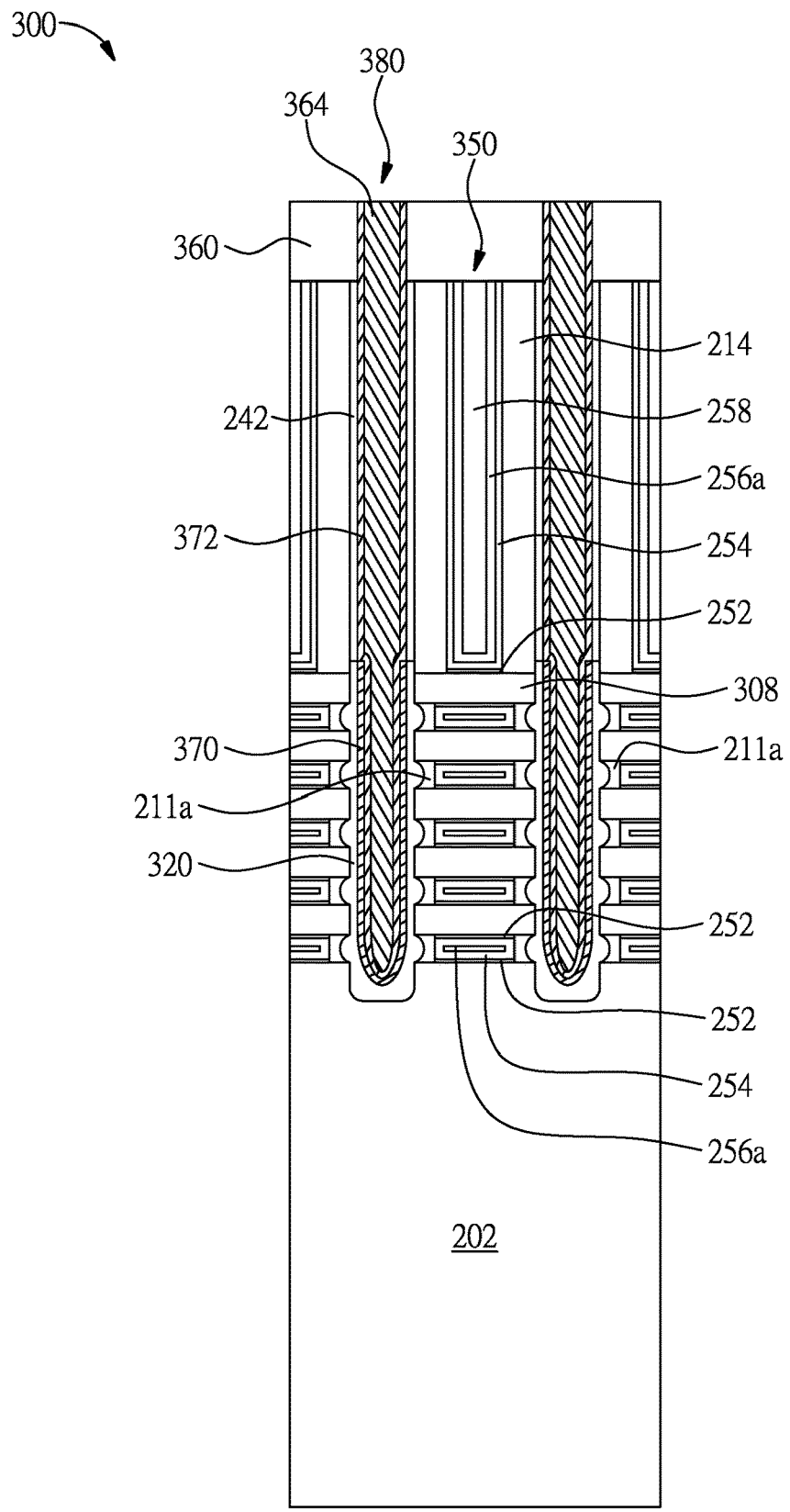

Next, metal silicide layers 370 are formed on the trenches 363, as shown in FIGS. 18K and 19K in accordance with some embodiments. The materials and processes for forming the metal silicide layer 370 may be similar to, or the same as, those for forming the first metal silicide layer 270a described above and are not repeated herein.

In some embodiments, the metal silicide layers 370 are formed on the surface of the source/drain structures 320 exposed by the trenches 363, and a bottom portion of the metal silicide layer 370 is lower than the bottommost nanostructures 308, and a top portion of the metal silicide layer 370 is higher than the topmost nanostructures 308. In some embodiments, the bottom portion of the metal silicide layer 370 is lower than the bottom surface of the gate structures 350, and a top portion of the metal silicide layer 370 is lower than a top surface of the gate structures 350.

After the metal silicide layers 370 are formed, contacts 380 are formed in the contact openings 362 and in the trenches 363 over the metal silicide layers 370, as shown in FIGS. 18K and 19K in accordance with some embodiments. In some embodiments, the contact 380 includes a glue layer 372 and a metal layer 364. The materials and processes for forming the glue layer 372 and the metal layer 364 may be similar to, or the same as, those for forming the glue layer 272 and the metal layer 264 described above and are not repeated herein.

Since the trench 363 is formed in the source/drain structure 320 before the contact 380 is formed, the contact 380 can extend into the source/drain structure 320 and be laterally next to, instead of much higher than, the nanostructures 308 in accordance with some embodiments. Accordingly, the parasitic resistance of the channels (i.e. the nanostructures 308), especially the lower channels close to the substrate 202, may be reduced, and the performance of the semiconductor structure 300 may therefore be improved.

In some embodiments, a bottom portion of the contact 380 is lower than the bottommost nanostructures 308, and a top portion of the contact 380 is higher than the topmost nanostructures 308. In addition, the bottom portion of the contact 380 is lower than the bottom surface of the gate structures 350, and a top portion of the contact 380 is higher than a top surface of the gate structures 350 in accordance with some embodiments.

Furthermore, the inner spacers 211a are formed between the neighboring nanostructures 308, so that the gate structures 350 are separated from the source/drain structures 320 by the inner spacers 211a, as shown in FIG. 19K in accordance with some embodiments. In some embodiments, some portions of the source/drain structures 320 are sandwiched between the contacts 380 and the nanostructures 308 and some portions of the source/drain structures 320 are sandwiched between the contacts 380 and inner spacers 211a.

Figure 20:
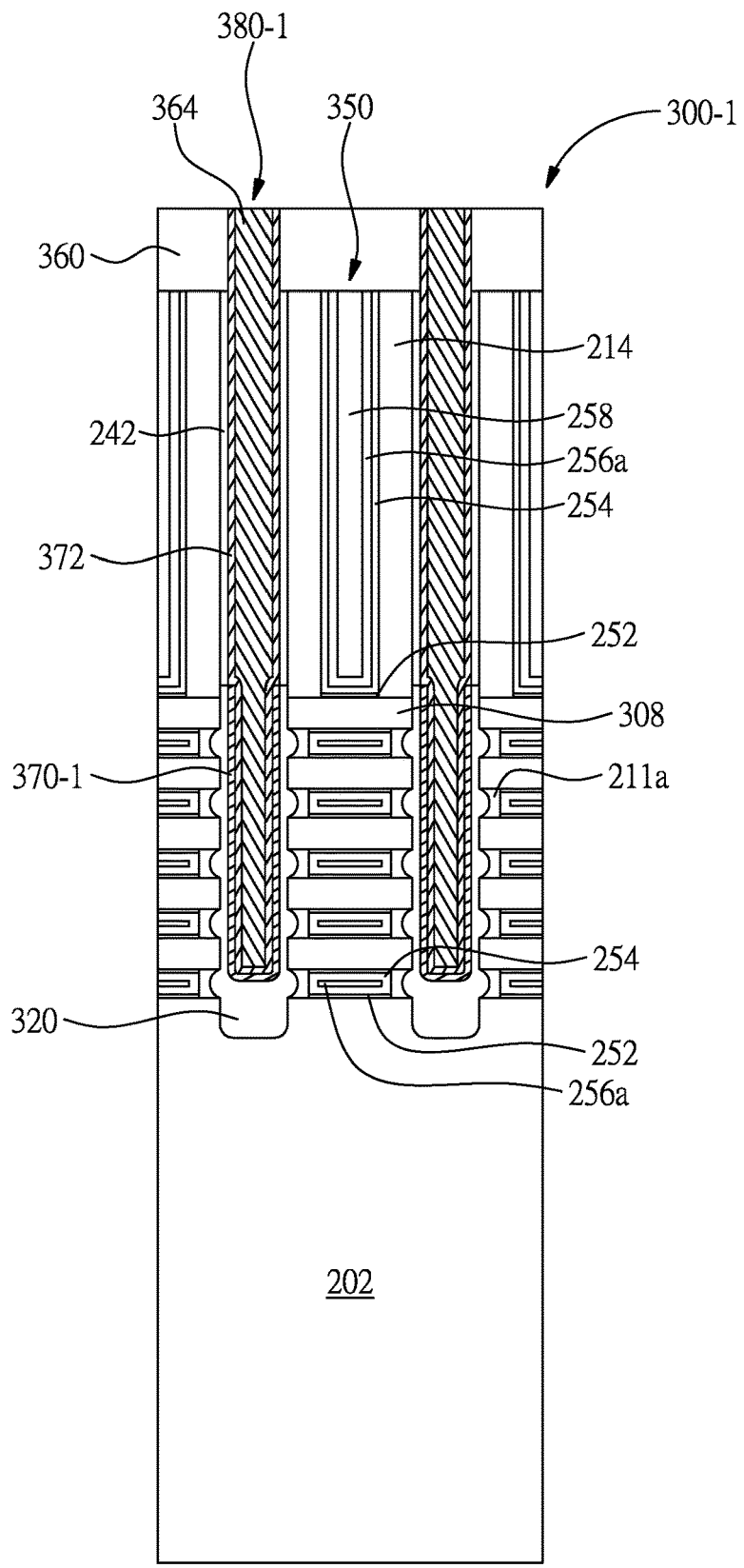
FIG. 20 illustrates a cross-sectional representation of a semiconductor structure in accordance with some embodiments.

FIG. 20 illustrates a cross-sectional representation of a semiconductor structure 300-1 in accordance with some embodiments. The semiconductor structure 300-1 is similar to the semiconductor structure 300 described above, except a bottom portion of the contact in the semiconductor structure 300-1 does not extend into the substrate 202 in accordance with some embodiments. Processes and materials for forming the semiconductor structure 300-1 are substantially similar to, or the same as, those for forming the semiconductor structure 300 and are not repeated herein.

More specifically, after the processes shown in FIGS. 18A-18I and 19A-19I are performed, a trench is formed in the source/drain structure 320 and a metal silicide layer 370-1 and a contact 380-1 are formed in the trench, as shown in FIG. 20 in accordance with some embodiments. In addition, the trench formed in the source/drain structure 320 does not extend into the substrate 202, and therefore the bottommost portion of a metal silicide layer 370-1 and the bottommost portion of the contact 380-1 are both higher than the top surface of the substrate 202 in accordance with some embodiments.

In some embodiments, the bottommost portion of the metal silicide layer 370-1 is lower than the bottommost nanostructures 308 but is higher than the bottommost portion of the gate structure 350. In some embodiments, the topmost portion of the metal silicide layer 370-1 is higher than the topmost nanostructures 308 but is lower than the topmost portion of the gate structure 350. In some embodiments, the topmost portion of the contact 380-1 is higher than both the topmost nanostructures 308 and the top surface of the gate structure 350.

Although the contact 380-1 does not extend into the substrate 202, the contact 380-1 still extends into the source/drain structure 320 and therefore is also laterally next to the nanostructures 308 in accordance with some embodiments. Accordingly, the parasitic resistance of the channels may be reduced, and the performance of the semiconductor structure 300-1 may be improved.

Figure 21A:
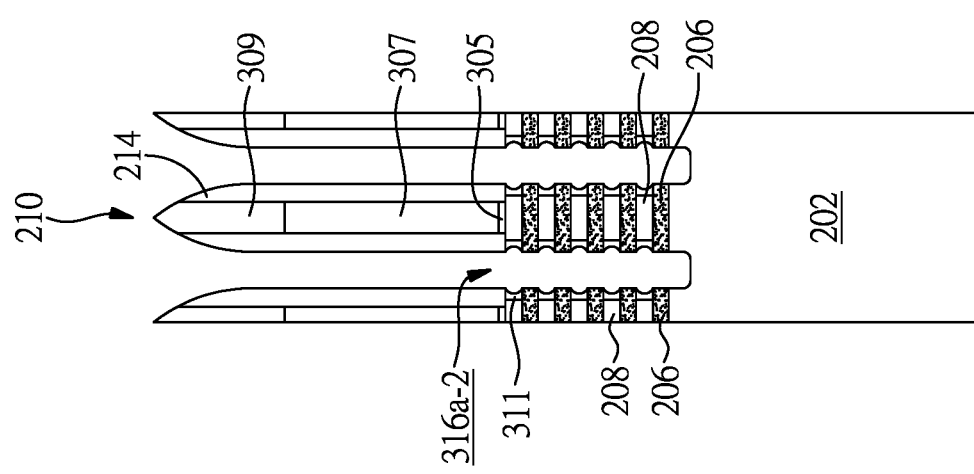
FIGS. 21A and 21B illustrate cross-sectional representation of various stages for forming a semiconductor structure in accordance with some embodiments.
Figure 21B:
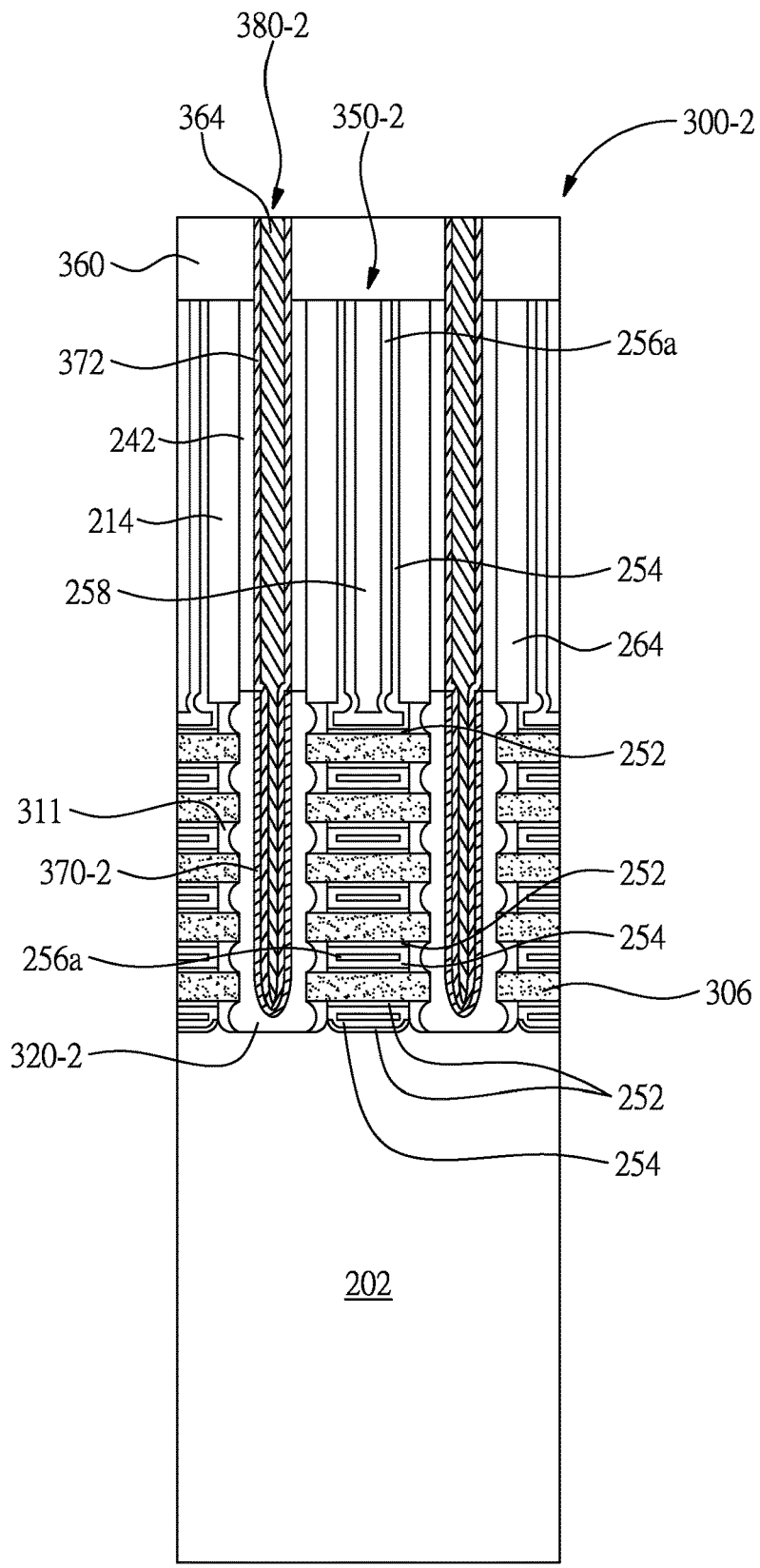

FIGS. 21A and 21B illustrate cross-sectional representation of various stages for forming a semiconductor structure 300-2 in accordance with some embodiments. The semiconductor structure 300-2 is similar to the semiconductor structure 300 described above, except nanostructures are formed from the semiconductor layers 206 instead of the semiconductor layers 208 in accordance with some embodiments. Processes and materials for forming the semiconductor structure 300-2 are substantially similar to, or the same as, those for forming the semiconductor structure 300 and are not repeated herein.

More specifically, the processes shown in FIGS. 18A, 18B, 19A, and 19B are performed, and recesses 316-2 are formed through the fin structure and inner spacers 311 are formed between the semiconductor layers 206, as shown in FIG. 21A in accordance with some embodiments. Similar to the inner spacers 211a, the inner spacers 311 may be formed by recessing the semiconductor layers 208 to form notches (similar to the notches 317) and forming the inner spacers 311 in the notches. The materials for forming the inner spacers 311 are similar to, or the same as, those for forming the inner spacers 211a described above and are not repeated herein.

Afterwards, the processes shown in FIGS. 18E to 18G and 19E to 19G may be performed. More specifically, source/drain structures 320-2 are formed and the semiconductor layers 208 in the channel region are removed to form nanostructures 306 from the semiconductor layers 206, as shown in FIG. 21B in accordance with some embodiments. Next, gate structures 350-2 are formed over the nanostructures 306 and wrapped around the nanostructures 306 in accordance with some embodiments. Similar to the gate structure 350, the gate structure 350-2 includes the interfacial layer 252, the gate dielectric layer 254, the first gate conductive layer 256a, and the gap-filling metal layer 258 in accordance with some embodiments. In some embodiments, some portions of the gate structures 350-2 extend under the spacers 214 and therefore are overlapped with the spacers 214. In some embodiments, the width of the portion of the gate structure 350-2 wrapped around the nanostructure 306 is greater than the width of the portion of the gate structure 350-2 between the spacers 214. In some embodiments, the bottom surface of the gate structure 350-2 is substantially level with the bottommost portion of the source/drain structure 320-2.

After the gate structures 350-2 are formed, processes shown in FIGS. 18I-18K and 19I-19K may be performed to form the semiconductor structure 300-2. More specifically, the dielectric layer 360 is formed over the gate structures 350-2, and metal silicide layers 370-2 and contacts 380-2 are formed extending into source/drain structures 320-2, as shown in FIG. 21B in accordance with some embodiments.

The contacts 380-2 are similar to the contact 380 and include the glue layer 372 and the metal layer 364 in accordance with some embodiments. In some embodiments, the bottommost portion of the contact 380-2 is higher than a bottom surface of the gate structure 350-2. In some embodiments, the bottommost portion of the contact 380-2 is higher than the bottommost nanostructures 306.

As described previously, since the contact 380-2 extends into the source/drain structure 320 and is also laterally next to the nanostructures 306 in accordance with some embodiments, the parasitic resistance of the channels may be reduced, and the performance of the semiconductor structure 300-2 may be improved.

FIGS. 22A to 22I illustrate perspective views of intermediate stages of manufacturing a semiconductor structure 400 in accordance with some embodiments. FIGS. 23A to 23I are cross-sectional views taken along line II-II' of FIGS. 22A to 22I respectively in accordance with some embodiments. Processes and materials for forming the semiconductor structure 400 may be similar to, or the same as, those for forming the multi-gate semiconductor devices 200 and 200' and the semiconductor structures 300, 300-1, and 300-2 described above and are not repeated herein.

Figure 22A:
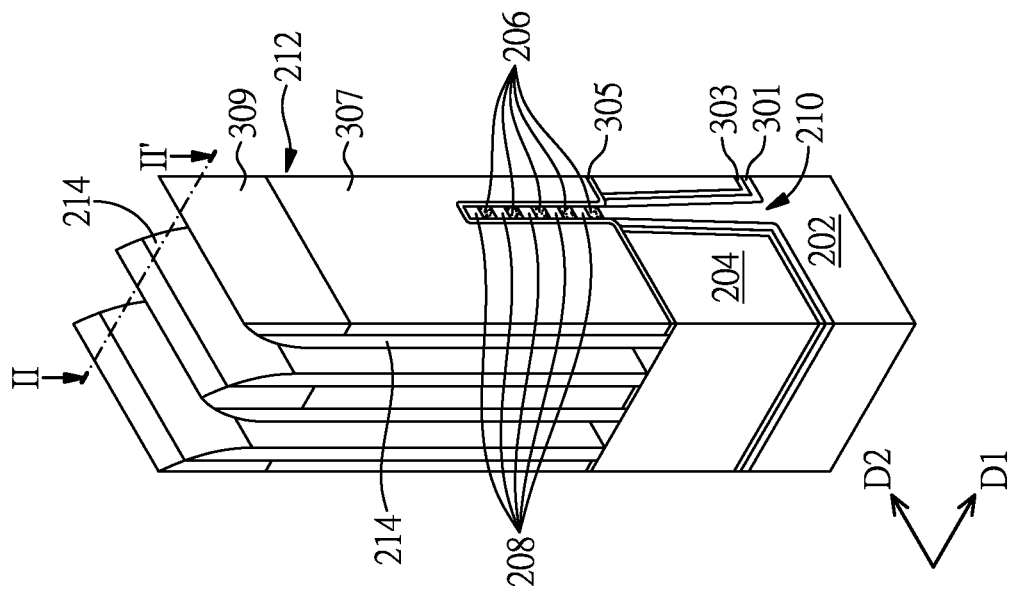
Figure 22B:
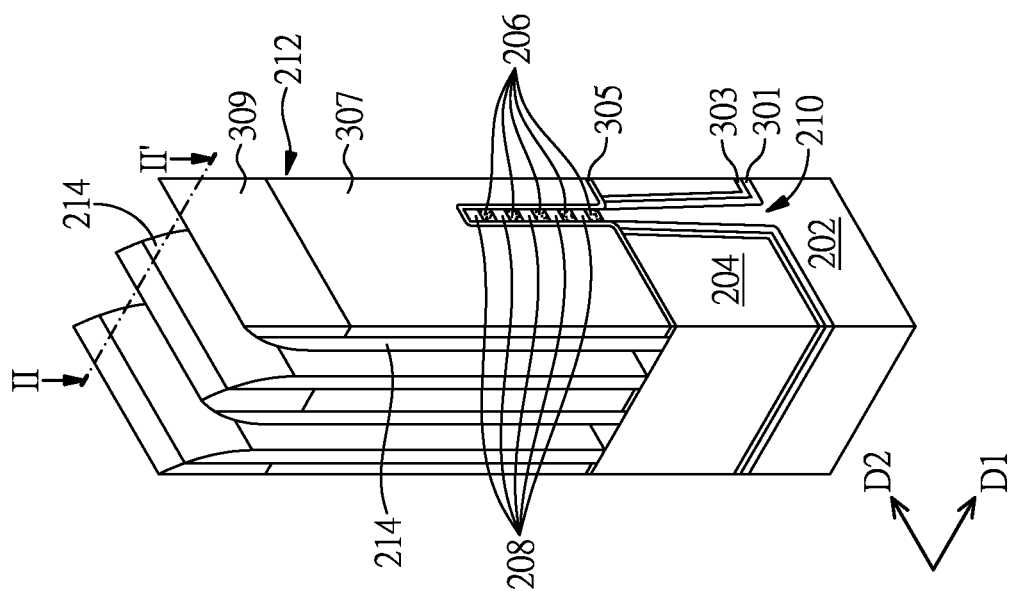

Similar to FIGS. 19A and 19B, the fin structure 210 is formed over the substrate 202 from the alternately stacked semiconductor layers 206 and 208, the isolation feature 204 is formed around the fin structure 210, and the dummy gate structures 212 are formed across the fin structure 210, as shown in FIGS. 22A and 23A in accordance with some embodiments. After the dummy gate structures 212 are formed, portions of the semiconductor layers 206 of the fin structure 210 not covered by the dummy gate structures 212 and the spacers 214 are removed to form gaps 416 between nanostructures 408 formed from the semiconductor layers 208, as shown in FIGS. 22B and 23B in accordance with some embodiments. After the gaps 416 are formed, the semiconductor layers 206 are laterally etched from the gaps 416 to form notches 417 under the spacers 214, as shown in FIGS. 22B and 23B in accordance with some embodiments.

Afterwards, the inner spacers 411 are formed in the notches 417 between the nanostructures 408, as shown in FIGS. 22C and 23C in accordance with some embodiments. Processes and materials for forming the inner spacers 411 may be similar to, or the same as, those for forming the inner spacers 211a described previously and are not repeated herein.

Next, an implantation process 413 is performed to form doped source/drain regions 420 in the nanostructures 308, as shown in FIGS. 22D and 23D in accordance with some embodiments. In some embodiments, dopants are implanted into the nanostructures 408 not covered by the dummy gate structures 212 and the spacers 214 and are driven under the spacers 214 by performing a diffusion process, so that the doped source/drain regions 420 are partially overlapped the spacers 214 and the inner spacers 411. In some embodiments, the dopants are p-type dopants, such as boron or $BF_2$. In some embodiments, the dopants are n-type dopants, such as phosphorus or arsenic. In some embodiments, the dopants are further implanted in the substrate 202 during the implantation process 413, so that addition doped regions 421 are formed in the substrate 202, as shown in FIG. 23D. Since the source/drain regions 420 and the doped regions 421 in the substrate 202 are both formed by the same implantation process 413, the dopants in the source/drain regions 420 and in the doped regions 421 are the same in accordance with some embodiments.

After the source/drain regions 420 are formed, an inter-layer dielectric (ILD) layer 444 is formed, as shown in FIGS. 22E and 23E in accordance with some embodiments. Processes and materials for forming the inter-layer dielectric layer 444 may be similar to, or the same as, those for forming the inter-layer dielectric layer 244 described previously and are not repeated herein. More specifically, the gaps 416 between the source/drain regions 421 of the nanostructures 308 are fully filled with the inter-layer dielectric layer 444, so that the source/drain regions 421 of the nanostructures 308 are surrounded by the inter-layer dielectric layer 444, as shown in FIG. 23E in accordance with some embodiments. That is, some portions of the ILD layers 444 extend under the source/drain regions 421 and are in direct contact with the inner spacers 411 and the doped regions 421 in accordance with some embodiments.

Figures 22F, 22G, 22H:
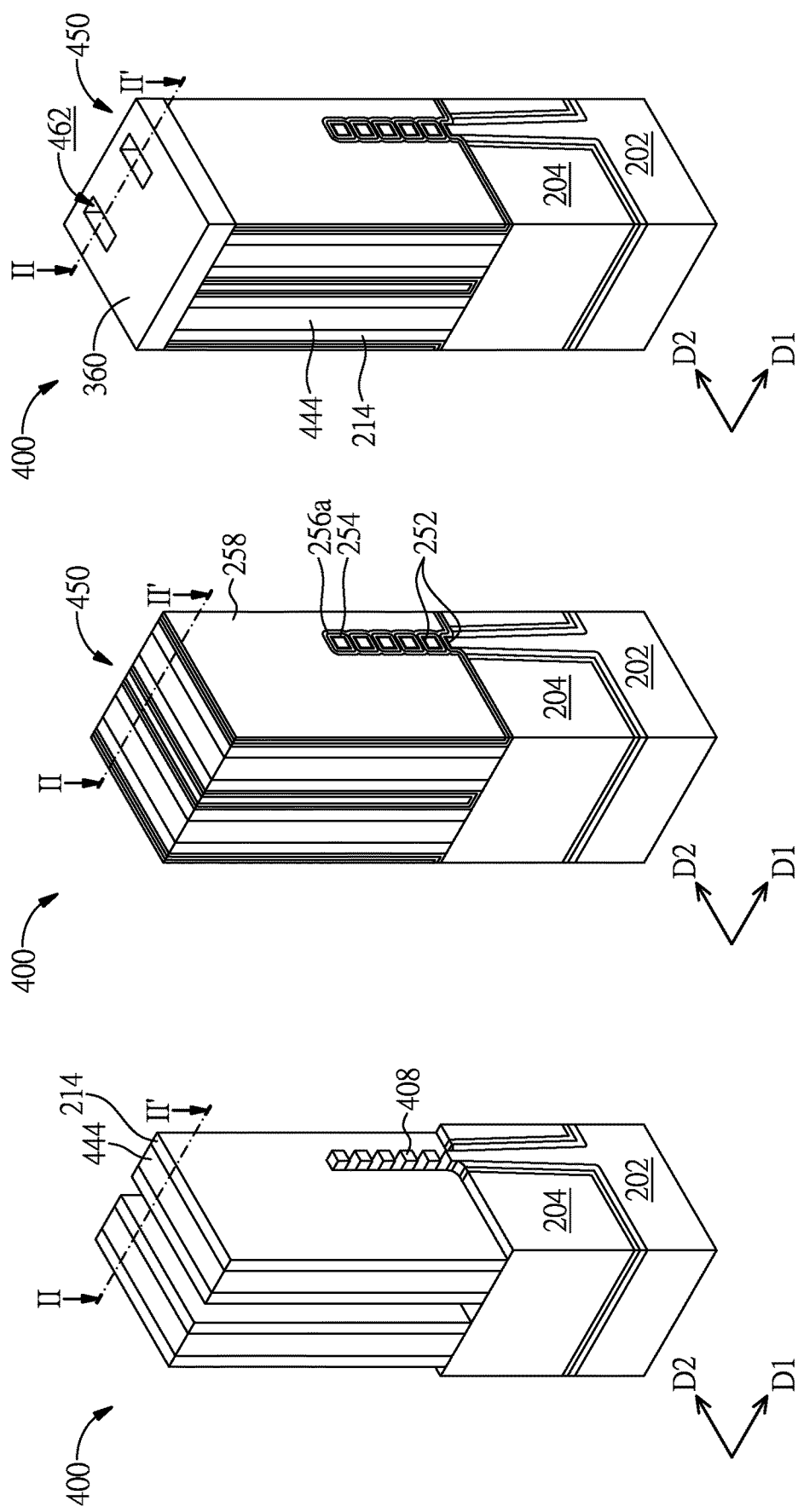

Next, the dummy gate structures 212 are removed to expose the semiconductor layers 206 and 208 of the channel region of the fin structure 210, and the semiconductor layers 206 of the fin structure 210 in the channel region are then removed to form the nanostructures 408 from the semiconductor layers 208, as shown in FIGS. 22F and 23F in accordance with some embodiments.

Afterwards, gate structures 450 are formed over the nanostructures 408 and wrapped around the nanostructures 408, as shown in FIGS. 22G and 23G in accordance with some embodiments. Similar to the first gate structure 350, the gate structure 450 includes an interfacial layer 252, a gate dielectric layer 254, a first gate conductive layer 256a, and a gap-filling metal layer 258 in accordance with some embodiments.

After the gate structures 450 are formed, the dielectric layer 360 is formed over the inter-layer dielectric layer 444, and contact openings 462 are formed through the dielectric layer 360 and the inter-layer dielectric layer 444, as shown in FIGS. 22H and 23H in accordance with some embodiments. More specifically, a mask (not shown) with openings may be formed over the dielectric layer 360, and the dielectric layer 360 and the inter-layer dielectric layer 444 under the openings may be etched to form the contact openings 462 through the dielectric layer 360 and the inter-layer dielectric layer 244. Furthermore, the portions of the inter-layer dielectric layer 444 sandwiched between the source/drain regions 420 of the nanostructures 408 under the opening are also removed to form gaps 463 between the source/drain regions 420, as shown in FIG. 23H in accordance with some embodiments. Accordingly, the source/drain regions 420 of nanostructures 408 are exposed by the contact openings 462 in accordance with some embodiments.

Figure 23I:
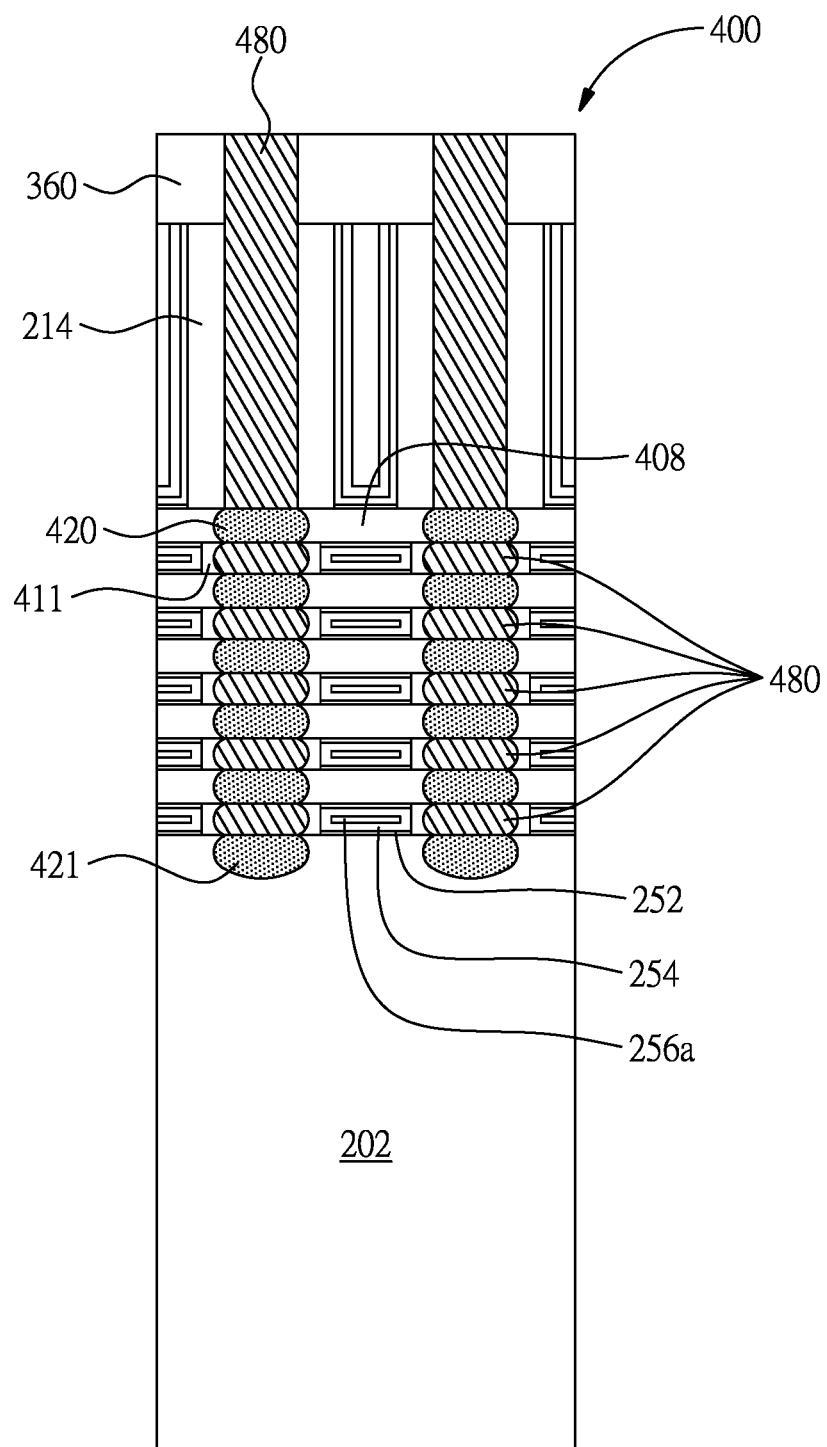

Next, contacts 480 are formed in the contact openings 462 and in the gaps 463, as shown in FIGS. 22I and 23I in accordance with some embodiments. The materials and processes for forming the contacts 480 may be similar to, or the same as, those for forming the metal layer 264 described above and are not repeated herein.

Since the contact 480 in the semiconductor structure 400 is formed in the contact opening 462 and in the gaps 463, a bottom portion of the contact 480 is lower than the bottom-most nanostructures 408, and a top portion of the contact 480 is higher than the topmost nanostructures 408 in accordance with some embodiments. In addition, the bottom portion of the contact 480 is substantially level with the bottom surface of the gate structures 450, and a top portion of the contact 480 is higher than a top surface of the gate structures 450 in accordance with some embodiments.

In addition, the inner spacers 411 are formed between the neighboring the source/drain regions 420 of the nanostructures 408, so that the gate structures 450 are separated from the contacts 480 by the inner spacers 411, as shown in FIG. 23I in accordance with some embodiments. In some embodiments, the contacts 480 are in direct contact with the inner spacers 411. Furthermore, some portions of the contacts 480 are sandwiched between the source/drain regions 420 of the nanostructures 408 and the doped regions 421 of the substrate 202.

Similarly, since the contact 480 extends between the nanostructures 408, the distances between the nanostructures 408 and the contact 480 are reduced, such as compared to the contact which is formed above the source/drain structure, which is higher than the top portion of the entire nanostructure, in accordance with some embodiments. Accordingly, the parasitic resistance of the channels may be reduced, and the performance of the semiconductor structure 400 may be improved.

Figure 24:
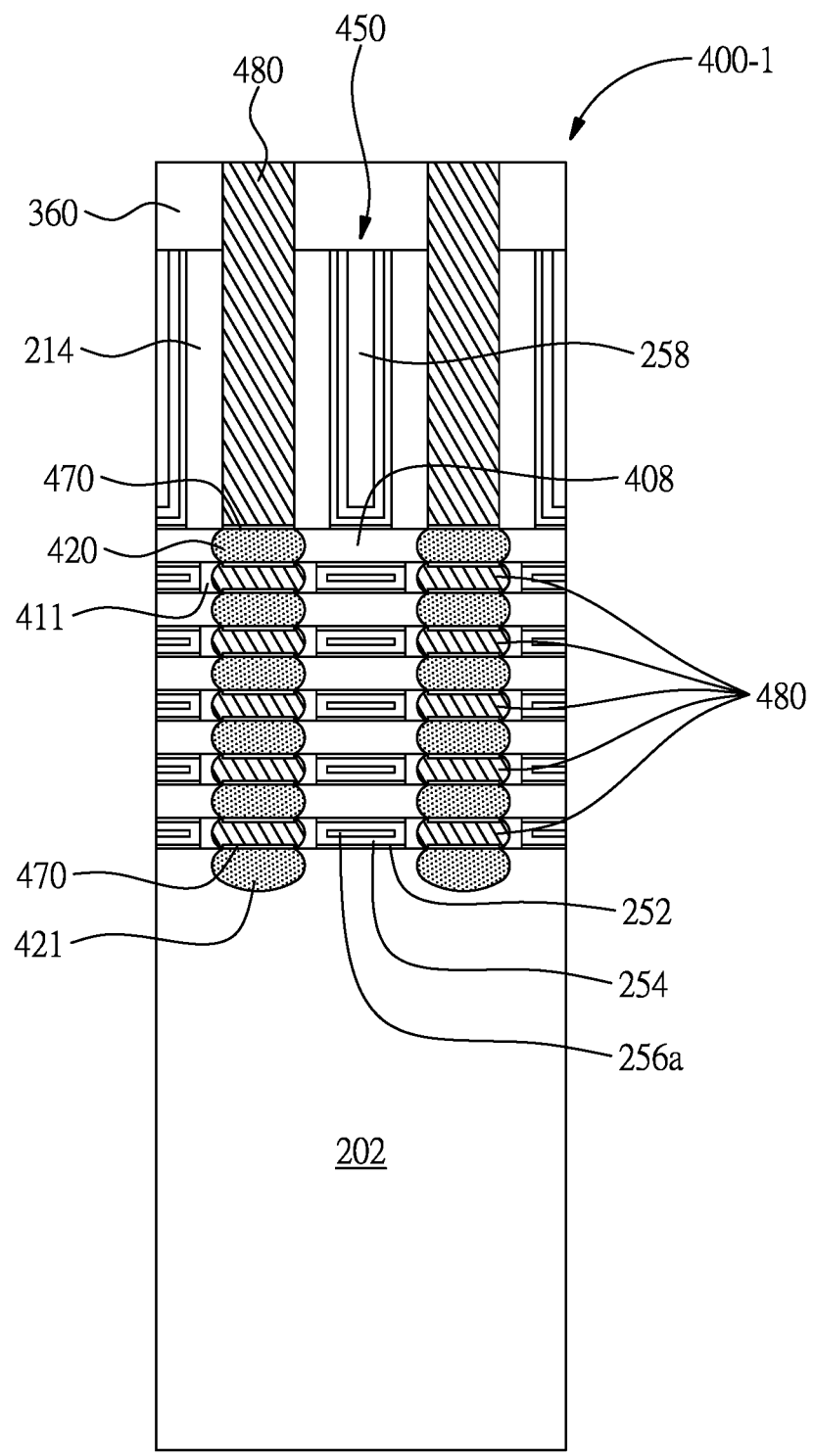
FIG. 24 illustrates a cross-sectional representation of a semiconductor structure in accordance with some embodiments.

FIG. 24 illustrates a cross-sectional representation of a semiconductor structure 400-1 in accordance with some embodiments. The semiconductor structure 400-1 is similar to the semiconductor structure 400 described above, except metal silicide layers 470 are formed before the formation of the contacts 480 in accordance with some embodiments. Processes and materials for forming the semiconductor structure 400-1 are substantially similar to, or the same as, those for forming the semiconductor structure 400 and are not repeated herein.

More specifically, after the processes shown in FIGS. 22A-22H and 23A-23H are performed, the metal silicide layers 470 are formed around the source/drain regions 470 of the nanostructures 408, as shown in FIG. 24 in accordance with some embodiments. In addition, the metal silicide layers 470 cover the top surface of the doped region 421 of the substrate 202 in accordance with some embodiments. Processes and materials for forming the metal silicide layers 470 are substantially similar to, or the same as, those for forming the metal silicide layers 370 and are not repeated herein.

In some embodiments, the bottommost portion of the metal silicide layer 470 is lower than the bottommost nanostructures 408 and is substantially level with the bottommost portion of the gate structure 450. In some embodiments, the topmost portion of the metal silicide layer 470 is higher than the topmost nanostructures 408 but is lower than the topmost portion of the gate structure 450. In some embodiments, a portion of the contact 480 extends into a space surrounded by the inner spacers 411 and the metal silicide layers 470.

Figure 25:
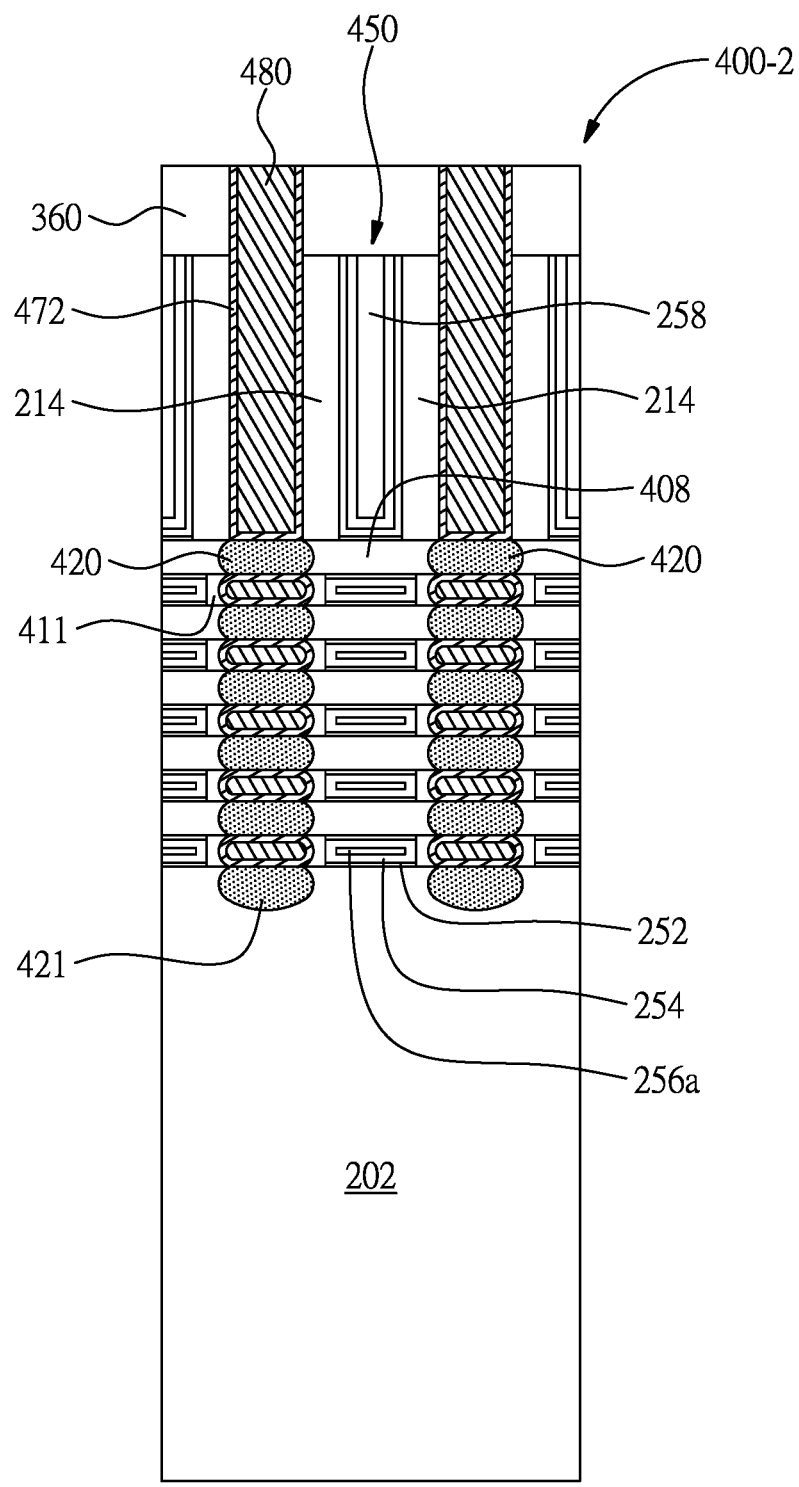
FIG. 25 illustrates a cross-sectional representation of a semiconductor structure in accordance with some embodiments.

FIG. 25 illustrates a cross-sectional representation of a semiconductor structure 400-2 in accordance with some embodiments. The semiconductor structure 400-2 is similar to the semiconductor structure 400 described above, except glue layers 472 are formed before the formation of the contacts 480 in accordance with some embodiments. Processes and materials for forming the semiconductor structure 400-2 are substantially similar to, or the same as, those for forming the semiconductor structure 400 and are not repeated herein.

More specifically, after the processes shown in FIGS. 22A-22H and 23A-23H are performed, the glue layers 472 are formed around the source/drain regions 470 of the nanostructures 408, as shown in FIG. 25 in accordance with some embodiments. In addition, the glue layers 472 cover the top surface of the doped region 421 of the substrate 202 and the sidewalls of the inner spacers 411 in accordance with some embodiments. Processes and materials for forming the glue layers 472 are substantially similar to, or the same as, those for forming the glue layers 372 and are not repeated herein.

In some embodiments, the bottommost portion of the glue layer 472 is lower than the bottommost nanostructures 408 and is substantially level with the bottommost portion of the gate structure 450. In some embodiments, the topmost portion of the glue layer 472 is higher than the topmost nanostructures 408 but is lower than the topmost portion of the gate structure 450. In some embodiments, a portion of the glue layer 472 is sandwiched between the inner spacers 411 and the contacts 480.

Figure 26A:
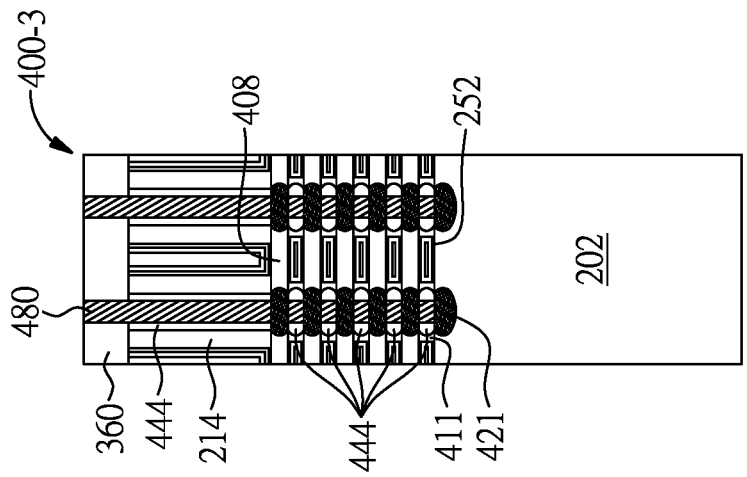
FIGS. 26A and 26B illustrate cross-sectional representations of intermediate stages of manufacturing a semiconductor structure in accordance with some embodiments.
Figure 26B:
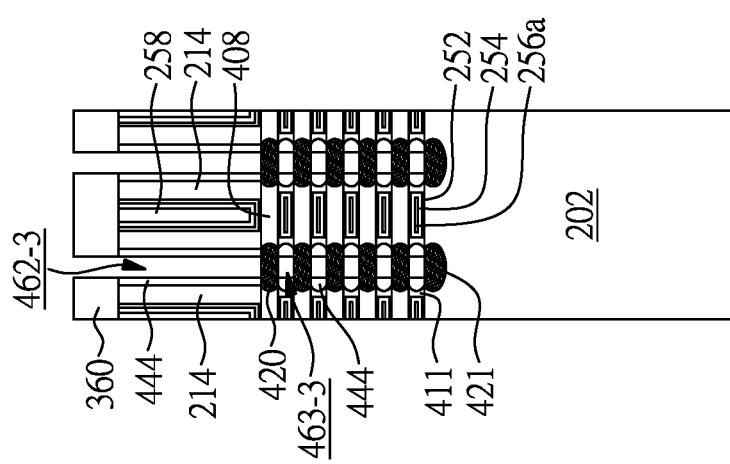

FIGS. 26A and 26B illustrate cross-sectional representations of intermediate stages of manufacturing a semiconductor structure 400-3 in accordance with some embodiments. The semiconductor structure 400-3 is similar to the semiconductor structure 400 described above, except some portions of the inter-layer dielectric layer 444 over the source/drain regions 420 are not removed in accordance with some embodiments. Processes and materials for forming the semiconductor structure 400-3 are substantially similar to, or the same as, those for forming the semiconductor structure 400 and are not repeated herein.

More specifically, after the processes shown in FIGS. 22A-22G and 23A-23G are performed, contact openings 462-3 and gaps 463-3 are formed through the dielectric layer 360 and the inter-layer dielectric layer 444, as shown in FIG. 26A in accordance with some embodiments. Similar to those shown in FIG. 23F and described previously, a mask (not shown) with openings may be formed over the dielectric layer 360, and the dielectric layer 360 and the inter-layer dielectric layer 444 under the openings may be etched to form the contact openings 462-3 and the gaps 463-3. However, opening of the mask used for forming the semiconductor structure 400-3 may be relatively narrow and therefore the portions of the inter-layer dielectric layer 444 sandwiched between the source/drain regions 420 are only partially removed, such that some portions of the inter-layer dielectric layer 444 remain on the sidewalls of the spacers 214 and the inner spacers 411, as shown in FIG. 26A in accordance with some embodiments.

After the contact openings 462-3 and the gaps 463-3 are formed, the contacts 480 are formed in the contact openings 462-3 and gaps 463-3 with some portions of the inter-layer dielectric layer 444 sandwiched between the contact 480 and the inner spacers 411, as shown in FIG. 26B in accordance with some embodiments. In some embodiments, the source/drain regions 420 of the nanostructures 408 are partially surrounded by the inter-layer dielectric layer 444.

Figure 27:
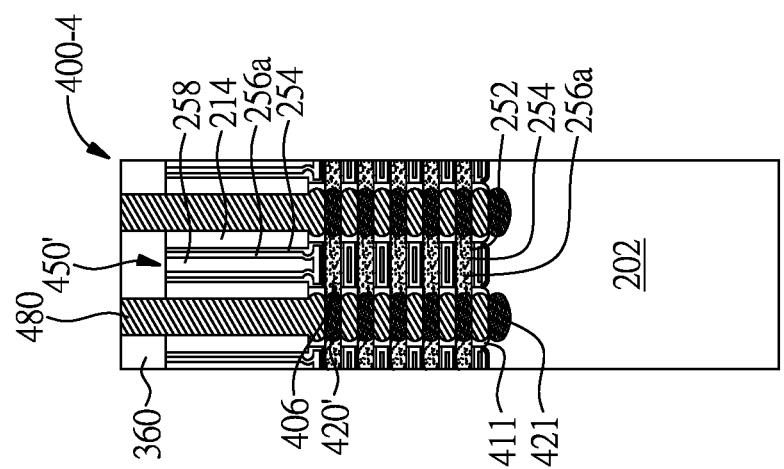
FIG. 27 illustrates a cross-sectional representation of semiconductor structures in accordance with some embodiments.

FIG. 27 illustrates a cross-sectional representation of a semiconductor structure 400-4 in accordance with some embodiments. The semiconductor structure 400-4 is similar to the semiconductor structure 400 described above, except nanostructures are formed from the semiconductor layers 206 instead of the semiconductor layers 208 in accordance with some embodiments. Processes and materials for forming the semiconductor structure 400-4 are substantially similar to, or the same as, those for forming the semiconductor structure 400 and are not repeated herein.

More specifically, the processes similar to those shown in FIGS. 22A-22I and 23A-23I may be performed, except the semiconductor layers 208 are removed while the semiconductor layers 206 are not removed in the processes shown in FIGS. 23B and 23F. Accordingly, nanostructures 406 are formed from the semiconductor layers 206 and are wrapping by the gate structure 450'. In addition, source/drain regions 420' are formed in the nanostructures 406 and are surrounded by the contacts 480-4 in accordance with some embodiments. Processes and materials for forming the gate structure 450' and the source/drain regions 420' are substantially similar to, or the same as, those for forming the gate structure 350-2 and the source/drain regions 420, respectively, and are not repeated herein.

Figure 28:
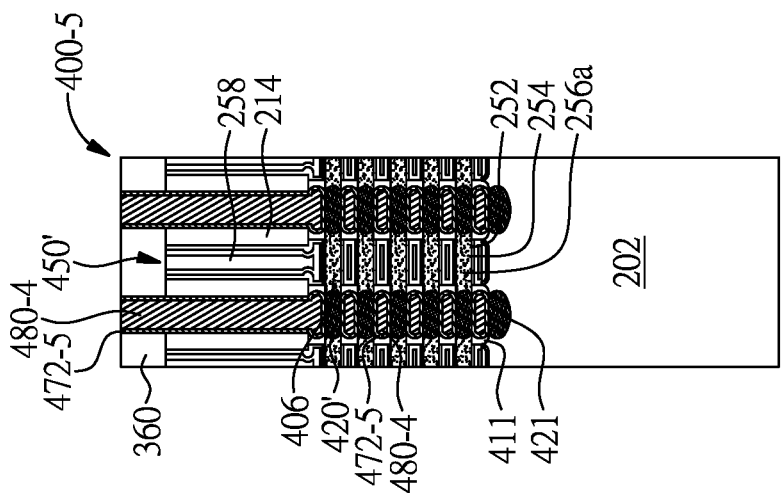
FIG. 28 illustrates a cross-sectional representation of a semiconductor structure in accordance with some embodiments.

FIG. 28 illustrates a cross-sectional representation of a semiconductor structure 400-5 in accordance with some embodiments. The semiconductor structure 400-5 is similar to the semiconductor structure 400-4 described above, except glue layers 472-5 are formed before the formation of the contacts 480-5 in accordance with some embodiments. Processes and materials for forming the semiconductor structure 400-5 are substantially similar to, or the same as, those for forming the semiconductor structure 400-4 and are not repeated herein. In addition, processes and materials for forming the glue layers 472-5 are substantially similar to, or the same as, those for forming the glue layers 472 and are not repeated herein.

The semiconductor structures 300, 300-1, 300-2, 400, and 400-1 to 400-5 described above may be used in a PMOS device or in an NMOS device. In some embodiments, a semiconductor device includes at least one PMOS device and at least NMOS device having the structures described above.

Figure 29:
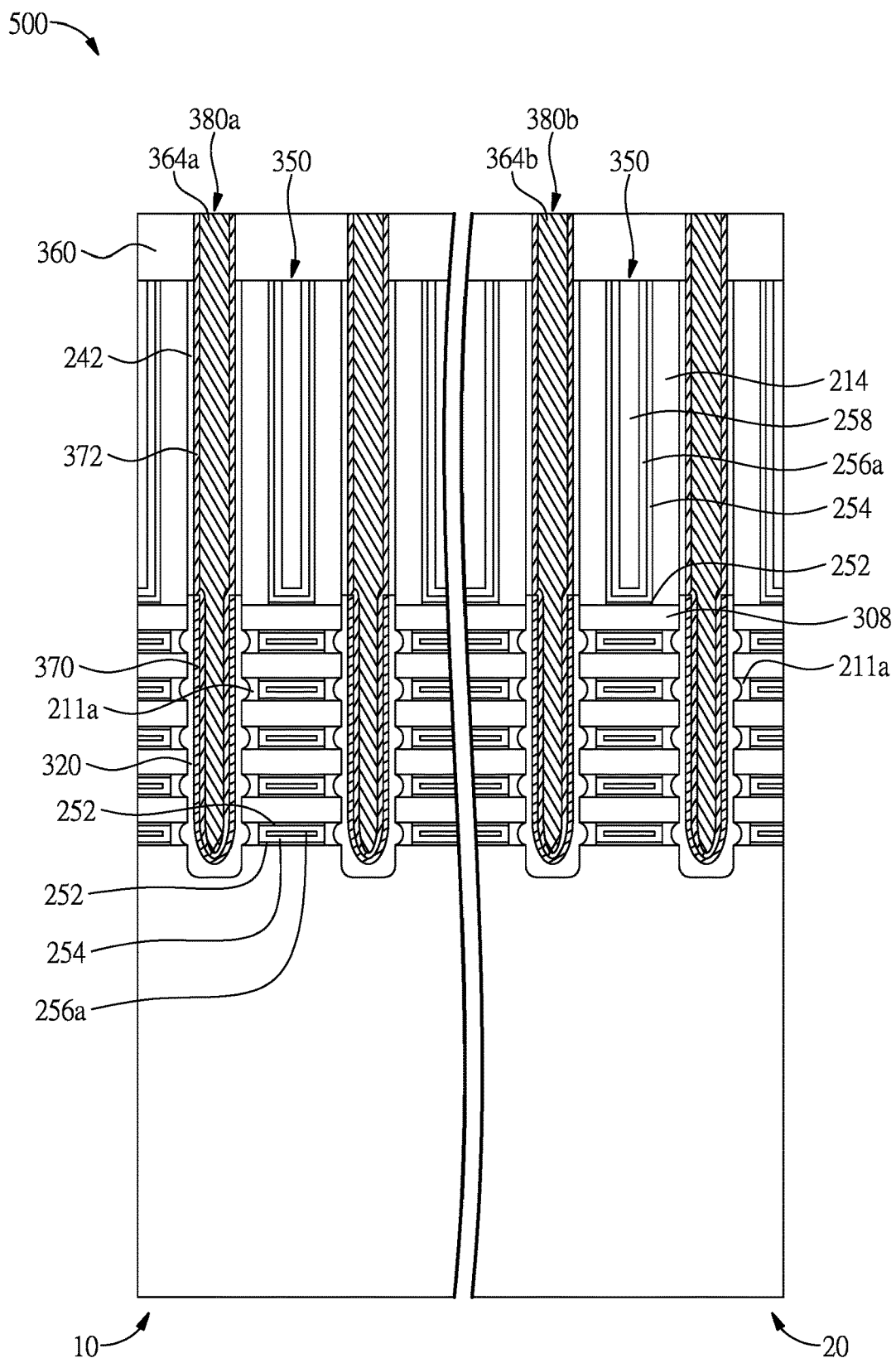
FIG. 29 illustrates a cross-sectional representation of a semiconductor structure in accordance with some embodiments.

FIG. 29 illustrates a cross-sectional representation of a semiconductor structure 500 in accordance with some embodiments. In some embodiments, the semiconductor structure 500 includes an NMOS region 10 and a PMOS region 20, and the structure shown in the NMOS region 10 and the PMOS region 20 are substantially the same as the semiconductor structure 300 shown in FIG. 19K, except the physical properties of the materials in contacts 380a in the NMOS region 10 and contacts 380b in the PMOS region 20 are different.

More specifically, the contact 380a in the NMOS region 10 includes a glue layer 372 and a metal layer 364a, and the contact 380b in the PMOS region 20 includes the glue layer 372 and a metal layer 364b in accordance with some embodiments. The metal layer 364a and the metal layer 364b may exert different stresses on the semiconductor structure 500. In some embodiments, the metal layer 364a is made of a first material having tensile stress and the metal layer 364b is made of a second material having compressive stress. Since the contacts 380a and 380b can provide additional tensile stress and the compressive stress to the channels in the NMOS region 10 and the PMOS region 20, the performance of the semiconductor structure 500 may be improved.

In some embodiments, the metal layer 364a and the metal layer 364b are made of the same metal element, such as tungsten, but include different dopants. In some embodiments, the metal layer 364a and the metal layer 364b are made of the same metal element but are formed under different deposition conditions (e.g. various temperatures and pressures).

In some embodiments, an additional nucleation and/or adhesive layer is formed before forming the metal layer 364a and the metal layer 364b, so that the metal materials deposited thereon have different stresses. In some embodiments, the additional nucleation and/or adhesive layer is made of WN, WC, WCN, WSiN, or the like.

In some embodiments, the metal layer 364a is made of tungsten with a tensile stress and is formed by performing a chemical vapor deposition (CVD) process including using a tungsten-containing precursor (e.g. WF6) and reducing gases (e.g. $H_2$) at temperature in a range from about 250° C. to about 400° C. In some embodiments, the CVD process further comprising using HF.

Although the structures shown in the NMOS region 10 and the PMOS region 20 of the semiconductor structure 500 are substantially the same as the semiconductor structure 300 shown in FIG. 19K, the concept of the disclosure is not intended to be limiting. That is, the NMOS region may include any one of the semiconductor structures described above (e.g. the semiconductor structures 300, 300-1, 300-2, 400, and 400-1 to 400-5), and the PMOS region may include any one of the semiconductor structures described above (e.g. the semiconductor structures 300, 300-1, 300-2, 400, and 400-1 to 400-5). In addition, other than the stress provided by the contacts are different, the semiconductor structures of the PMOS region and the NMOS region may be different or substantially the same. For example, the semiconductor structure may include a NMOS region having a structure the same as that shown in FIG. 20 and a PMOS region having a structure the same as that shown in FIG. 25.

In a gate-all-around (GAA) transistor structure, a numbers of nanostructures may be formed over a substrate and are surrounded by a gate structure. The nanostructures may be used as channel regions, and source/drain structures may be formed at opposite sides of the channel regions and contacts may be formed over the source/drain structures. The lower nanostructures closer to the substrate may have relatively larger parasitic resistance and lower drive current due to the longer current paths from the channels to the contacts and current crowding.

In some embodiments of the present application, contacts (e.g. the contacts 280a, 380, 380-1, 380-2, 480, 480-4, 480-5, 380a, and 380b) are formed extending to a lower portion of the semiconductor structure (e.g. closer to, or extending into, the top surface of the substrate 202), so that the current paths from the lower channels to the contacts can be shorten. Accordingly, the parasitic resistance may be reduced and the drive current may be improved. In addition, since the contacts extends into, or between, the source/drain structures/regions, the contact areas between the contacts and the source/drain structures/regions are therefore increased, and the resistance of the semiconductor structures may be reduced.

Furthermore, the contacts formed in the NMOS region and PMOS region may be made of materials providing different stresses. In some embodiments, the contacts (e.g. the contacts 380a and 380b) can provide additional tensile stress and the compressive stress to the channels in the NMOS region and the PMOS region, and therefore the performance of the semiconductor structure 500 may be improved.

Embodiments for forming semiconductor structures are provided. The semiconductor may include nanostructures formed over a substrate and a gate structure wrapped around the nanostructures. In addition, a source/drain structure may be formed at one side of the nanostructure, and a contact formed over the source/drain structure. The contact may extend below a topmost surface of the source/drain structure, so that the current paths between the nanostructures and the contact may be reduced, and the performance of the semiconductor structure may be improved.

In some embodiments, a semiconductor structure is provided. The semiconductor structure includes a substrate and nanostructures formed over the substrate. In addition, the nanostructures includes channel regions and source/drain regions. The semiconductor structure further includes a gate structure vertically sandwiched the channel regions of the nanostructures and a contact wrapping around and vertically sandwiched between the source/drain regions of the nanostructures.

In some embodiments, a semiconductor structure is provided. The semiconductor structure includes a substrate and nanostructures formed over the substrate and vertically separated from each other. In addition, each of the nanostructures includes a first channel region and a source/drain region adjacent to the first channel region. The semiconductor structure further includes a gate structure wrapping around the first channel regions of the nanostructures and a contact formed over the source/drain regions of the nanostructures. The semiconductor structure further includes first inner spacers vertically sandwiched between the nanostructures and laterally separated the contact from the gate structure.

In some embodiments, a semiconductor structure is provided. The semiconductor structure includes a substrate and nanostructures longitudinally oriented along a first direction and vertically separated from each other. In addition, the nanostructures include channel regions and doped regions at opposite sides of the channel regions and a gate structure wrapping around the channel regions of the nanostructures. The semiconductor structure further includes a contact formed over the doped regions of the nanostructures and a gate spacer formed between the contact and the gate structure. In addition, the doped regions of the nanostructures partially extends under the gate spacer.

In some embodiments, a semiconductor structure is provided. The semiconductor structure includes a substrate and nanostructures formed over the substrate. The semiconductor structure further includes a gate structure surrounding the nanostructures and a source/drain structure attached to the nanostructures. The semiconductor structure further includes a contact formed over the source/drain structure and extending into the source/drain structure.

In some embodiments, a semiconductor structure is provided. The semiconductor structure includes a substrate and nanostructures formed over the substrate. The semiconductor structure further includes inner spacers sandwiched between the nanostructures and a source/drain structure adjacent to the inner spacers. The semiconductor structure further includes a contact formed in the source/drain structure and protruding from a top surface of the source/drain structure.

In some embodiments, a semiconductor structure is provided. The semiconductor structure includes a substrate and nanostructures formed over the substrate. In addition, the nanostructures include channel regions and source/drain regions. The semiconductor structure further includes a gate structure wrapping around the channel regions of the nanostructures and a contact wrapping around the source/drain regions of the nanostructures.

The gate all around (GAA) transistor structures described above may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   nanostructures formed over the substrate, wherein the nanostructures comprise channel regions and source/drain regions, and the channel regions comprise a first channel region and a second channel region;
   a gate structure vertically sandwiched the channel regions of the nanostructures, wherein a portion of the gate structure is vertically sandwiched between a bottom surface of the first channel region and a top surface of the second channel region; and
   a contact wrapping around and vertically sandwiched between the source/drain regions of the nanostructures.

2. The semiconductor structure as claimed in claim 1, further comprising:
   inner spacers formed between the nanostructures,
   wherein the inner spacers are sandwiched between the contact and the gate structure.

3. The semiconductor structure as claimed in claim 2, wherein the inner spacers are in contact with the contact.

4. The semiconductor structure as claimed in claim 1, wherein a bottom surface of the gate structure is substantially aligned with a bottom surface of the contact.

5. The semiconductor structure as claimed in claim 1, further comprising:
   silicide layers wrapping around the source/drain regions of the nanostructures.

6. The semiconductor structure as claimed in claim 1, further comprising:
   a doped region formed in the substrate under the source/drain regions of the nanostructures.

7. The semiconductor structure as claimed in claim 6, wherein the contact is in direct contact with the doped region in the substrate.

8. The semiconductor structure as claimed in claim 1, wherein a top surface of the contact is higher than a top surface of the gate structure.

9. A semiconductor structure, comprising:
   a substrate;
   nanostructures formed over the substrate and vertically separated from each other, wherein each of the nanostructures comprise:
      a first channel region; and
      a source/drain region adjacent to the first channel region;
   a gate structure wrapping around the first channel regions of the nanostructures;
   a contact formed over the source/drain regions of the nanostructures;
   first inner spacers vertically sandwiched between the nanostructures and laterally separated the contact from the gate structure; and
   a gate spacer formed over a topmost one of the nanostructures,
   wherein a top surface of the contact is higher than a top surface of the gate spacer.

10. The semiconductor structure as claimed in claim 9, wherein each of the nanostructures comprise:
    a second channel region,
    wherein the source/drain regions of the nanostructures are sandwiched between the second channel regions and the first channel regions of the nanostructures, and the nanostructures continuously extend from the first channel regions to the second channel regions.

11. The semiconductor structure as claimed in claim 10, further comprising:
    second inner spacers vertically sandwiched between the nanostructures,
    wherein the first inner spacers and the second inner spacers are in contact with opposite sides of the contact.

12. The semiconductor structure as claimed in claim 9, wherein the gate spacer vertically overlaps portions of the gate structure.

13. The semiconductor structure as claimed in claim 9, further comprising:
    a substrate source/drain region formed in the substrate, wherein the substrate source/drain region vertically overlaps the source/drain regions of the nanostructures.

14. The semiconductor structure as claimed in claim 13, wherein a portion of the contact is vertically sandwiched between the substrate source/drain region and the source/drain region of a bottommost one of the nanostructures.

15. A semiconductor structure, comprising:
    a substrate;
    nanostructures longitudinally oriented along a first direction and vertically separated from each other, wherein the nanostructures comprise channel regions and doped regions at opposite sides of the channel regions;
    a gate structure wrapping around the channel regions of the nanostructures;
    a contact formed over the doped regions of the nanostructures; and
    a gate spacer formed between the contact and the gate structure,
    wherein the doped regions of the nanostructures partially extend under and vertically overlaps the gate spacer.

16. The semiconductor structure as claimed in claim 15, wherein the contact has curved sidewall portions.

17. The semiconductor structure as claimed in claim 16, further comprising:
   inner spacers covering the curved sidewall portions of the contact.

18. The semiconductor structure as claimed in claim 15, further comprising:
   inner spacers vertically sandwiched between the nanostructures and laterally sandwiched between the contact and the gate structure.

19. The semiconductor structure as claimed in claim 18, wherein the gate spacer is wider than the inner spacers in a cross-sectional view along the first direction.

20. The semiconductor structure as claimed in claim 18, wherein the contact is in direct contact with a bottommost one of the inner spacers.

* * * * *